United States Patent
Mizukawa et al.

(10) Patent No.: US 8,101,325 B2
(45) Date of Patent: Jan. 24, 2012

(54) AZO COMPOUND, CURABLE COMPOSITION, COLOR FILTER, AND METHOD OF PRODUCING THE SAME

(75) Inventors: Yuki Mizukawa, Kanagawa (JP); Hideki Takakuwa, Shizuoka-ken (JP); Toru Fujimori, Shizuoka-ken (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 793 days.

(21) Appl. No.: 12/209,722

(22) Filed: Sep. 12, 2008

(65) Prior Publication Data

US 2009/0075188 A1    Mar. 19, 2009

(30) Foreign Application Priority Data

Sep. 14, 2007   (JP) ................. 2007-239683

(51) Int. Cl.
*G03F 7/00* (2006.01)
*G03F 7/004* (2006.01)
*C09B 31/02* (2006.01)

(52) U.S. Cl. ...... 430/7; 430/270.1; 430/286.1; 430/905; 534/758

(58) Field of Classification Search ............ 430/7, 270.1, 430/286.1, 905; 534/758
See application file for complete search history.

(56) References Cited

U.S. PATENT DOCUMENTS

| 7,470,015 | B2 * | 12/2008 | Fukushige | 347/100 |
| 2011/0030583 | A1 * | 2/2011 | Tateishi et al. | 106/31.77 |

FOREIGN PATENT DOCUMENTS

| EP | 1889881 A2 * | 2/2008 |
| EP | 2039725 A2 * | 3/2009 |
| JP | 49-74718 A | 7/1974 |
| JP | 59-30509 A | 2/1984 |
| JP | 6-75375 A | 3/1994 |
| JP | 7-11485 B2 | 2/1995 |
| JP | 11-209673 A | 8/1999 |
| JP | 3020660 B2 | 3/2000 |
| JP | 2002-14220 A | 1/2002 |
| JP | 2002-14223 A | 1/2002 |
| JP | 2007-41050 A | 2/2007 |
| JP | 2007-41076 A | 2/2007 |
| JP | 2008083416 A * | 4/2008 |
| JP | 2008248212 A * | 10/2008 |
| JP | 2009073992 A * | 4/2009 |

* cited by examiner

*Primary Examiner* — Amanda C. Walke

(74) *Attorney, Agent, or Firm* — Buchanan Ingersoll & Rooney PC

(57) ABSTRACT

An azo compound represented by Formula (I), Formula (II), or Formula (III):

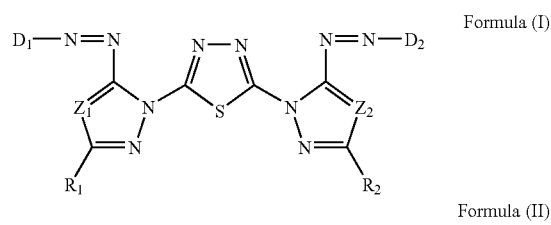

Formula (I)

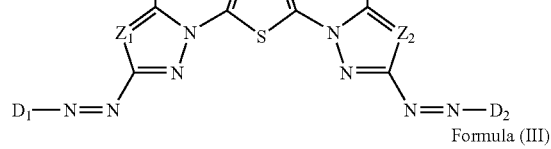

Formula (II)

Formula (III)

wherein $R_1$ and $R_2$ each independently represent a hydrogen atom or a substituent; $D_1$ and $D_2$ each independently represent a coupler residue; $Z_1$ and $Z_2$ each independently represent —$C(R_3)$= or —N=; and $R_3$ represents a hydrogen atom or a substituent.

12 Claims, No Drawings

AZO COMPOUND, CURABLE COMPOSITION, COLOR FILTER, AND METHOD OF PRODUCING THE SAME

CROSS-REFERENCE TO RELATED APPLICATION

This application claims priority under 35 USC 119 from Japanese patent Application No. 2007-239683, the disclosure of which is incorporated by reference herein.

BACKGROUND

1. Field of the Invention

The present invention relates to an azo compound, a curable composition containing the azo compound, a color filter using the curable composition, and a method of producing the color filter.

2. Description of the Related Art

A pigment dispersion method has been employed as one method of forming a color filter for use in a liquid crystal display element, a solid state imaging device, etc. An example of the pigment dispersion method is a method of producing a color filter by a photolithographic method using a color radiation-sensitive composition prepared by dispersing a pigment in any of various light-sensitive compositions. The method is stable to light, heat, and the like because a pigment is used, and the positional accuracy of patterning can be secured because a photolithographic method is used to carry out patterning. Therefore, the pigment dispersion method has been widely used as a method suitable for producing a color filter for a color display having a large screen and high precision.

When a color filter is produced by the pigment dispersion method, the radiation-sensitive composition is applied to a substrate by, for example, a spin coater or roll coater, and then dried to form a coating layer. Then, the coating layer is subjected to pattern exposure and developed to form color pixels. By repeating the operation for every color, a color filter can be obtained.

In the meantime, it has been desired in recent years to develop a higher resolution color filter for use in a solid state imaging device. However, in a conventional pigment dispersion method, it is difficult to further improve resolution and also, the conventional method has, for example, a problem in that coarse particles of a pigment cause color unevenness. Therefore, the pigment dispersion method is not suitable to applications, such as a solid state imaging device, for which fine patterns are required.

In order to achieve the high resolution, it has been studied to use a dye as a coloring material (e.g., Japanese Patent Application Laid-Open (JP-A) No. 6-75375). However, it is known that a dye-containing curable composition has the following problems:

(1) Dyes are usually inferior in light fastness and heat resistance compared to pigments;
(2) It is difficult to obtain a liquid curable composition having a desired spectrum because general dyes are have low solubility in an aqueous alkali solution or an organic solvent (hereinafter sometimes simply referred to as a solvent);
(3) It is difficult to control solubility (development properties) of a cured portion and uncured portion because many dyes interact with other components contained in a curable composition; and
(4) Since a large amount of dyes must be added when the molar extinction coefficient ($\epsilon$) of the dye is low, it is inevitable to decrease other components in the curable composition, such as a polymerizable compound (monomer), a binder and a photoinitiator, giving rise to problems in that the curability of the composition, heat resistance after curing, and the development properties of a cured or non-cured portion are deteriorated.

Due to the above-described problems, it has been difficult to form a fine and thin color pattern for use in a high resolution color filter. Moreover, unlike the case in which the color pattern is used to produce a semiconductor, the color pattern is required to be in the form of a thin layer having a thickness of 1 µm or less when it is used to produce a color filter for a solid state imaging device. Therefore, a dye having a high molar extinction coefficient ($\epsilon$) has been demanded so as to achieve a desired absorption even when the layer is thin.

Moreover, dyes used for various uses are generally demanded to have commonly the following properties: desirable absorption properties in terms of color reproducibility; fastness in the environmental conditions in which the dyes are to be used, such as excellent heat resistance, excellent light fastness, and excellent moisture resistance; and high molar extinction coefficient.

In order to solve the above-described problems, various azo dyes have been conventionally widely examined.(e.g., JP-A No. 59-30509, JP-A No. 11-209673, Japanese Patent No. 3020660, JP-A No. 49-74718, Japanese Patent Publication (JP-B) No. 7-11485, JP-A No. 2002-14220, JP-A No. 2002-14223, JP-A No. 2007-41050, and JP-A No. 2007-41076)

SUMMARY OF THE INVENTION

However, the azo dyes described in JP-A No. 59-30509, JP-A No. 11-209673, Japanese Patent No. 3020660, JP-A No. 49-74718, Japanese Patent Publication (JP-B) No. 7-11485, JP-A No. 2002-14220, JP-A No. 2002-14223, JP-A No. 2007-41050, and JP-A No. 2007-41076 are still insufficient in spectral properties and fastness, and further improvement thereof has been desired.

Moreover, in the production process of a color filter, a pattern is formed through, generally, processes of exposure via a mask or the like and development. In the exposure and development processes, dissolution of a dye from a pattern portion which has been cured by exposure to light into a developer has become problematic. More specifically, a dye having a low molecular weight has posed a problem in that the concentration of the formed pattern portion decreases because such a dye is likely to dissolve into a developer. In contrast, a dye having a high molecular weight is disadvantageous for reducing the thickness of the layer. Thus, a dye capable of simultaneously providing development suitability and an ability to reduce the thickness has been desired.

An object of the present invention is to provide an azo compound which is excellent in fastness, has development suitability (dissolution resistance), and has a high molar extinction coefficient, and a curable composition containing such an azo compound.

Another object of the present invention is to provide, using the curable composition, a color filter which is excellent in fastness and which allows decrease in thickness thereof and a method of producing the same.

The present inventors have studied various colorants in detail, and have found that a colorant having a 1,3,4-thiadiazolyl group as a connecting group has a good hue and a high extinction coefficient; has excellent fastness against heat and light, and allows reduction in the thickness of the layer achieved by reduction in its addition amount. Moreover, the inventors have also found that the colorant enables suppression of discoloration at the time of development. The present invention has been accomplished based on these findings.

A first aspect of the invention provides an azo compound represented by the following Formula (I), Formula (II), or Formula (III):

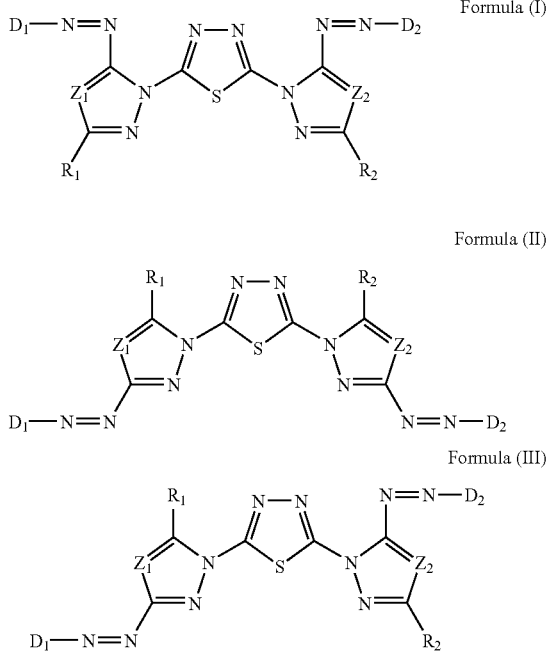

wherein, in Formulas (I) to (III), $R_1$ and $R_2$ each independently represent a hydrogen atom or a substituent; $D_1$ and $D_2$ each independently represent a coupler residue; $Z_1$ and $Z_2$ each independently represent —C($R_3$)═ or —N═; and $R_3$ represents a hydrogen atom or a substituent.

A second aspect of the invention provides an azo compound according to the first aspect, wherein, in Formulas (I) to (III), $D_1$ and $D_2$ each independently represent a coupler residue represented by any one of the following Formulae (d-1) to (d-8):

wherein, in Formulae (d-1) to (d-8), $R_{50}$ and $R_{51}$ each independently represent an aryl group, a heterocyclic group, an acyl group, a cyano group, an alkoxycarbonyl group, an aryloxycarbonyl group, a carbamoyl group, an alkylsulfonyl group, or an arylsulfonyl group; $R_{52}$ represents a hydrogen atom or a substituent; $R_{53}$ represents a hydrogen atom, an all group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $X_{10}$ represents —OH or —N($R_{54}$)($R_{55}$); $R_{54}$ and $R_{55}$ each independently represent a hydrogen atom, an alkyl group, an alkenyl group, an aryl group, a heterocyclic group, an acyl group, an alkoxycarbonyl group, an aryloxycarbonyl group, an alkylsulfonyl group, or an arylsulfonyl; $R_{56}$ represents a hydrogen atom or a substituent; $Z_{10}$ and $Z_{11}$ each independently represent ═C($R_{57}$)— or ═N—; $R_{57}$ represents a hydrogen atom or a substituent; $R_{58}$ represents a substituent; s represents an integer of 0, 1, or 2; $Z_{12}$ represents an atomic group that is required to form a 5- or 6-membered ring condensed with the adjacent benzene ring and that is formed by atoms selected from carbon atoms, nitrogen atoms, oxygen atoms, and sulfur atoms; $R_{59}$ and $R_{60}$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $R_{61}$ represents a hydrogen atom or a substituent; $Z_{13}$, $Z_{14}$, and $Z_{15}$ each independently represent ═C($R_{62}$)— or ═N—; $R_{62}$ represents a hydrogen atom or a substituent; and * represents a position of connection to an azo group.

A third aspect of the present invention provides an azo compound according to the first aspect, wherein $D_1$ and $D_2$ in Formulas (I) to (III) each independently represent a coupler residue represented by the following Formula (A):

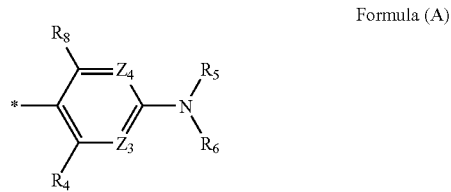

Formula (A)

wherein, in Formula (A), $R_4$ and $R_8$ each independently represent a hydrogen atom or a substituent; $R_5$ and $R_6$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $Z_3$ and $Z_4$ each independently represent —C($R_7$)= or —N=; $R_7$ represents a hydrogen atom or a substituent; and * represents a position of connection to an azo group.

A fourth aspect of the invention provides a curable composition comprising at least one azo compound according to any one of the first to third aspects.

A fifth aspect of the invention provides a curable composition according to the fourth aspect, wherein the maximum absorption wavelength of the azo compound within a visible wavelength region is from 500 nm to 600 nm.

A sixth aspect of the invention provides a curable composition according to the fourth aspect, wherein the maximum absorption wavelength of the azo compound within a visible wavelength region is from 400 nm to 500 nm.

A seventh aspect of the invention provides a curable composition according to the fourth aspect, wherein the maximum absorption wavelength of the azo compound within a visible wavelength region is from 500 nm to 600 nm and a second absorption wavelength within the visible wavelength region is from 400 nm to 500 nm.

An eighth aspect of the invention provides a curable composition according to any one of the fourth to seventh aspects, further comprising a polymerizable monomer and a radiation-sensitive compound.

A ninth aspect of the invention provides a curable composition according to any one of the fourth to eighth aspects, further comprising a binder.

A tenth aspect of the invention provides a curable composition according to any one of the fourth to ninth aspects, further comprising an additional colorant having a maximum absorption wavelength of from 400 nm to 600 nm.

An eleventh aspect of the invention provides a color filter prepared by using the curable composition according to any one of the fourth to tenths aspects.

A twelfth aspect of the invention provides a method of producing a color filter comprising:

applying the curable composition according to any one of the fourth to tenth aspects to a support to form a curable composition layer; and exposing the formed curable composition layer to light through a mask and developing the exposed layer to form a pattern.

According to the present invention, it is possible to provide an azo compound which is excellent in fastness, has develop-ment suitability (dissolution resistance), and has a high molar extinction coefficient and a curable composition containing such an azo compound. Moreover, the present invention can provide, using the curable composition, a color filter which is excellent in fastness and which allows reduction in the thickness thereof and a method of producing the color filter.

DETAILED DESCRIPTION OF THE INVENTION

Hereinafter, an azo compound, a curable composition, a color filter, and a method of producing a color filter of the present invention will be described in detail.
<Azo Compound>

The azo compound of the present invention is represented by Formula (I), Formula (II), or Formula (III). Since the azo compound of the present invention has a 1,3,4-thiadiazolyl group as a connecting group, the azo compound of the present invention has a good hue and high extinction coefficient and has excellent fastness against heat and light. Moreover, in the production of a color filter using a curable composition containing the azo compound, discoloration can be efficiently suppressed at the time of development.

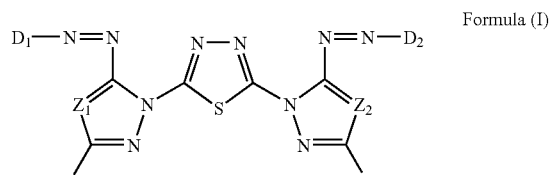

Formula (I)

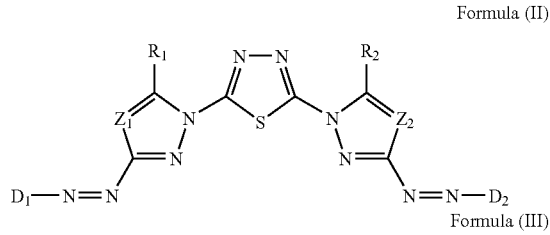

Formula (II)

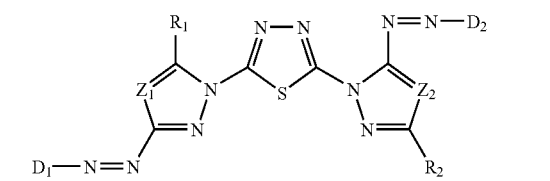

Formula (III)

In Formulae (I) to (III), $R_1$ and $R_2$ each independently represent a hydrogen atom or a substituent; $D_1$ and $D_2$ each independently represent a coupler residue; $Z_1$ and $Z_2$ each independently represent —C($R_3$)= or —N=; and $R_3$ represents a hydrogen atom or a substituent. In Formula (I), Formula (II), and Formula (III), examples of the substituent represented by $R_1$ or $R_2$ include halogen atoms (e.g., fluorine, chlorine, bromine, and iodine), alkyl groups (e.g., linear, branched, or cyclic alkyl groups having 1 to 36 carbon atoms (preferably 1 to 12 carbon atoms), such as a methyl group, an ethyl group, a propyl group, a butyl group, an octyl group, a dodecyl group, an isopropyl group, a sec-butyl group, a t-butyl group, a 2-ethylhexyl group, a cyclopentyl group, a cyclohexyl group, a 1-norbornyl group, and a 1-adamanthyl group), alkenyl groups (alkenyl groups having 2 to 36 carbon atoms (preferably 2 to 12 carbon atoms), such as a vinyl group, an allyl group, and a 3-butene-1-yl group), aryl groups (aryl groups having preferably 6 to 36 carbon atoms (more preferably 6 to 12 carbon atoms), such as a phenyl group and a naphthyl group), and heterocyclic groups (heterocyclic groups having preferably 1 to 24 carbon atoms (more preferably 1 to 12 carbon atoms), such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazole-1-yl group).

Examples of the substituent represented by $R_1$ or $R_2$ in Formula (I), Formula (II), and Formula (III) further include silyl groups (silyl groups having preferably 3 to 24 carbon atoms (more preferably 3 to 12 carbon atoms), such as a trimethylsilyl group, a triethylsilyl group, a tributylsilyl group, a t-butyldimethylsilyl group, and a t-hexyldimethylsilyl group), hydroxy groups, cyano groups, nitro groups, alkoxy groups (alkoxy groups having preferably 1 to 36 carbon atoms (more preferably 1 to 12 carbon atoms), such as a methoxy group, an ethoxy group, a 1-butoxy group, a 2-butoxy group, an isopropoxy group, a t-butoxy group, and a dodecyloxy group or cycloalkyloxy groups, such as a cyclopentyloxy group and a cyclohexyloxy group), aryloxy groups (aryloxy groups having preferably 6 to 36 carbon atoms (more preferably 6 to 12 carbon atoms), such as a phenoxy group and a 1-naphthoxy group), heterocyclic oxy groups (heterocyclic oxy groups having preferably 1 to 3 6 carbon atoms (more preferably 1 to 12 carbon atoms), such as a 1-phenyltetrazole-5-oxy group and a 2-tetrahydropyranyloxy group), silyloxy groups (silyloxy groups having preferably 1 to 32 carbon atoms (more preferably 1 to 12 carbon atoms), such as a trimethylsilyloxy group, a t-butyldimethylsilyloxy group, and a diphenylmethyl silyloxy group), acyloxy groups (acyloxy groups having preferably 2 to 36 carbon atoms (more preferably 2 to 12 carbon atoms), such as an acetoxy group, a pivaloyloxy group, a benzoyloxy group, and a dodecanoyloxy group), alkoxycarbonyloxy groups (alkoxycarbonyloxy groups having preferably 2 to 36 carbon atoms (more preferably 2 to 12 carbon atoms), such as an ethoxycarbonyloxy group and a t-butoxycarbonyloxy group or cycloalkyloxy carbonyloxy groups, such as a cyclohexyloxy carbonyloxy group), aryloxycarbonyloxy groups (aryloxycarbonyloxy groups having preferably 7 to 32 carbon atoms (more preferably 7 to 12 carbon atoms), such as a phenoxy carbonyloxy group), carbamoyloxy groups (carbamoyloxy groups having preferably 1 to 36 carbon atoms (more preferably 1 to 12 carbon atoms), such as an N,N-dimethyl carbamoyloxy group, an N-butyl carbamoyloxy group, an N-phenyl carbamoyloxy group, and an N-ethyl-N-phenyl carbamoyloxy group), sulfamoyloxy groups (sulfamoyloxy groups having preferably 1 to 32 carbon atoms (more preferably 1 to 12 carbon atoms), such as an N,N-diethylsulfamoyloxy group and an N-propylsulfamoyloxy group), alkylsulfonyloxy groups (alkylsulfonyloxy groups having preferably 1 to 38 carbon atoms (more preferably 1 to 12 carbon atoms), such as a methylsulfonyloxy group, a hexadecylsulfonyloxy group, and a cyclohexylsulfonyloxy group), arylsulfonyloxy groups (arylsulfonyloxy groups having preferably 6 to 32 carbon atoms (more preferably 6 to 12 carbon atoms), such as a phenylsulfonyloxy group), acyl groups (acyl groups having preferably 1 to 36 carbon atoms (more preferably 1 to 12 carbon atoms), such as a formyl group, an acetyl group, a pivaloyl group, a benzoyl group, a tetradecanoly group, and a cyclohexanoyl group), alkoxycarbonyl groups (alkoxycarbonyl groups having preferably 2 to 36 carbon atoms (more preferably 2 to 12 carbon atoms), such as a methoxycarbonyl group, an ethoxycarbonyl group, an octadecyloxycarbonyl group, a cyclohexyloxy carbonyl group, and a 2,6-di-tert-butyl-4-methyl cyclohexyloxy carbonyl group), aryloxycarbonyl groups (having preferably 7 to 32 carbon atoms (more preferably 7 to 18 carbon atoms), such as a phenoxy carbonyl group), and carbamoyl groups (carbamoyl groups having preferably 1 to 36 carbon atoms (more preferably 1 to 12 carbon atoms), such as a carbamoyl group, an N,N-diethyl-carbamoyl group, an N-ethyl-N-octyl carbamoyl group, an N,N-dibutylcarbamoyl group, an N-propylcarbamoyl group, an N-phenylcarbamoyl group, an N-methylN-phenylcarbamoyl group, and an N,N-dicyclohexyl carbamoyl group).

Examples of the substituent represented by $R_1$ or $R_2$ in Formula (I), Formula (II), and Formula (III) further include amino groups (amino groups having preferably 32 or fewer carbon atoms (more preferably 12 or fewer carbon atoms), such as an amino group, a methylamino group, an N,N-dibutylamino group, a tetradecyl amino group, a 2-ethylhexylamino group, and a cyclohexylamino group), anilino groups (anilino groups having preferably 6 to 32 carbon atoms (more preferably 6 to 12 carbon atoms), such as an anilino group and an N-methylanilino group), heterocyclic amino groups (heterocyclic amino groups having preferably 1 to 32 carbon atoms (more preferably 1 to 12 carbon atoms), such as a 4-pyridylamino group), carbonamide groups (carbonamide groups having preferably 2 to 36 carbon atoms (more preferably 2 to 12 carbon atoms), such as an acetamide group, a benzamide group, a tetradecane amide group, a pivaroylamide group, and a cyclohexanecarboxamide group), ureido groups (ureido groups having preferably 1 to 32 carbon atoms (more preferably 1 to 12 carbon atoms), such as a ureido group, an N,N-dimethylureido group, and an N-phenylureido group), imide groups (imide groups having preferably 36 or fewer carbon atoms (more preferably 12 or fewer carbon atoms), such as an N-succinimide group and an N-phthalimide group), alkoxycarbonylamino groups (alkoxycarbonylamino groups having preferably 2 to 36 carbon atoms (more preferably 2 to 12 carbon atoms), such as a methoxycarbonylamino group, an ethoxycarbonylamino group, a t-butoxycarbonyl amino group, an octadecyloxycarbonylamino group, and a cyclohexyloxycarbonylamino group), aryloxycarbonylamino groups (aryloxycarbonylamino groups having preferably 7 to 32 carbon atoms (more preferably 7 to 18 carbon atoms), such as a phenoxycarbonylamino group), sulfonamide groups (sulfonamide groups having preferably 1 to 36 carbon atoms (more preferably 1 to 12 carbon atoms), such as a methanesulfonamide group, a butanesulfonamide group, a benzenesulfonamide group, a hexadecanesulfonamide group, and a cyclohexanesulfonamide group), sulfamoylamino groups (sulfamoylamino groups having preferably 1 to 36 carbon atoms (more preferably 1 to 12 carbon atoms), such as an N,N-dipropylsulfamoylamino group and an N-ethyl-N-dodecylsulfamoylamino group), azo groups (azo groups having preferably 1 to 32 carbon atoms (more preferably 1 to 18 carbon atoms), such as a phenylazo group and a 3-pyrazolyl azo), alkylthio groups (alkylthio groups having preferably 1 to 36 carbon atoms (more preferably 1 to 12 carbon atoms), such as a methylthio group, an ethylthio group, an octylthio group, and a cyclohexylthio group), arylthio groups (arylthio groups having preferably 6 to 36 carbon atoms (more preferably 6 to 18 carbon atoms), such as a phenylthio group), heterocyclic thio groups (heterocyclic thio groups having preferably 1 to 32 carbon atoms (more preferably 1 to 12 carbon atoms), such as a 2-benzothiazolylthio group, a 2-pyridylthio group, and a 1-phenyltetrazolylthio group), alkyl sulfinyl groups (alkyl sulfinyl groups having preferably 1 to 32 carbon atoms (more preferably 1 to 12 carbon atoms), such as a dodecane sulfinyl group), aryl sulfinyl groups (aryl sulfinyl groups having preferably 6 to 32 carbon atoms (more preferably 6 to 12 carbon atoms), such as a phenylsulfinyl group), alkylsulfonyl groups (alkylsulfonyl groups having preferably 1 to 36 carbon atoms (more preferably 1 to 12 carbon atoms), such as a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, and a cyclohexylsulfonyl group), arylsulfonyl groups (arylsulfonyl groups having preferably 6 to 36 carbon atoms (more preferably 6 to 12 carbon atoms), such as a phenylsulfonyl group and a 1-naphthylsulfonyl group), and sulfamoyl groups (sulfamoyl groups having preferably 32 or fewer carbon atoms (more preferably 12 or fewer carbon atoms), such as a sulfamoyl group, an N,N-dipropyl sulfamoyl group, an N-ethyl-N-dodecylsulfamoyl group, an N-ethyl-N-phenylsulfamoyl group, and an N-cyclohexylsulfamoyl group).

Examples of the substituent represented by $R_1$ or $R_2$ in Formula (I), Formula (II), and Formula (III) further include sulfo groups, phosphonyl groups (phosphonyl groups having preferably 1 to 32 carbon atoms (more preferably 1 to 12 carbon atoms), such as a phenoxyphosphonyl group, an octyloxyphosphonyl group, and a phenylphosphonyl group), and phosphinoylamino groups (phosphinoylamino groups having preferably 1 to 32 carbon atoms (more preferably 1 to 12 carbon atoms), such as a diethoxyphosphinoyl amino group and a dioctyloxyphosphinoylamino group).

When the substituent represented by any of $R_1$ and $R_2$ is a group that can be further substituted, the substituent may have a substituent selected from the above-mentioned substituents. When the substituent represented by any of $R_1$ and $R_2$ has two or more substituents, the two or more substituents may be the same or different.

In the present invention, $R_1$ and $R_2$ is each preferably a hydrogen atom, a halogen atom, an alkyl group, an alkenyl group, an aryl group, a heterocyclic group, a hydroxyl group, a cyano group, an alkoxy group, an a-yloxy group, a heterocyclic oxy group, an acyl group, an alkoxycarbonyl group, an aryloxycarbonyl group, a carbamoyl group, an amino group, an anilino group, a heterocyclic amino group, a carbonamide group, a ureido group, an imide group, an alkoxycarbonylamino group, an aryloxycarbonylamine group, a sulfonamide group, a sulfamoylamino group, an azo group, an alkylthio group, an arylthio group, a heterocyclic thio group, an alkylsulfonyl group, an arylsulfonyl group, or a sulfamoyl group.

Moreover, $R_1$ and $R_2$ is each more preferably a hydrogen atom, an alkyl group, an alkenyl group, an aryl group, or a heterocyclic group.

In Formula (I), Formula (II), and Formula (III), $Z_1$ and $Z_2$ each independently represent $-C(R_3)=$ or $-N=$, and $R_3$ represents a hydrogen atom or a substituent.

Examples and preferable ranges of the substituent represented by $R_3$ are the same as those of the substituents represented by $R_1$ and $R_2$ described above. The substituent represented by $R_3$ may be substituted, if possible, by a group selected from the above-mentioned examples of the substituents represented by $R_1$ and $R_2$. When $R_3$ is substituted by two or more substituents, the two or more substituents may be the same or different.

In the present invention, $Z_1$ and $Z_2$ are each preferably represented by $-C(R_3)=$, and $R_3$ is preferably a hydrogen atom, a halogen atom, an alkyl group, an alkenyl group, an aryl group, a heterocyclic group, a cyano group, an alkoxy group, an aryloxy group, a heterocyclic oxy group, an acyl group, an alkoxycarbonyl group, an aryloxycarbonyl group, a carbamoyl group, a carbonamide group, a ureido group, an imide group, an azo group, an alkylthio group, an arylthio group, a heterocyclic thio group, an alkylsulfonyl group, an arylsulfonyl group, or a sulfamoyl group.

$R_3$ is more preferably a hydrogen atom, an aryl group, a heterocyclic group, a cyano group, an acyl group, an alkoxycarbonyl group, an aryloxycarbonyl group, a carbamoyl group, an alkylsulfonyl group, or an arylsulfonyl group.

Furthermore, $R_3$ is most preferably a heterocyclic group, a cyano group, an alkoxycarbonyl group, an aryloxycarbonyl group, a carbamoyl group, an alkylsulfonyl group, or an arylsulfonyl group.

$D_1$ and $D_2$ in Formula (I), Formula (II), and Formula (III) each independently represent a coupler residue. The coupler residue is preferably a coupler residue derived from a coupler capable of coupling with an aromatic diazonium compound.

$D_1$ and $D_2$ are preferably coupler residues required to set the maximum absorption wavelength in the visible wavelength region of the azo compound represented by any one of Formula (I), Formula (II), and Formula (III) to a wavelength in the range of from 500 nm to 600 nm; coupler residues required to set the maximum absorption wavelength in the visible wavelength region of the azo compound represented by any one of Formula (I), Formula (II), and Formula (III) to a wavelength in the range of from 400 nm to 500 nm, or coupler residues required to set the maximum absorption wavelength and second absorption wavelength in the visible wavelength region of the azo compound represented by any one of Formula (I), Formula (II), and Formula (III) to a wavelength in the range of from 500 nm to 600 nm and a wavelength in the range of from 400 nm to 500 nm, respectively.

The term "visible wavelength region" used herein refers to a wavelength range of from 360 nm to 780 nm. The maximum absorption wavelength refers to a wavelength at which the molar extinction coefficient in ethyl acetate of the azo compound represented by any one of Formula (I), Formula (II), and Formula (III) is a maximum value and is the largest. Moreover, the second absorption wavelength refers to an absorption wavelength at which the molar extinction coefficient in ethyl acetate of the azo compound is a maximum value that is the second largest maximum after the molar extinction coefficient at the maximum absorption wavelength.

The maximum absorption wavelength and second absorption wavelength in the visible wavelength region can be measured in a usual manner using a general visible spectrophotometer.

In Formula (I), Formula (II), and Formula (III), $D_1$ and $D_2$ each independently represent more preferably a coupler residue represented by any one of Formula (d-1) to Formula (d-8). When each of $D_1$ and $D_2$ is a group represented by any one of Formula (d-1) to Formula (d-8), the maximum absorption wavelength in the visible wavelength region of the azo compound represented by any one of Formula (II) or Formula (III) can be adjusted to the range of from 500 nm to 600 nm or to a range of from 400 nm to 500 nm. Moreover, it is also possible to adjust the maximum absorption wavelength of the visible wavelength region to the range of from 500 nm to 600 nm, and adjust the second absorption wavelength to the range of from 400 nm to 500 nm.

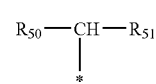

d-1

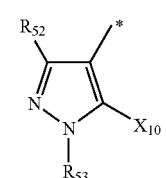

d-2

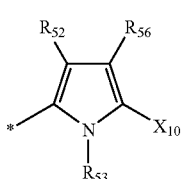

d-3

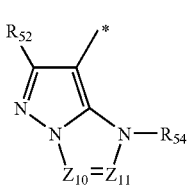

d-4

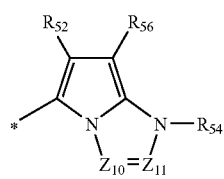

d-5

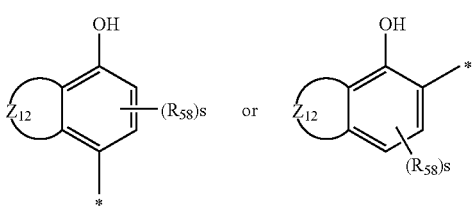

d-6

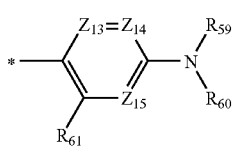

d-7

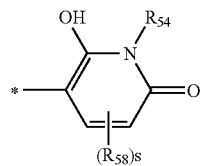

d-8

In Formula (d-1) to Formula (d-8), * represents a position of connection to an azo group.

In Formula (d-1), $R_{50}$ and $R_{51}$ each independently represent an aryl group, a heterocyclic group, an acyl group, a cyano group, an alkoxycarbonyl group, an aryloxycarbonyl group, a carbamoyl group, an alkylsulfonyl group, or an arylsulfonyl group.

$R_{50}$ and $R_{51}$ in Formula (d-1) may be combined with each other to form a 5-membered ring or 6-membered ring with at least one atom selected from carbon atoms, nitrogen atoms, oxygen atoms, and sulfur atoms.

The aryl group, heterocyclic group, acyl group, cyano group, alkoxycarbonyl group, aryloxycarbonyl group, carbamoyl group, alkylsulfonyl group, or arylsulfonyl group represented by $R_{50}$ or $R_{51}$ may be further substituted by a substituent selected from the above-mentioned examples of the substituent represented by $R_1$ or $R_2$ described above. When the group represented by $R_{50}$ or $R_{51}$ is substituted by two or more substituents, the two or more substituents may be the same or different. When a 5-membered ring or 6-membered ring is formed by mutual bonding of $R_{50}$ and $R_{51}$, the ring may be further substituted by a substituent selected from the above-mentioned examples of the substituent represented by $R_1$ or $R_2$ described above. When the ring is substituted by two or more substituents, the two or more substituents may be the same or different.

$R_{52}$ in Formula (d-2) to Formula (d-5) represents a hydrogen atom or a substituent, and examples and preferable range of die substituent represented by $R_{52}$ are the same as those of the substituent represented by $R_1$ or $R_2$ described above.

$R_{53}$ represents a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group.

When the substituent represented by any of $R_{52}$ and $R_{53}$ is a group which can be further substituted, the substituent may be substituted by a substituent selected from the aforementioned examples of the substituent represented by $R_1$ or $R_2$ described above. When the substituent represented by any of $R_{52}$ and $R_{53}$ is substituted by two or more substituents, the two or more substituents may be the same or different.

$X_{10}$ in Formula (d-2) and Formula (d-3) represents —OH or —N($R_{54}$)($R_{55}$). $R_{54}$ and $R_{55}$ each independently represent a hydrogen atom, an alkyl group, an alkenyl group, an aryl group, a heterocyclic group, an acyl group, an alkoxycarbonyl group, an aryloxycarbonyl group, an alkylsulfonyl group, or an arylsulfonyl group.

$R_{53}$ and $R_{54}$ in Formula (d-2) and Formula (d-3) may be combined with each other to form a 5-membered ring or 6-membered ring with at least one atom selected from carbon atoms and nitrogen atoms. $R_{54}$ and $R_{55}$ in Formula (d-2) and Formula (d-3) may be combined with each other to form a 5-membered ring or 6-membered ring with at least one atom selected from carbon atoms and nitrogen atoms.

The respective substituents represented by $R_{54}$ and $R_{55}$ and the 5-membered ring or 6-membered ring which is formed by mutual bonding of $R_{54}$ and $R_{55}$ may be further substituted by a substituent selected from the aforementioned examples of the substituent represented by $R_1$ or $R_2$ described above. When substituent represented by $R_{54}$ or $R_{55}$ is substituted by two or more substituents, the two or more substituents may be the same or different. When the 5-membered ring or 6-membered ring formed by mutual bonding of $R_{54}$ and $R_{55}$ is substituted by two or more substituents, the two or more substituents may be the same or different.

$R_{56}$ in Formula (d-3) represents a hydrogen atom or a substituent. Examples and preferable range of the substituent represented by $R_{56}$ are the same as those of the substituent represented by $R_1$ or $R_2$ described above.

The substituent represented by $R_{56}$ may be further substituted by a substituent selected from the aforementioned examples of the substituent represented by $R_1$ or $R_2$ described above. When the substituent represented by $R_{56}$ has two or more substituents, the two or more substituents may be the same or different.

$R_{52}$, $R_{54}$, and $R_{56}$ in Formula (d-4) and Formula (d-5) have the same definitions, examples, and preferable ranges as those of $R_{52}$, $R_{54}$, and $R_{56}$, respectively, in Formula (d-2) or Formula (d-3) mentioned above.

$Z_{10}$ and $Z_{11}$ in Formula (d-4) and Formula (d-5) each independently represent =C($R_{57}$)— or =N—.

$R_{57}$ represents a hydrogen atom or a substituent, and examples and preferable ranges of the substituent represented by $R_{57}$ are the same as those of the substituent represented by $R_1$ or $R_2$ described above.

The substituent represented by $R_{57}$ may be further substituted by a substituent selected from the aforementioned examples of the substituent represented by $R_1$ or $R_2$ described above. When the substituent represented by $R_{57}$ is substituted by two or more substituents, the two or more substituents may be the same or different.

$R_{58}$ in Formula (d-6) represents a substituent. Examples and preferable ranges of the substituent represented by $R_{58}$ are the same as those of the substituent represented by $R_1$ or $R_2$ described above.

The substituent represented by $R_{58}$ may be further substituted by a substituent selected from the aforementioned examples of the substituent represented by $R_1$ or $R_2$ described above. When the substituent represented by $R_{58}$ is substituted by two or more substituents, the two or more substituents may be the same or different.

In Formula (d-6), s represents an integer of 0, 1, or 2.

$Z_{12}$ in Formula (d-6) is an atomic group required for forming a 5-membered ring or a 6-membered ring condensed with the adjacent benzene ring, and the atomic group is composed of atoms selected from carbon atoms, nitrogen atoms, oxygen atoms, and sulfur atoms.

$R_{59}$ and $R_{60}$ in Formula (d-7) each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group.

Each of the groups represented by $R_{59}$ and $R_{60}$ may be further substituted by a substituent selected from the aforementioned examples of the substituent represented by $R_1$ or $R_2$ described above. When the group represented by $R_{59}$ or $R_{60}$ is substituted by two or more substituents, the two or more substituents may be the same or different.

$R_{61}$ in Formula (d-7) represents a hydrogen atom or a substituent. Examples and preferable ranges of the substituent represented by $R_{61}$ are the same as those of the substituent represented by $R_1$ or $R_2$ described above.

The substituent represented by $R_{61}$ may be further substituted by a substituent selected from the aforementioned examples of the substituent represented by $R_1$ or $R_2$ described above. When the substituent represented by $R_{61}$ is substituted by two or more substituents, the two or more substituents may be the same or different.

$Z_{13}$, $Z_{14}$, and $Z_{15}$ in Formula (d-7) each independently represent $=C(R_{62})-$ or $=N-$.

$R_{62}$ represents a hydrogen atom or a substituent. Examples and preferable ranges of the substituent represented by $R_{62}$ are the same as those of the substituent represented by $R_1$ or $R_2$ described above.

The substituent represented by $R_{62}$ may be further substituted by a substituent selected from the aforementioned examples of the substituent represented by $R_1$ or $R_2$ described above. When the substituent represented by $R_{62}$ is substituted by two or more substituents, the two or more substituents may be the same or different.

$R_{59}$ and $Z_{14}$ in Formula (d-7) may be combined with each other to form a 5-membered ring or 6-membered ring. $R_{59}$ and $R_{60}$ in Formula (d-7) may be combined with each other to form a 5-membered ring or 6-membered ring. $R_{60}$ and $Z_{15}$ in Formula (d-7) may be combined with each other to form a 5-membered ring or 6-membered ring. $R_{61}$ and $Z_{15}$ in Formula (d-7) may be combined with each other to form a 5-membered ring or 6-membered ring.

The thus-formed 5-membered ring or 6-membered ring may be further substituted by a substituent selected from the aforementioned examples of the substituent represented by $R_1$ or $R_2$ described above. When the ring is substituted by two or more substituents, the two or more substituents may be the same or different.

The definition, examples, and preferable ranges of $R_{54}$ in Formula (d-8) are the same as those of $R_{54}$ in Formula (d-2).

The definition, examples, and preferable ranges of $R_{58}$ and s in Formula (d-8) are the same as those of $R_{58}$ and s, respectively, in Formula (d-6).

$D_1$ and $D_2$ in Formula (I), Formula (II), and Formula (III) are each more preferably represent a coupler residue represented by the following Formula (A) in view of its high molar extinction coefficient and high level of heat resistance and light fastness.

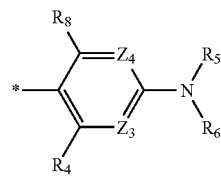

Formula (A)

In Formula (A), $R_4$ and $R_8$ each independently represent a hydrogen atom or a substituent; $R_5$ and $R_6$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $Z_3$ and $Z_4$ each independently represent $-C(R_7)=$ or $-N=$; and $R_7$ represents a hydrogen atom or a substituent. Moreover, * represents a position of connection to an azo group.

$R_4$ and $R_8$ in Formula (A) each independently represent a hydrogen atom or a substituent. Examples and preferable ranges of the substituents represented by $R_4$ and $R_8$ are the same as those of the substituent represented by $R_1$ or $R_2$ described above. When any of the substituents represented by $R_4$ and $R_8$ is a group which can be further substituted, the group may be substituted by a substituent selected from the aforementioned examples of the substituent represented by $R_1$ or $R_2$ described above. When the group represented by $R_4$ and $R_8$ is substituted by two or more substituents, the two or more substituents may be the same or different.

$R_4$ and $R_8$ each preferably represent a hydrogen atom, a halogen atom, an alkyl group, an alkenyl group, an aryl group, a heterocyclic group, a hydroxy group, an alkoxy group, an aryloxy group, a heterocyclic oxy group, an acyloxy group, an acyl group, an alkoxycarbonyl group, an aryloxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, a sulfamoylamino group, an azo group, an alkylthio group, an arylthio group, a heterocyclic thio group, an alkylsulfonyl group, an arylsulfonyl group, or a phosphinoylamino group.

$R_5$ and $R_6$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group. Moreover, $R_5$ and $R_6$ may be combined with each other to form a 5-membered ring or a 6-membered ring.

The substituents represented by $R_5$ and $R_6$ and the 5-membered or 6-membered ring formed b7 mutual bonding of $R_5$ and $R_6$ may be further substituted by a substituent selected from the aforementioned examples of the substituent represented by $R_1$ or $R_2$ described above. When the substituent represented by any of $R_5$ and $R_6$ is substituted by two or more substituents, the two or more substituents may be the same or different. When the 5-membered or 6-membered ring is substituted by two or more substituents, the two or more substituents may be the same or different.

$Z_3$ and $Z_4$ in Formula (A) each independently represent —C($R_7$)═ or —N═; and $R_7$ represents a hydrogen atom or a substituent.

Examples and preferable ranges of the substituent represented by $R_7$ are the same as those of the substituent represented by $R_1$ or $R_2$ described above. When the substituent represented by $R_7$ can be further substituted, the substituent represented by $R_7$ may be further substituted by a substituent selected from the aforementioned examples of the substituent represented by $R_1$ or $R_2$ described above. When the substituent represented by $R_7$ is substituted by two or more substituents, the two or more substituents may be the same or different.

$R_7$ and any one of $R_5$ or $R_6$ may be combined with each other to form a 5-membered ring or a 6-membered ring. The thus-formed 5-membered ring or 6-membered ring may be further substituted by a substituent selected from the aforementioned examples of the substituent represented by R1 or R2 described above. When the 5-membered or 6-membered ring is substituted by two or more substituents, the two or more substituents may be the same or different.

In the present invention, it is more preferable that $Z_3$ in Formula (A) be —N═ and that $Z_4$ in Formula (A) be —C($R_7$)═ or —N═.

Next, preferable embodiments of the azo compound represented by Formula (I), Formula (II), or Formula (III) will be described.

The azo compound represented by Formula (I), Formula (II), or Formula (III) is preferably such that $R_1$ and $R_2$ each independently represent a hydrogen atom, a halogen atom, an alkyl group, an alkenyl group, an aryl group, a heterocyclic group, a hydroxy group, a cyano group, an alkoxy group, an aryloxy group, a heterocyclic oxy group, an acyl group, an alkoxycarbonyl group, an aryloxycarbonyl group, a carbamoyl group, an amino group, an anilino group, a hetero cyclic amino group, a carbonamide group, a ureido group, an imide group, an alkoxycarbonylamino group, an aryloxycarbonylamino group, a sulfonamide group, a sulfamoylamino group, an azo group, an alkylthio group, an arylthio group, a heterocyclic thio group, an alkylsulfonyl group, an arylsulfonyl group, or a sulfamoyl group; $Z_1$ and $Z_2$ each independently represent —C($R_3$)═; $R_3$ represents a hydrogen atom, a halogen atom, an alkyl group, an alkenyl group, an aryl group, a heterocyclic group, a cyano group, an alkoxy group, an aryloxy group, a heterocyclic oxy group, an acyl group, an alkoxycarbonyl group, an aryloxycarbonyl group, a carbamoyl group, a carbonamide group, a ureido group, an imide group, an azo group, an alkylthio group, an arylthio group, a heterocyclic thio group, an alkylsulfonyl group, an arylsulfonyl group, or a sulfamoyl group; and $D_1$ and $D_2$ each represent a coupler residue represented by any one of Formula (d-1) to Formula (d-7).

More preferably, the azo compound represented by Formula (I), Formula (II), or Formula (III) is such that $R_1$ and $R_2$ each independently represent a hydrogen atom, a halogen atom, an alkyl group, an alkenyl group, an aryl group, a heterocyclic group, a hydroxy group, a cyano group, an alkoxy group, an aryloxy group, a heterocyclic oxy group, an acyl group, an alkoxycarbonyl group, an aryloxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, a sulfamoylamino group, an azo group, an alkylthio group, an arylthio group, a heterocyclic thio group, an alkylsulfonyl group, an arylsulfonyl group, or a sulfamoyl group; $Z_1$ and $Z_2$ each independently represent —C($R_3$)═; $R_3$ represents a hydrogen atom, a halogen atom, an alkyl group, an alkenyl group, an aryl group, a heterocyclic group, a cyano group, an alkoxy group, an aryloxy group, a heterocyclic oxy group, an acyl group, an alkoxycarbonyl group, an aryloxycarbonyl group, a carbamoyl group, a carbonamide group, a ureido group, an imide group, an azo group, an alkylthio group, an arylthio group, a heterocyclic thio group, an alkylsulfonyl group, an arylsulfonyl group, or a sulfamoyl group; and $D_1$ and $D_2$ each represent a coupler residue represented by Formula (A).

More preferably, the azo compound represented by Formula (I), Formula (II), or Formula (III) is such that $R_1$ and $R_2$ each independently represent a hydrogen atom, a halogen atom, an alkyl group, an alkenyl group, an aryl group, a heterocyclic group, a hydroxy group, a cyano group, an alkoxy group, an aryloxy group, a heterocyclic oxy group, an acyl group, an alkoxycarbonyl group, an aryloxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, a sulfamoylamino group, an azo group, an alkylthio group, an arylthio group, a heterocyclic thio group, an alkylsulfonyl group, an arylsulfonyl group, or a sulfamoyl group; $Z_1$ and $Z_2$ each independently represent —C($R_3$)═; $R_3$ represents a hydrogen atom, a halogen atom, an alkyl group, an alkenyl group, an aryl group, a heterocyclic group, a cyano group, an alkoxy group, an aryloxy group, a heterocyclic oxy group, an acyl group, an alkoxycarbonyl group, an aryloxycarbonyl group, a carbamoyl group, a carbonamide group, a ureido group, an imide group, an azo group, an alkylthio group, an arylthio group, a heterocyclic thio group, an alkylsulfonyl group, an arylsulfonyl group, or a sulfamoyl group; $D_1$ and $D_2$ each represent a coupler residue represented by Formula (A); $Z_3$ in Formula (A) represents —N═; and $Z_4$ represents —C($R_7$)═ or —N═.

More preferably, the azo compound represented by Formula (I), Formula (II), or Formula (III) is such that $R_1$ and $R_2$ each independently represent a hydrogen atom, an alkyl group, an alkenyl group, an aryl group, a heterocyclic group, a cyano group, an alkoxy group, an aryloxy group, a heterocyclic oxy group, an acyl group, an alkoxycarbonyl group, an aryloxycarbonyl group, a carbamoyl group, an anilino group, a heterocyclic amino group, a carbonamide group, an imide group, an alkoxycarbonylamino group, an alkylthio group, an arylthio group, a heterocyclic thio group, an alkylsulfonyl group, or an arylsulfonyl group; $Z_1$ and $Z_2$ each independently represent —C($R_3$)═; $R_3$ represents a hydrogen atom, a halogen atom, an aryl group, a heterocyclic group, a cyano group, an acyl group, an alkoxycarbonyl group, an aryloxycarbonyl group, a carbamoyl group, an imide group, an alkylthio group, an arylthio group, a heterocyclic thio group, an alkylsulfonyl group, an arylsulfonyl group, or a sulfamoyl group; $D_1$ and $D_2$ each represent a coupler residue represented by Formula (A); $Z_3$ in Formula (A) represents —N═; and $Z_4$ represents —C($R_7$)═ or —N═.

More preferably, the azo compound represented by Formula (I), Formula (II), or Formula (III) is such that $R_1$ and $R_2$ each independently represent a hydrogen atom, an alkyl group, an aryl group, a heterocyclic group, a cyano group, an alkoxy group, an aryloxy group, a heterocyclic oxy group, an acyl group, an alkoxycarbonyl group, an aryloxycarbonyl group, a carbamoyl group, an anilino group, a heterocyclic amino group, a carbonamide group, an imide group, an alkoxycarbonylamino group, an alkylthio group, an arylthio group, or a heterocyclic thio group; $Z_1$ and $Z_2$ each independently represent —C($R_3$)=; $R_3$ represents a hydrogen atom, an aryl group, a heterocyclic group, a cyano group, an acyl group, an alkoxycarbonyl group, an aryloxycarbonyl group, an alkylsulfonyl group, or an arylsulfonyl group; $D_1$ and $D_2$ each represent a coupler residue represented by Formula (A); $Z_3$ in Formula (A) represents —N=, $Z_4$ in Formula (A) represents —C($R_7$)= or —N=; and $R_7$ is a hydrogen atom, a cyano group, an alkoxycarbonyl group, or a carbamoyl group.

More preferably, the azo compound represented by Formula (I), Formula (II), or Formula (III) is such that $R_1$ and $R_2$ each independently represent a hydrogen atom, an alkyl group, an aryl group, or a heterocyclic group; $Z_1$ and $Z_2$ each independently represent —C($R_3$)=; $R_3$ represents a hydrogen atom, an aryl group, a heterocyclic group, a cyano group, an acyl group, an alkoxycarbonyl group, an aryloxycarbonyl group, an alkylsulfonyl group, or an arylsulfonyl group; $D_1$ and $D_2$ each independently represent a coupler residue represented by Formula (A); $Z_3$ in Formula (A) represents —N=; $Z_4$ represents —C($R_7$)= or —N=; and $R_7$ represents a hydrogen atom, a cyano group, an alkoxycarbonyl group, or a carbamoyl group.

Most preferably, the azo compound represented by Formula (I), Formula (II), or Formula (III) is such that $R_1$ and $R_2$ each independently represent a hydrogen atom or an alkyl group; $Z_1$ and $Z_2$ each independently represent —C($R_3$)=; $R_3$ represents a cyano group; $D_1$ and $D_2$ each independently represent a coupler residue represented by Formula (A); $Z_3$ in Formula (A) represents —N=, $Z_4$ in Formula (A) represents —C($R_7$)= or —N=; $R_7$ represents a hydrogen atom or a cyano group; $R_8$ represents an alkyl group or an anilino group; and $R_5$ and $R_6$ each independently represent a hydrogen atom, an alkyl group, or an aryl group.

Next, Exemplary Compounds I-1 to I-31, IIa-1 to IIa-16, IIb-1 to IIb-17, IIIa-1 to IIIa-18, IIIb-1 to IIIb-38, and IV-1 to IV-31 are shown as specific examples of compounds represented by Formula (I), Formula (II), and Formula (III), but the present invention is not limited by these examples.

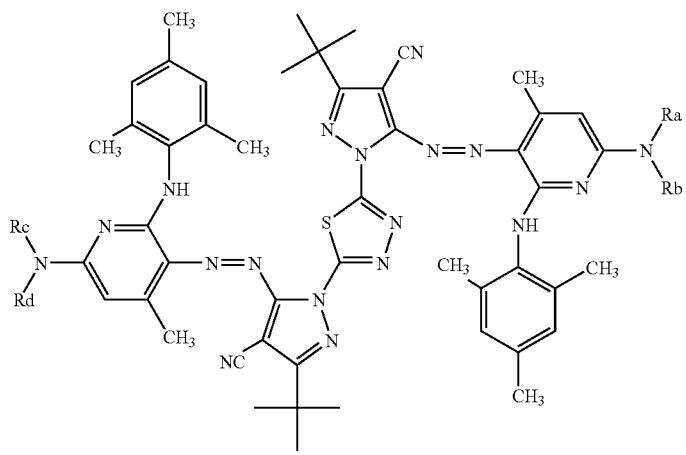

| Exemplary Comp. | Ra | Rb | Rc | Rd |
|---|---|---|---|---|
| I-1 | CH₃-C₆H₂(CH₃)₂- (2,4,6-trimethylphenyl) | —H | CH₃-C₆H₂(CH₃)₂- (2,4,6-trimethylphenyl) | —H |
| I-2 | CH₃-C₆H₂(CH₃)₂- (2,4,6-trimethylphenyl) | —(CH₂)₃COOC₂H₅ | CH₃-C₆H₂(CH₃)₂- (2,4,6-trimethylphenyl) | —(CH₂)₃COOC₂H₅ |

-continued

| | | | | |
|---|---|---|---|---|
| I-3 | 2,4,6-trimethylphenyl | —(CH$_2$)$_3$COOH | 2,4,6-trimethylphenyl | —(CH$_2$)$_3$COOH |
| I-4 | 2,4,6-trimethylphenyl | —(CH$_2$)$_3$COOC$_2$H$_5$ | 2,4,6-trimethylphenyl | —H |
| I-5 | 2,4,6-trimethylphenyl | —(CH$_2$)$_3$COOC$_2$H$_5$ | 2,4,6-trimethylphenyl | —CH$_3$ |
| I-6 | 2,4,6-trimethylphenyl | —(CH$_2$)$_3$COOH | 2,4,6-trimethylphenyl | —CH$_3$ |
| I-7 | 2,4,6-trimethylphenyl | —(CH$_2$)$_4$CO—N(CH$_2$COOC$_2$H$_5$)$_2$ | 2,4,6-trimethylphenyl | —C$_4$H$_9$ |
| I-8 | 2,4,6-trimethylphenyl | —(CH$_2$)$_4$CO—N(CH$_2$COOH)$_2$ | 2,4,6-trimethylphenyl | —C$_4$H$_9$ |
| I-9 | 2,4,6-trimethylphenyl | —CH$_2$CO—N(CH$_2$COOH)$_2$ | 2,4,6-trimethylphenyl | —C$_4$H$_9$ |
| I-10 | 2,4,6-trimethylphenyl | —CH$_2$—C$_6$H$_4$—COOH | 2,4,6-trimethylphenyl | —CH$_2$—C$_6$H$_4$—COOH |

-continued

| | | | | |
|---|---|---|---|---|
| I-11 | mesityl (2,4,6-triMe-C6H2) | —(CH2)4CO—N(CH2COOH)2 | mesityl | —CH2—C6H5 |
| I-12 | mesityl | —(CH2)3SO2—N(CH2COOCH3)2 | mesityl | —CH3 |
| I-13 | mesityl | —(CH2)3SO2—N(CH2COOH)2 | mesityl | —C3H7(i) |
| I-14 | mesityl | —CH2COOH | mesityl | —(CH2)2OC2H5 |
| I-15 | mesityl | —(CH2)4CO—N(CH2COOH)2 | mesityl | 3,5-dimethyl-1,2,4-thiadiazol-2-yl |
| I-16 | mesityl | —(CH2)4CO—N(CH2COOH)2 | mesityl | benzothiazol-2-yl |
| I-17 | mesityl | 2-methylbenzothiazol-6-yl-SO3K | mesityl | 2-methylbenzothiazol-6-yl-SO3K |
| I-18 | mesityl | 2-methylbenzothiazol-6-yl-SO2NHCH(CH3)COOH | mesityl | 2-methylbenzothiazol-6-yl-SO2NHCH(CH3)COOH |

-continued

| | | | | |
|---|---|---|---|---|
| I-19 | 2,3,5-trimethylphenyl | 5-methyl-1,3,4-thiadiazol-2-yl-SCH₂COOH | 2,3,5-trimethylphenyl | —CH₃ |
| I-20 | 2,3,5-trimethylphenyl | —(CH₂)₂OC₂H₅ | 2,3,5-trimethylphenyl | —(CH₂)₂OC₂H₅ |
| I-21 | 2,3,5-trimethylphenyl | —CH₃ | 2,3,5-trimethylphenyl | —CH₃ |
| I-22 | 4-methylphenyl | 5-methyl-3-methyl-1,2,4-thiadiazolyl | 4-methylphenyl | 5-methyl-3-methyl-1,2,4-thiadiazolyl |
| I-23 | —(CH₂)₃OCH₃ | —(CH₂)₃OCH₃ | —(CH₂)₃OCH₃ | —(CH₂)₃OCH₃ |
| I-24 | —CH₂COOC₂H₅ | —CH₂COOC₂H₅ | —CH₂COOC₂H₅ | —CH₂COOC₂H₅ |
| I-25 | 2,3,5-trimethylphenyl | —COCH₃ | 2,3,5-trimethylphenyl | —COCH₃ |
| I-26 | 2,3,5-trimethylphenyl | —COCH₂OCH₂COOH | 2,3,5-trimethylphenyl | —COCH₂OCH₂COOH |
| I-27 | 2,3,5-trimethylphenyl | —SO₂CH₃ | 2,3,5-trimethylphenyl | —SO₂CH₃ |
| I-28 | 2,3,5-trimethylphenyl | —COOC₂H₅ | 2,3,5-trimethylphenyl | —COOC₂H₅ |

-continued
| | | | | |
|---|---|---|---|---|
| I-29 | 2,3,5-trimethylphenyl | —(CH₂)₂NHSO₂CH₃ | 2,3,5-trimethylphenyl | —(CH₂)₂NHSO₂CH₃ |
| I-30 | 2,3,5-trimethylphenyl | —(CH₂)₃SO₂CH₃ | 2,3,5-trimethylphenyl | —(CH₂)₃SO₂CH₃ |
| I-31 | 2,3,4,6-tetramethyl-5-(NHSO₂CH₃)phenyl | —CH₃ | 2,3,4,6-tetramethyl-5-(NHSO₂CH₃)phenyl | —CH₃ |
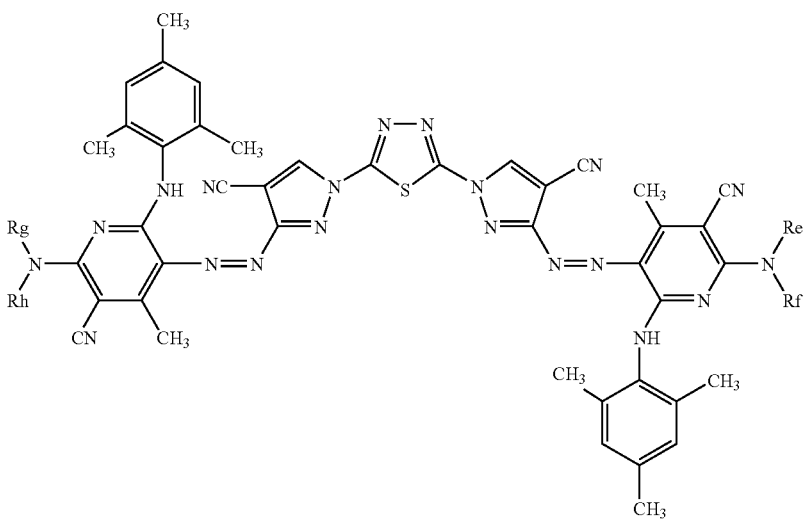
| Exemplary Comp. | Re | Rf | Rg | Rh |
|---|---|---|---|---|
| II a-1 | 2,4,6-trimethylphenyl | —H | 2,4,6-trimethylphenyl | —H |
| II a-2 | 2,4,6-trimethylphenyl | —CH₃ | 2,4,6-trimethylphenyl | —CH₃ |

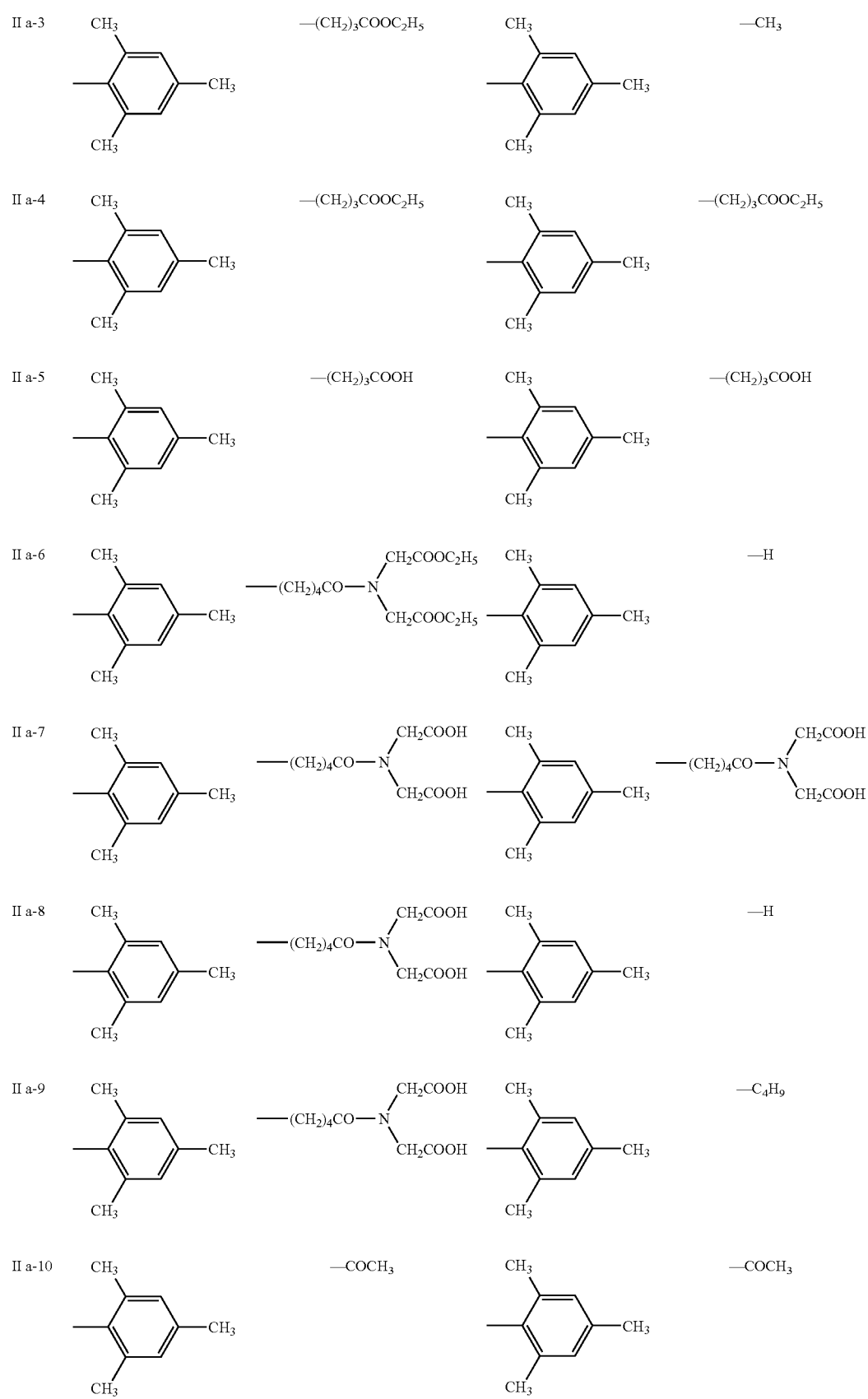

-continued
II a-11 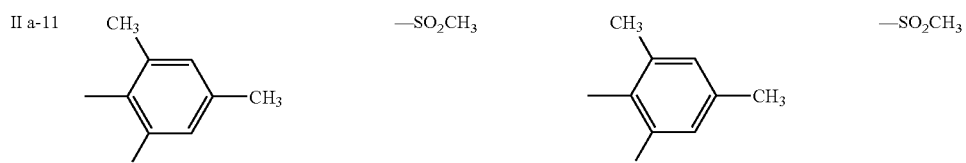
II a-12 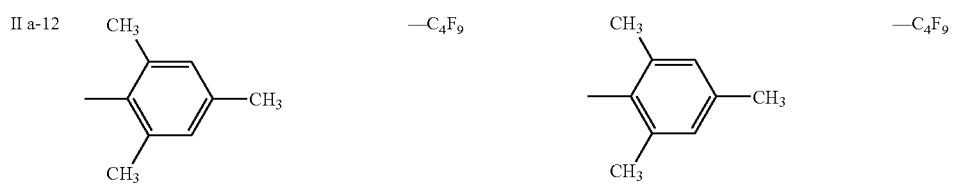
II a-13 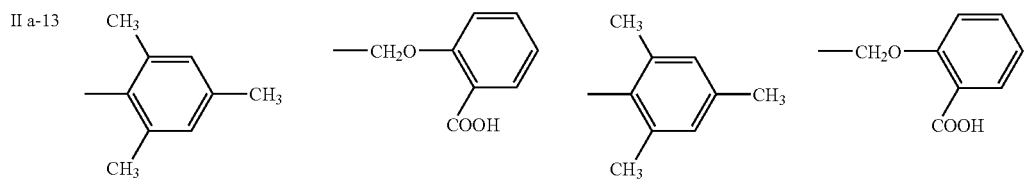
II a-14 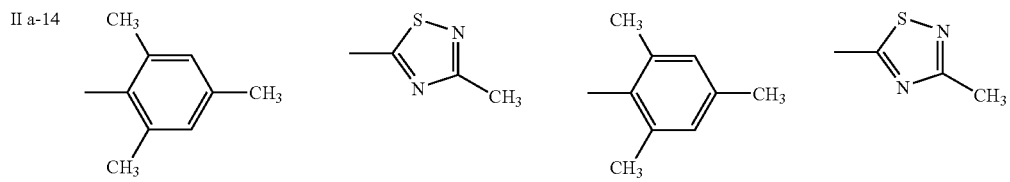
II a-15 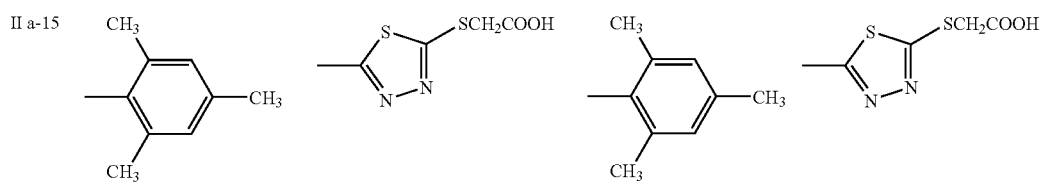
II a-16 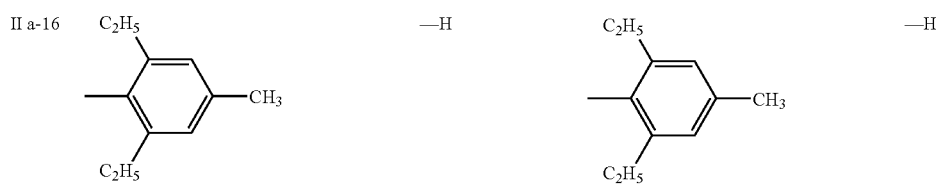

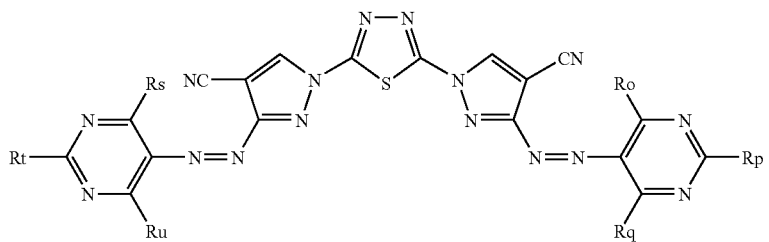
| Exemplary Comp. | Ro | Rp | Rq |
|---|---|---|---|
| II b-1 | —NH(CH$_2$)$_3$OCH$_3$ | —NHCH$_3$ | 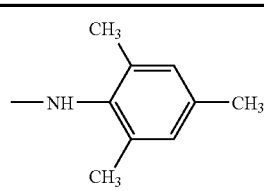 |
| II b-2 | —NHC$_6$H$_{13}$ | —NHCH$_3$ | 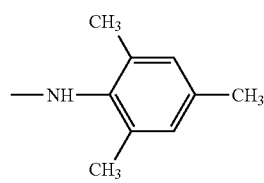 |
| II b-3 | —NHC$_3$H$_7$(iso) | —NHCH$_3$ | 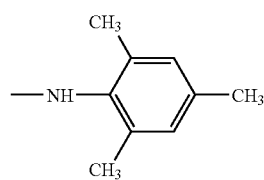 |
| II b-4 | 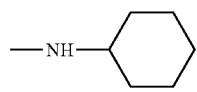 | —NHCH$_3$ | 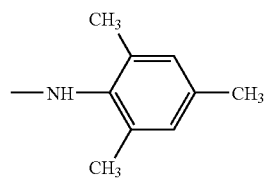 |
| II b-5 | 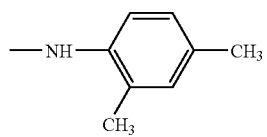 | —NHCH$_3$ | 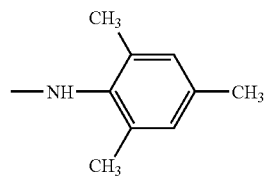 |
| II b-6 | —NHCH$_2$COOC$_2$H$_5$ | —NHCH$_3$ | 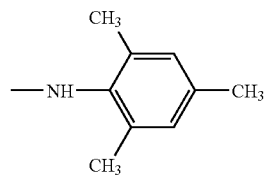 |
| II b-7 | —NH(CH$_2$)$_3$OC$_4$H$_9$ | —NHCH$_3$ | 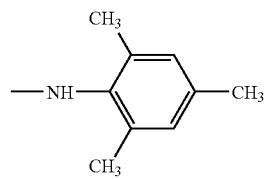 |

| | | | |
|---|---|---|---|
| II b-8 | —NH(CH$_2$)$_3$OCH$_3$ | —NHC$_2$H$_5$ | 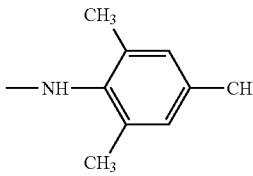 |
| II b-9 | —NH(CH$_2$)$_3$OH | —NHC$_2$H$_5$ | 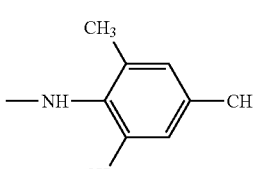 |
| II b-10 | —NH(CH$_2$)$_3$Cl | —NHC$_2$H$_5$ | 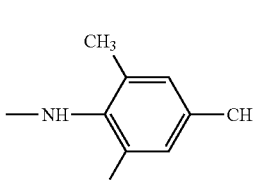 |
| II b-11 | 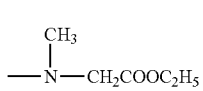 | —NHC$_2$H$_5$ | 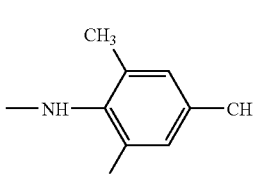 |
| II b-12 | 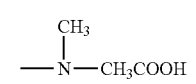 | —NHC$_2$H$_5$ | 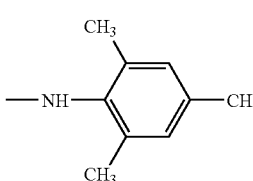 |
| II b-13 | 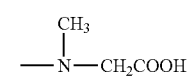 | —NHC$_2$H$_5$ | 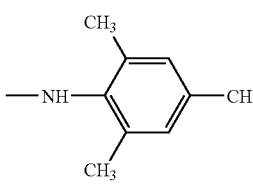 |
| II b-14 | —NH(CH$_2$)$_3$OCH$_3$ | —NHC$_2$H$_6$ | —NHC$_2$H$_5$ |
| II b-15 | —NH(CH$_2$)$_3$OCH$_3$ | 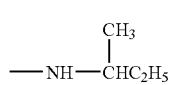 | 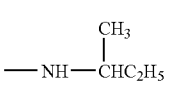 |
| II b-16 | 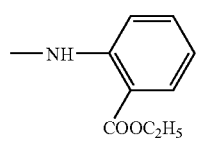 | 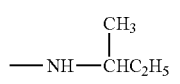 | 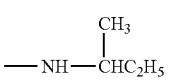 |
| II b-17 | 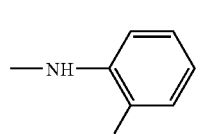 | 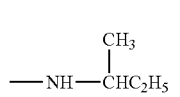 | 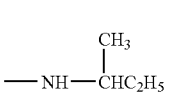 |

-continued
| Exemplary Comp. | Rs | Rt | Ru |
|---|---|---|---|
| II b-1 | —NH(CH$_2$)$_3$OCH$_3$ | —NHCH$_3$ | 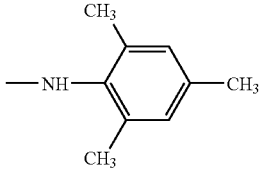 |
| II b-2 | —NHC$_6$H$_{13}$ | —NHCH$_3$ | 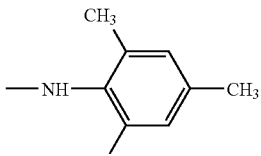 |
| II b-3 | —NHC$_3$H$_7$(iso) | —NHCH$_3$ | 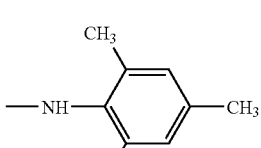 |
| II b-4 | 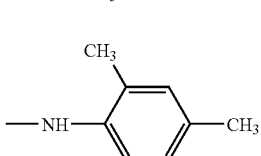 | —NHCH$_3$ | 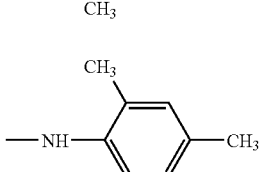 |
| II b-5 | 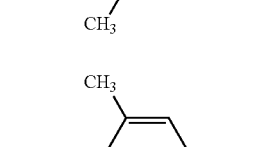 | —NHCH$_3$ | 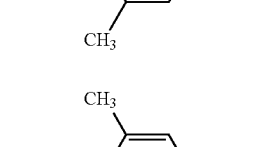 |
| II b-6 | —NHCH$_2$COOC$_2$H$_6$ | —NHCH$_3$ | 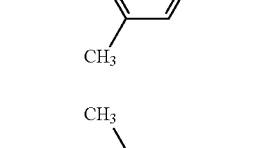 |
| II b-7 | —NH(CH$_2$)$_3$OC$_4$H$_9$ | —NHCH$_3$ | |
| II b-8 | —NH(CH$_2$)$_3$OC$_4$H$_9$ | —NHCH$_3$ | |

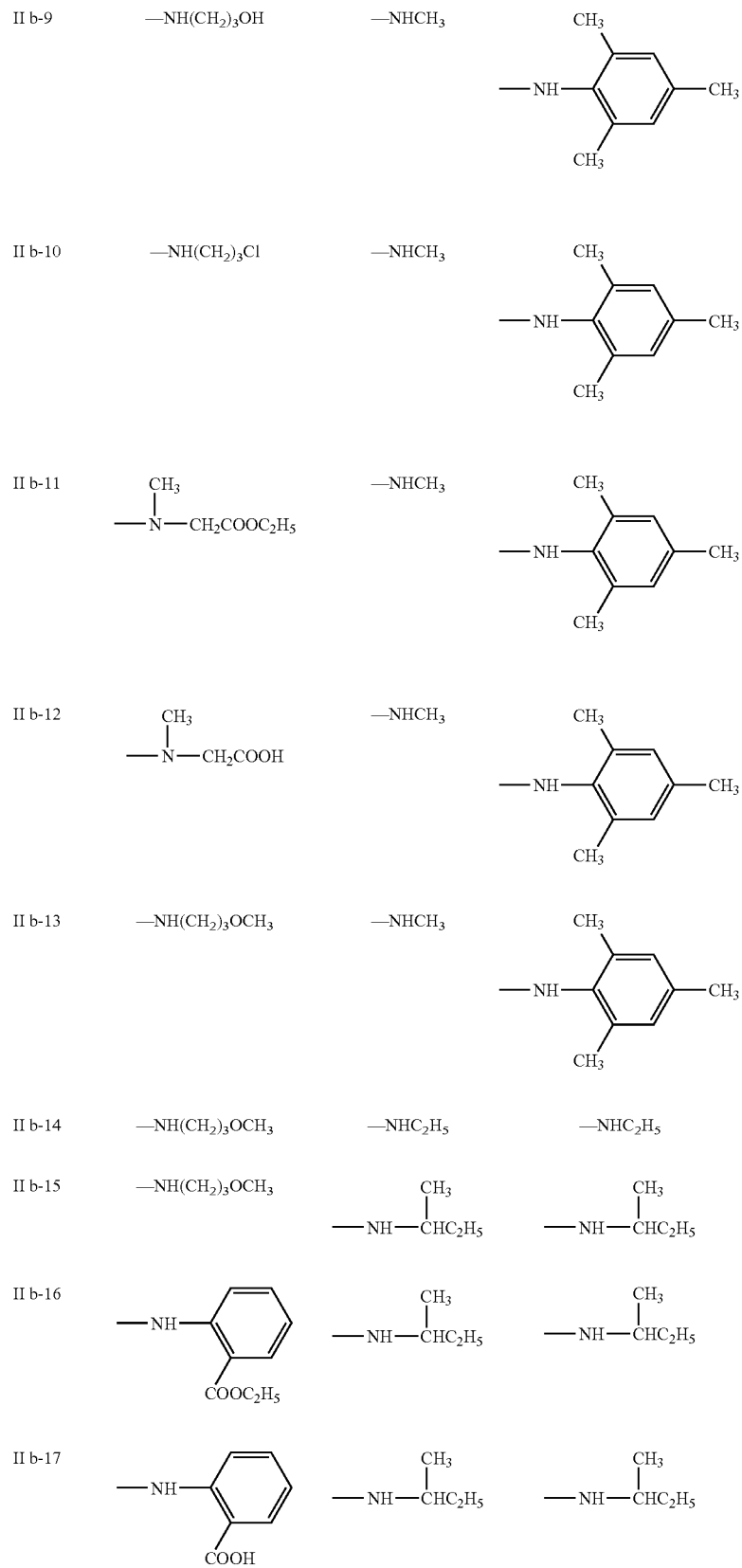

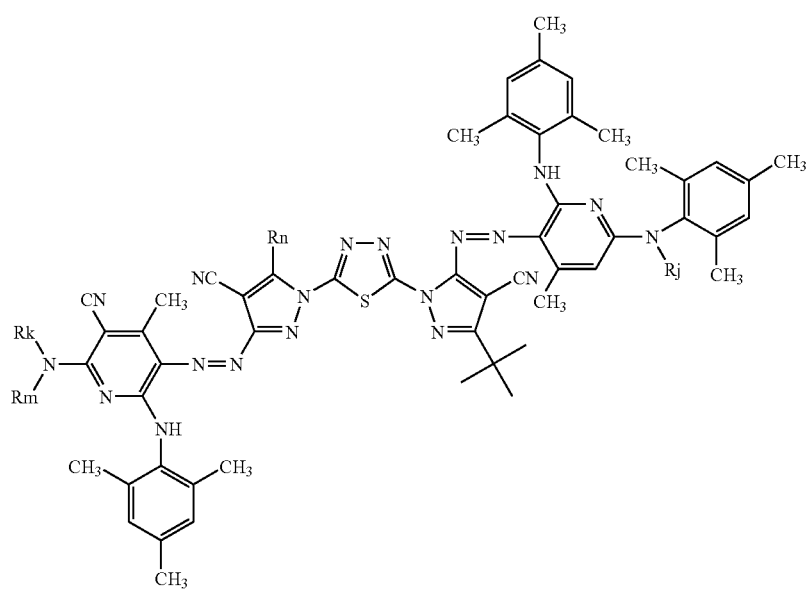
| Exemplary Comp. | Rj | Rk | Rm | Rn |
|---|---|---|---|---|
| III a-1 | —H | 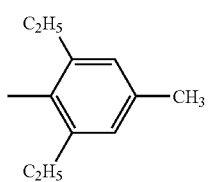 | —H | —H |
| III a-2 | —(CH$_2$)$_3$COOC$_2$H$_5$ | 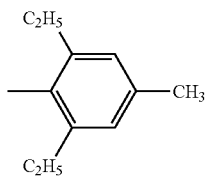 | —H | —H |
| III a-3 | —(CH$_2$)$_3$COOH | 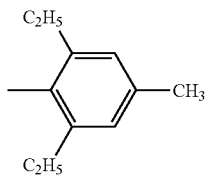 | —H | —H |
| III a-4 | —CH$_2$COOCH$_3$ | 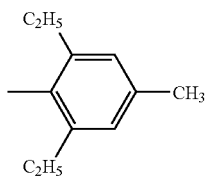 | —H | —H |
| III a-5 | —CH$_2$COOH | 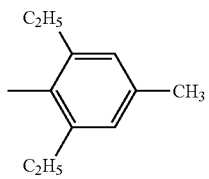 | —H | —H |

-continued

| ID | R1 | R2 | R3 | R4 |
|---|---|---|---|---|
| III a-6 | —CH$_3$ | 2,6-di(C$_2$H$_5$)-4-CH$_3$-phenyl | —H | —H |
| III a-7 | —CH$_2$CO—N(CH$_2$COOC$_2$H$_5$)$_2$ | 2,6-di(C$_2$H$_5$)-4-CH$_3$-phenyl | —H | —H |
| III a-8 | —CH$_2$CO—N(CH$_2$COOH)$_2$ | 2,6-di(C$_2$H$_5$)-4-CH$_3$-phenyl | —H | —H |
| III a-9 | —CH$_2$CONHSO$_2$CH$_3$ | 2,6-di(C$_2$H$_5$)-4-CH$_3$-phenyl | —H | —H |
| III a-10 | —CH$_2$CONHSO$_2$-phenyl | 2,6-di(C$_2$H$_5$)-4-CH$_3$-phenyl | —H | —H |
| III a-11 | 5-methyl-3-methyl-1,2,4-thiadiazol-yl | 2,6-di(C$_2$H$_5$)-4-CH$_3$-phenyl | —H | —H |
| III a-12 | —CH$_3$ | 2,6-di(C$_2$H$_5$)-4-CH$_3$-phenyl | —CH$_3$ | —H |
| III a-13 | —CH$_3$ | 2,6-di(C$_2$H$_5$)-4-CH$_3$-phenyl | —CH$_3$ | —CH$_3$ |

-continued
| | | | | |
|---|---|---|---|---|
| III a-14 | —CH$_3$ | 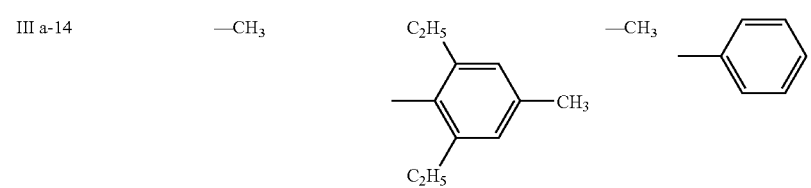 | —CH$_3$ | |
| III a-15 | —(CH$_2$)$_3$OCH$_3$ | —(CH$_2$)$_3$OCH$_3$ | —H | —H |
III a-16
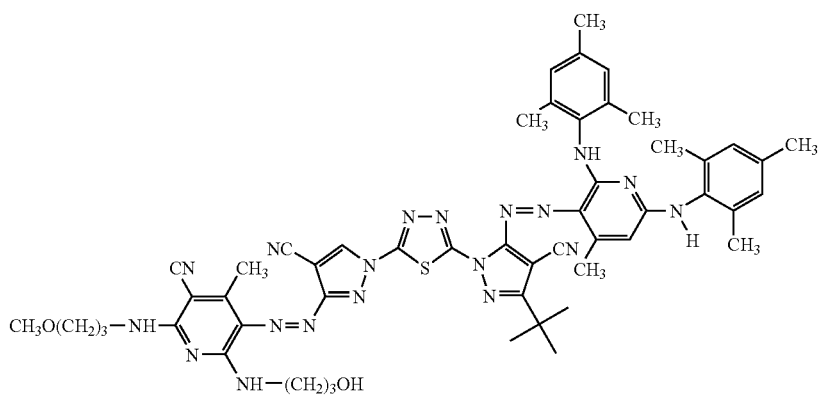
III a-17
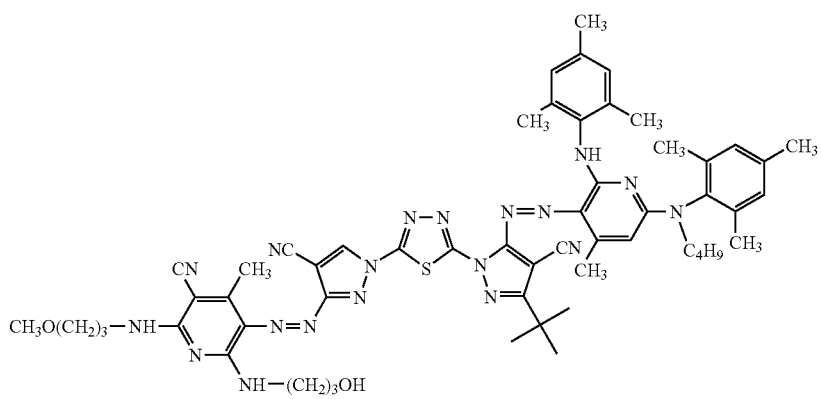
III a-18
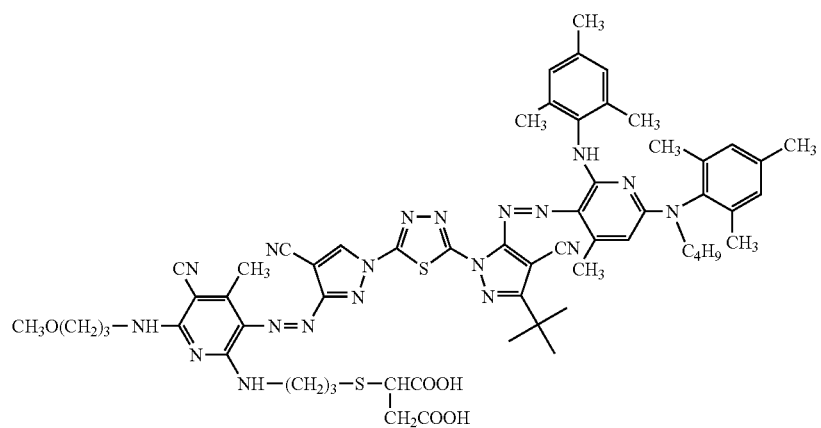

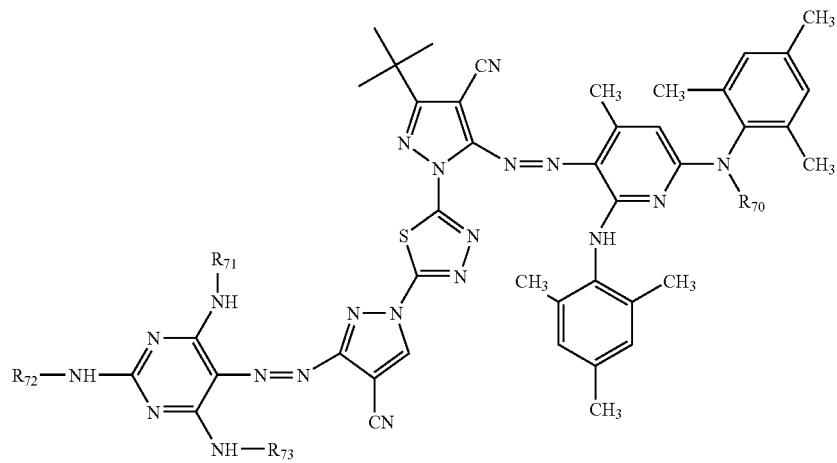
| Exemplary Comp. | R₇₀ | R₇₁ | R₇₂ | R₇₃ |
|---|---|---|---|---|
| III b-1 | —H | 2,4,6-trimethylphenyl (CH₃, CH₃, CH₃) | —CH₃ | —(CH₂)₃OCH₃ |
| III b-2 | —C₄H₉ | 2,4,6-trimethylphenyl | —CH₃ | —(CH₂)₃OCH₃ |
| III b-3 | —(CH₂)₄CO—N(CH₂COOC₂H₅)₂ | 2,4,6-trimethylphenyl | —CH₃ | —(CH₂)₃OCH₃ |
| III b-4 | —(CH₂)₄CO—N(CH₂COOC₂H₅)₂ | 2,4,6-trimethylphenyl | —CH₃ | —(CH₂)₃OC₂H₅ |
| III b-5 | —(CH₂)₄CO—N(CH₂COOC₂H₅)₂ | 2,4,6-trimethylphenyl | —CH₃ | —C₆H₁₃ |
| III b-6 | —(CH₂)₄CO—N(CH₂COOC₂H₅)₂ | 2,4,6-trimethylphenyl | —CH₃ | —(CH₂)₃OC₄H₉ |

| | | | | |
|---|---|---|---|---|
| III b-7 | —(CH₂)₄CO—N(CH₂COOC₂H₅)₂ | 2,4,6-trimethylphenyl | —CH₃ | —(CH₂)₃OH |
| III b-8 | —(CH₂)₄CO—N(CH₂COOH)₂ | 2,4,6-trimethylphenyl | —CH₃ | —(CH₂)₃OCH₃ |
| III b-9 | —(CH₂)₄CO—N(CH₂COOH)₂ | 2,4,6-trimethylphenyl | —CH₃ | —(CH₂)₃OC₂H₅ |
| III b-10 | —(CH₂)₄CO—N(CH₂COOH)₂ | 2,4,6-trimethylphenyl | —CH₃ | —C₆H₁₃ |
| III b-11 | —(CH₂)₄CO—N(CH₂COOH)₂ | 2,4,6-trimethylphenyl | —CH₃ | —(CH₂)₃OH |
| III b-12 | —CH₂CO—N(CH₂COOC₂H₅)₂ | 2,4,6-trimethylphenyl | —CH₃ | —C₆H₁₃ |
| III b-13 | —CH₂CO—N(CH₂COOC₂H₅)₂ | 2,4,6-trimethylphenyl | —CH₃ | —(CH₂)₃OC₂H₅ |
| III b-14 | —CH₂CO—N(CH₂COOH)₂ | 2,4,6-trimethylphenyl | —CH₃ | —C₆H₁₃ |

| | | | | |
|---|---|---|---|---|
| III b-15 | —CH₂CO—N(CH₂COOH)(CH₂COOH) | 2,3,5-trimethylphenyl | —CH₃ | —(CH₂)₃OC₂H₅ |
| III b-16 | —H | 2,3,5-trimethylphenyl | —CH₃ | —(CH₂)₃OH |
| III b-17 | —CH₃ | 2,3,5-trimethylphenyl | —CH₃ | —(CH₂)₃OH |
| III b-18 | —(CH₂)₃COOH | 2,3,5-trimethylphenyl | —CH₃ | —(CH₂)₃OCH₃ |
| III b-19 | —(CH₂)₃COOC₂H₅ | —CH(CH₃)C₂H₅ | —CH(CH₃)C₂H₅ | —(CH₂)₃OH |
| III b-20 | —(CH₂)₃COOH | —CH(CH₃)C₂H₅ | —CH(CH₃)C₂H₅ | —(CH₂)₃OH |
| III b-21 | —(CH₂)₃OH | —CH(CH₃)C₂H₅ | —CH(CH₃)C₂H₅ | —(CH₂)₃OH |
| III b-22 | —(CH₂)₃OCOCH₂OCH₂COOH | —CH(CH₃)C₂H₅ | —CH(CH₃)C₂H₅ | —(CH₂)₃OCOCH₂OCH₂COOH |
| III b-23 | —(CH₂)₄CO—N(CH₂COOC₂H₅)(CH₂COOC₂H₅) | —C₂H₅ | —C₂H₅ | —(CH₂)₃OH |
| III b-24 | —(CH₂)₄CO—N(CH₂COOH)(CH₂COOH) | —C₂H₅ | —C₂H₅ | —(CH₂)₃OH |
| III b-25 | —CH₃ | 2,3,5-trimethylphenyl | —CH₃ | —(CH₂)₃Cl |

-continued
| | | | | |
|---|---|---|---|---|
| III b-26 | —CH₃ | 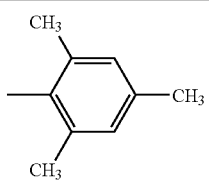 | —CH₃ | —(CH₂)₂O—⟨phenyl⟩ |
| III b-27 | —(CH₂)₃SCH₂COOC₂H₅ | 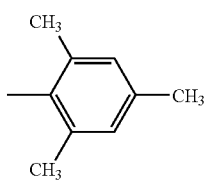 | —CH₃ | —(CH₂)₃OC₂H₅ |
| III b-28 | —(CH₂)₃SCH₂COOH | 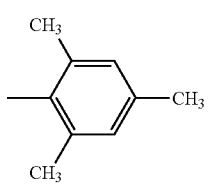 | —CH₃ | —(CH₂)₃OC₂H₅ |
| III b-29 | 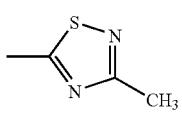 | 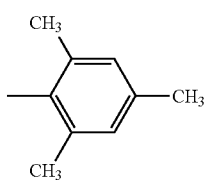 | —CH₃ | —(CH₂)₃OC₂H₅ |
| III b-30 | 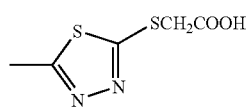 | 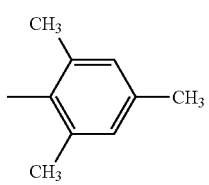 | —CH₃ | —(CH₂)₃OC₂H₅ |
| III b-31 | —CH₃ | 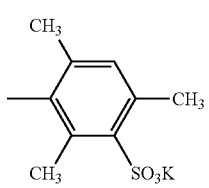 | —CH₃ | —(CH₂)₃OC₂H₅ |
III b-32
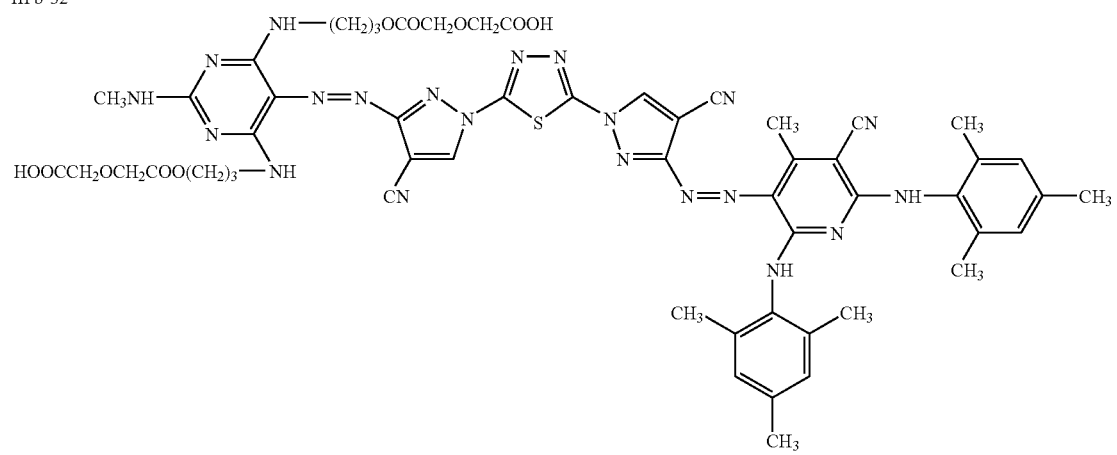

III b-33
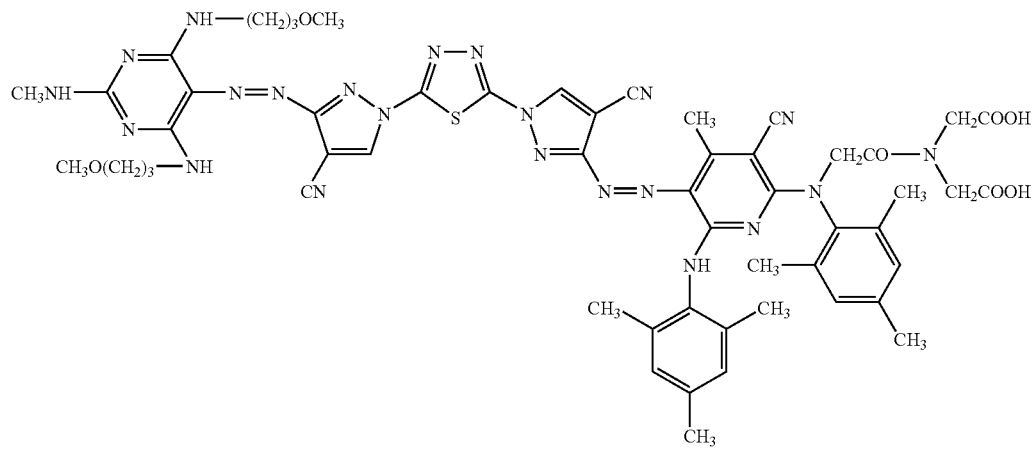
III b-34
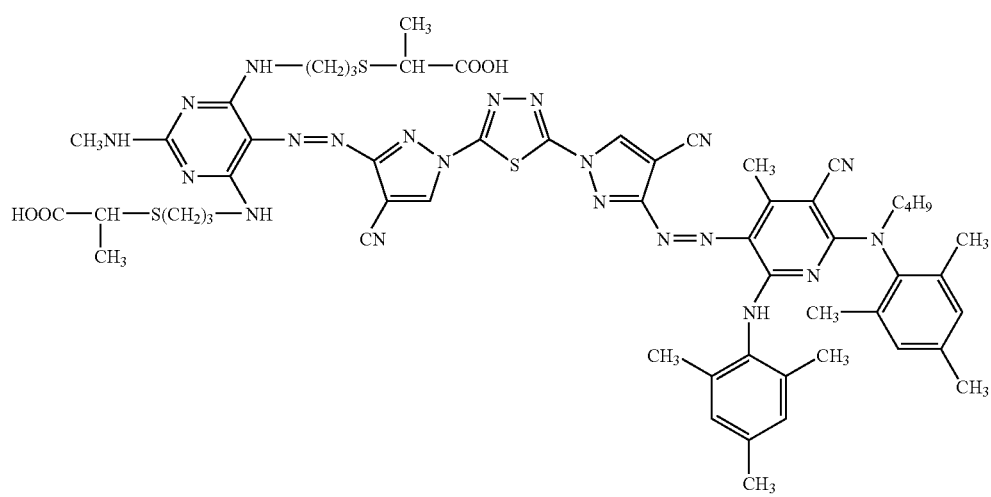
III b-35
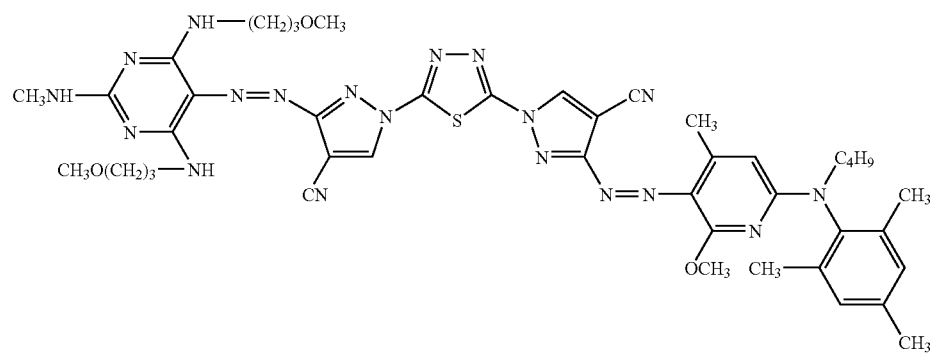

III b-36
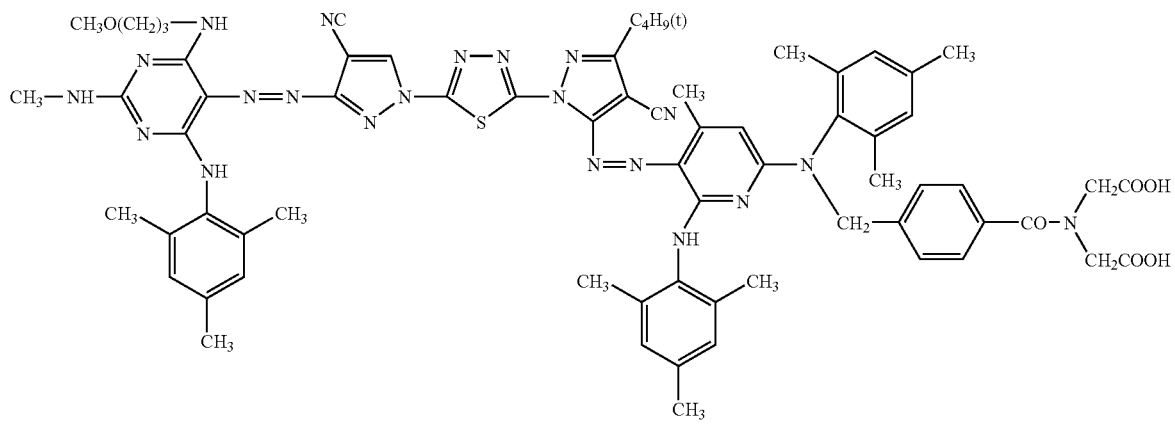
III b-37
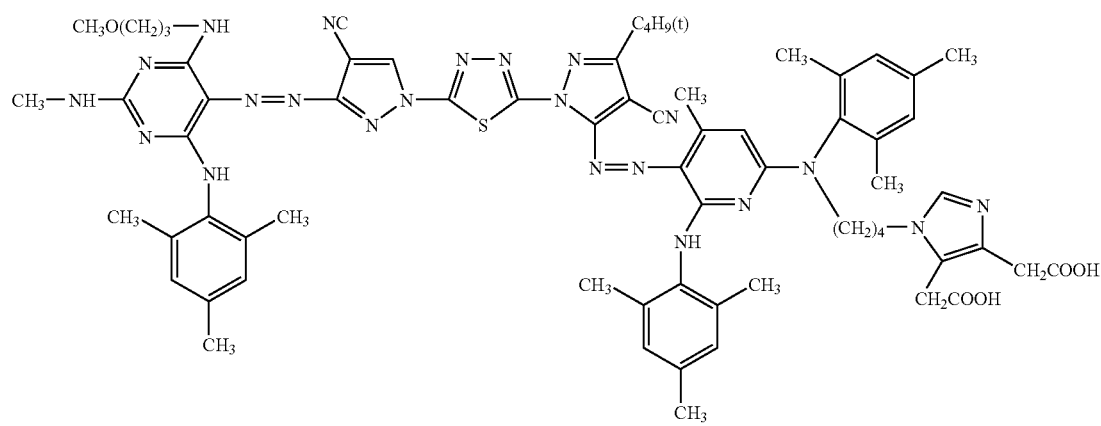
III b-38
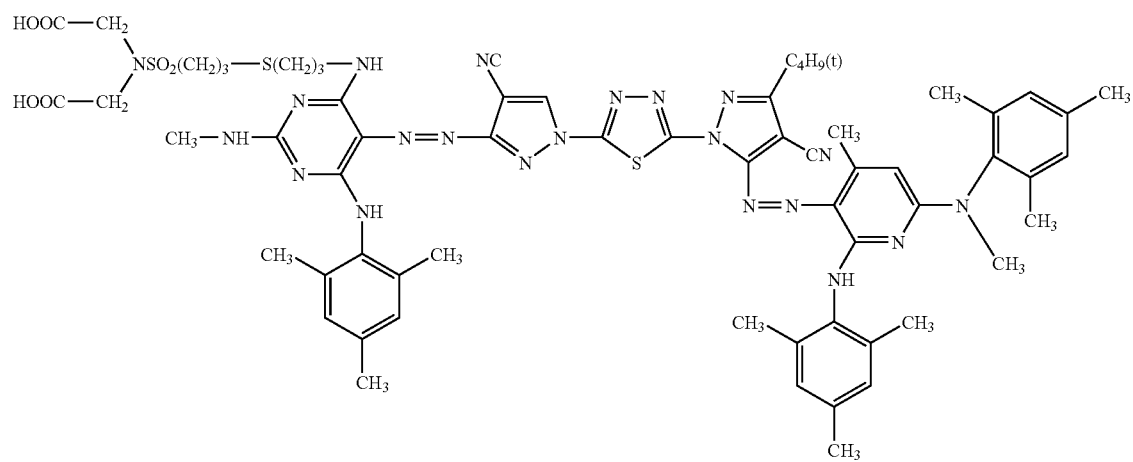

IV-1
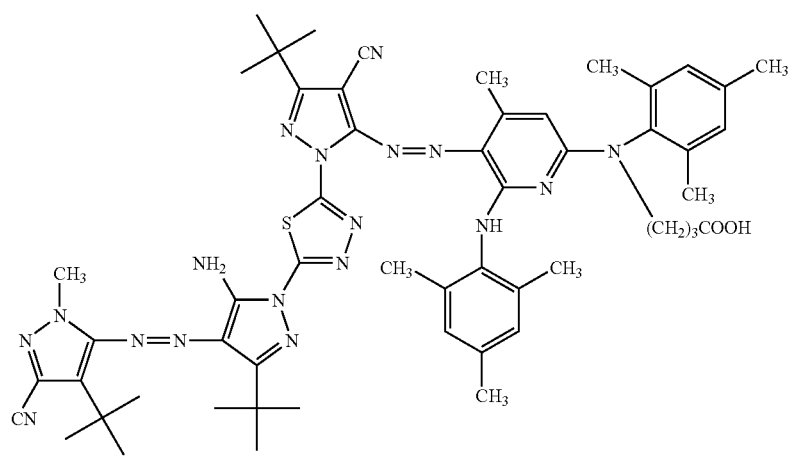
IV-2
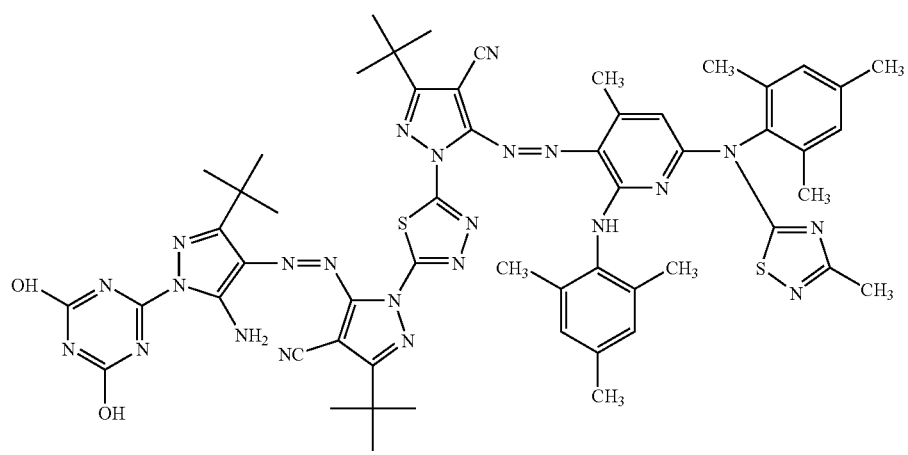
IV-3
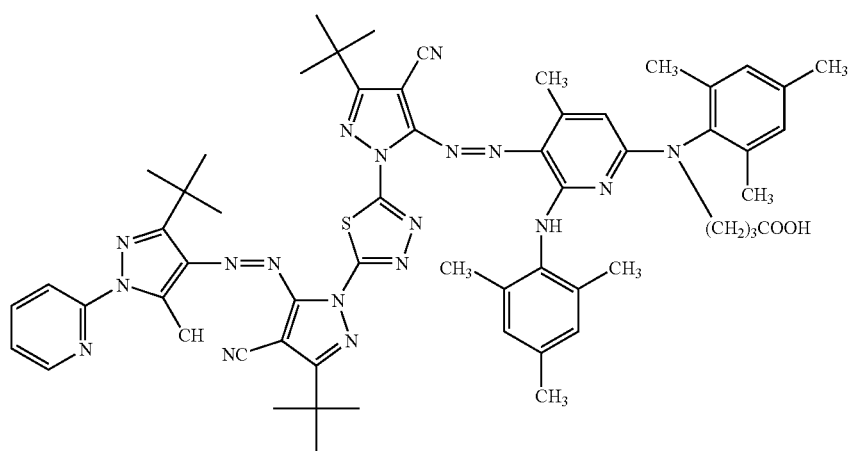

IV-4
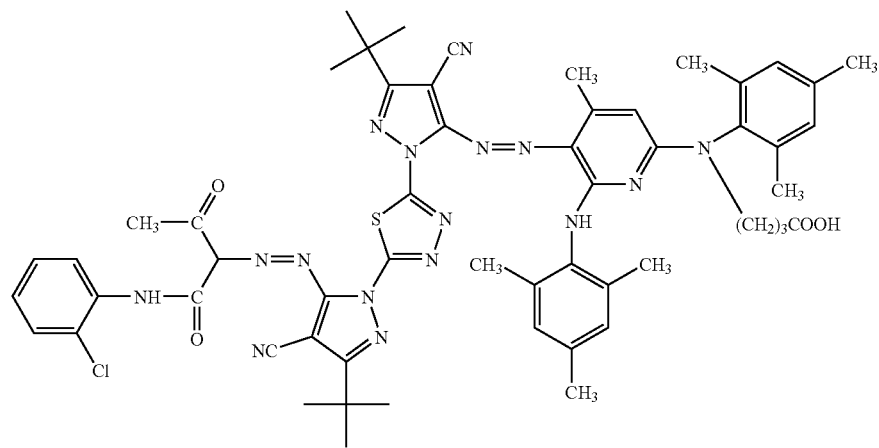
IV-5
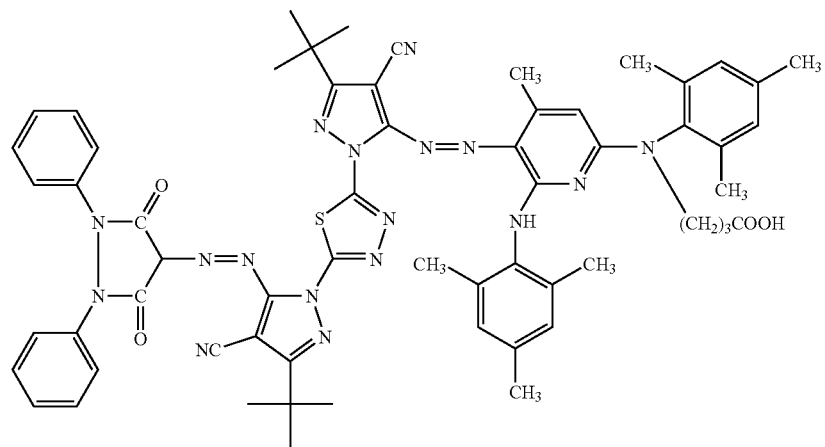
IV-6
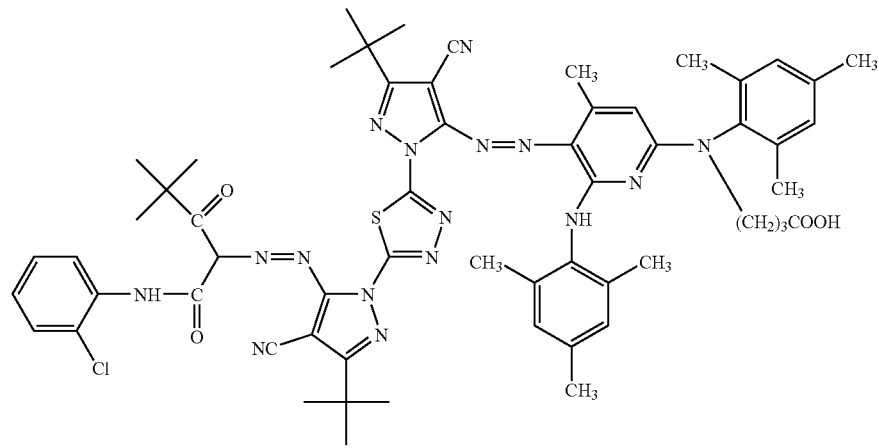

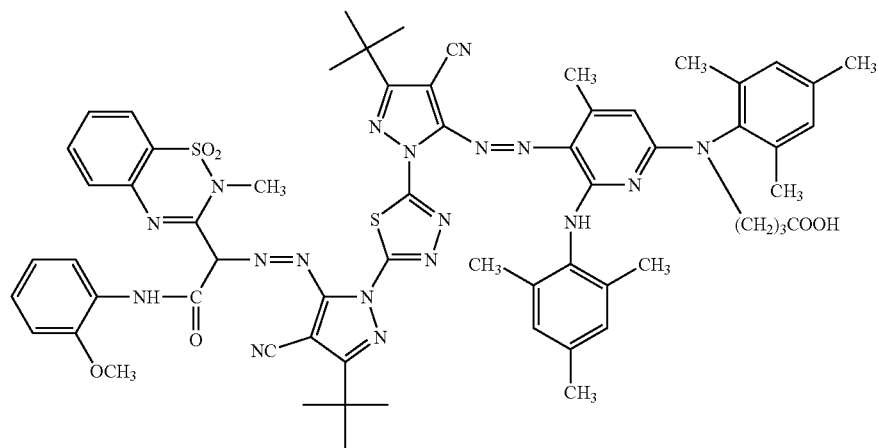
IV-7
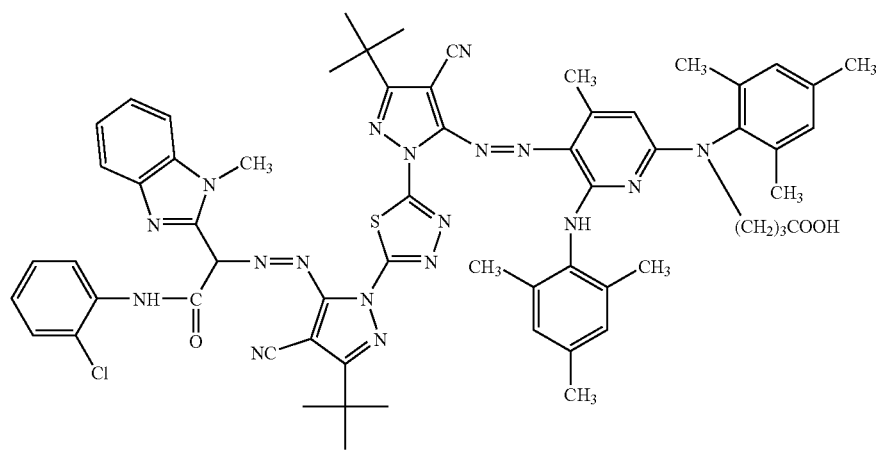
IV-8
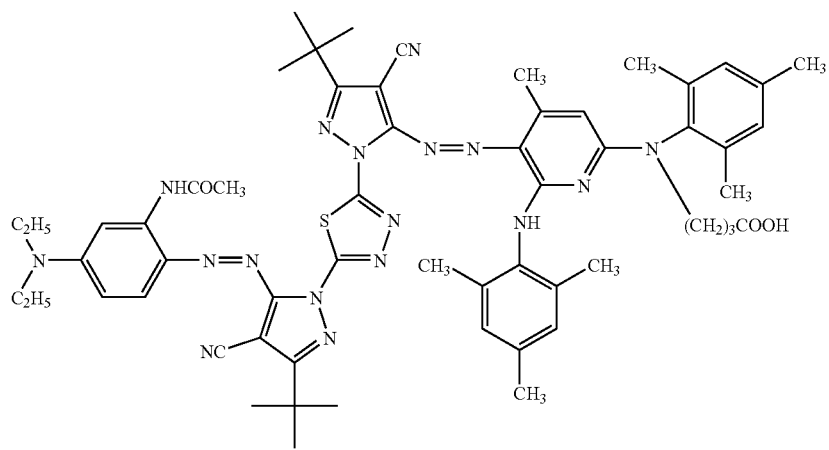
IV-9

IV-10
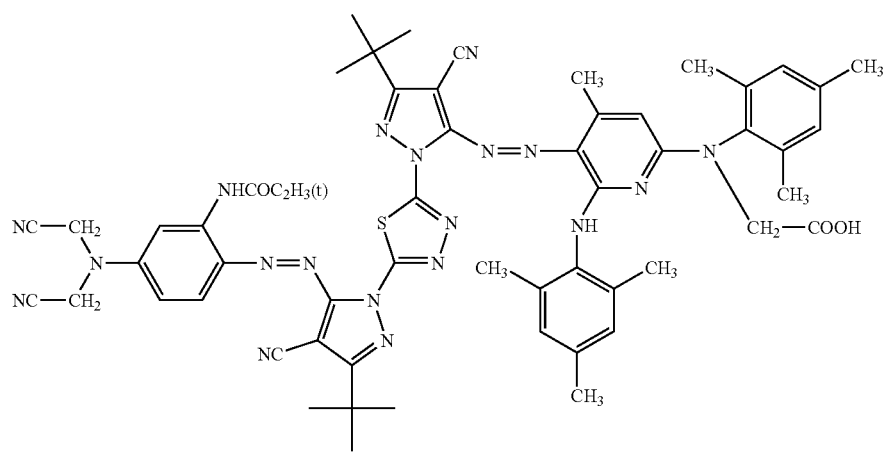
IV-11
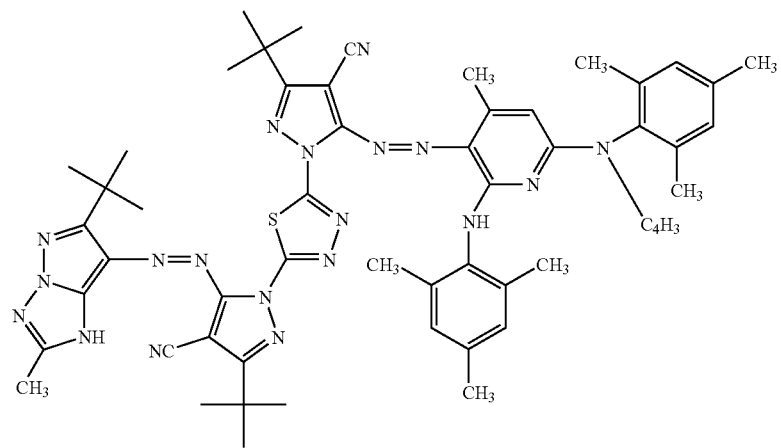
IV-12
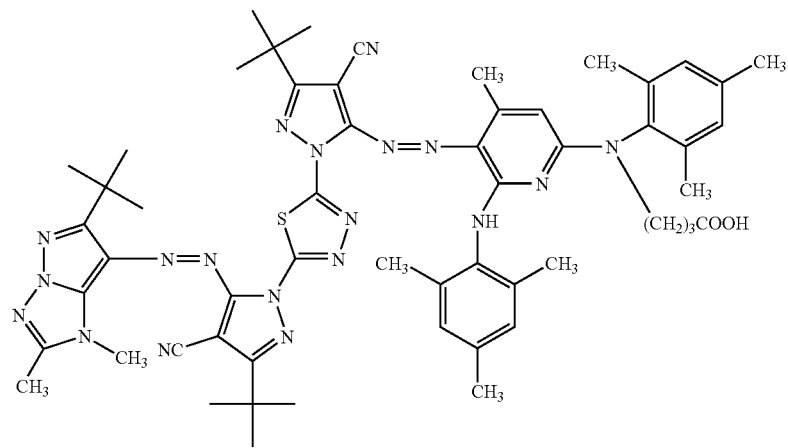

IV-13
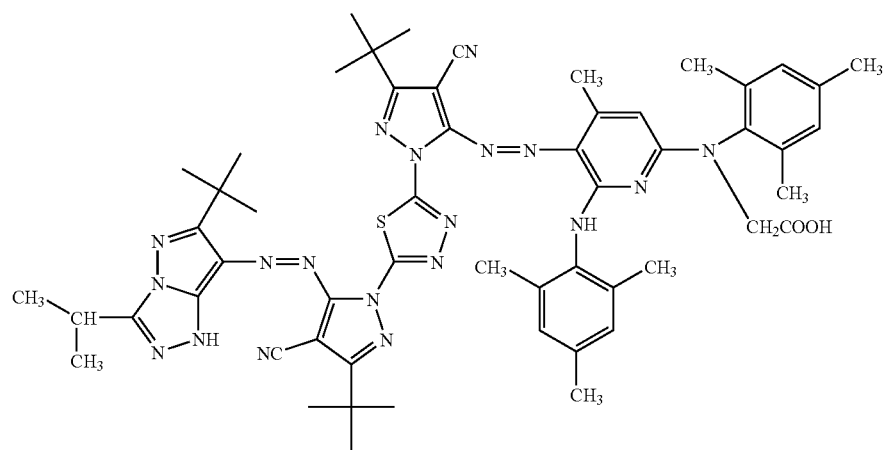
IV-14
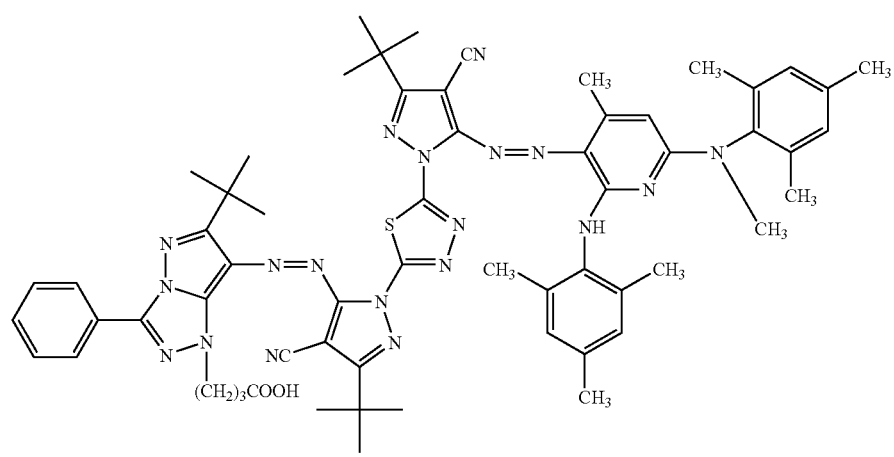
IV-15
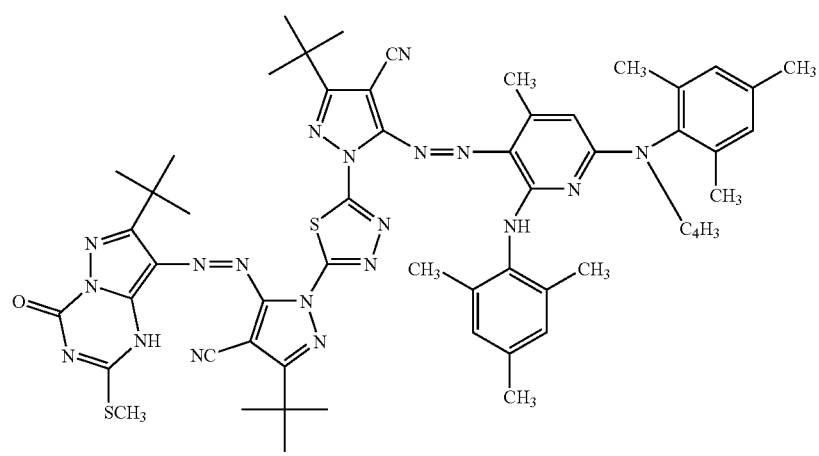

IV-16
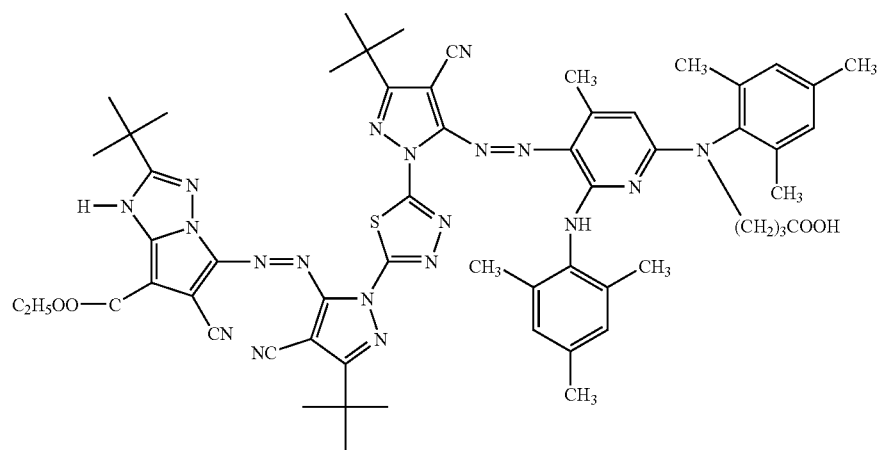
IV-17
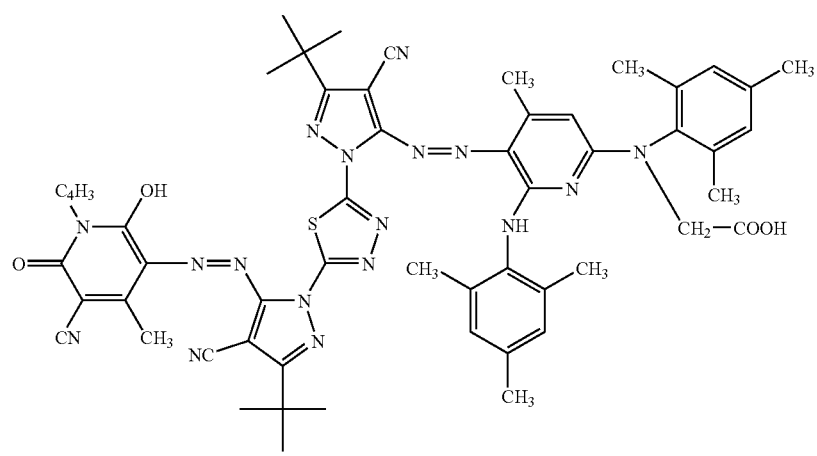
IV-18
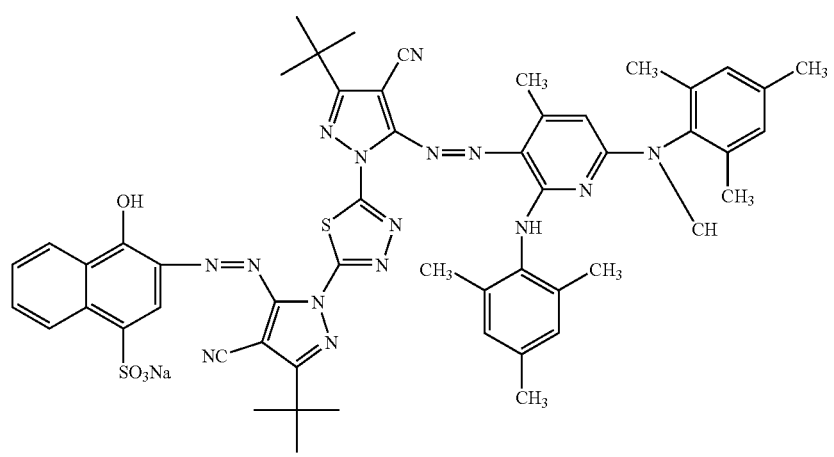

IV-19
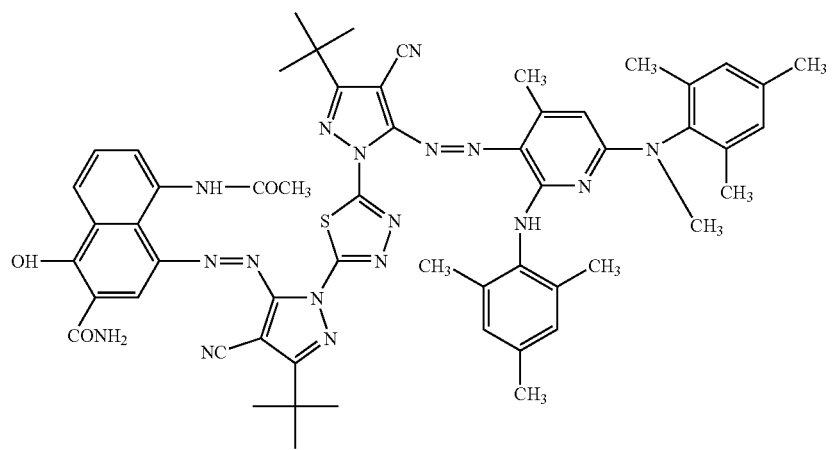
IV-20
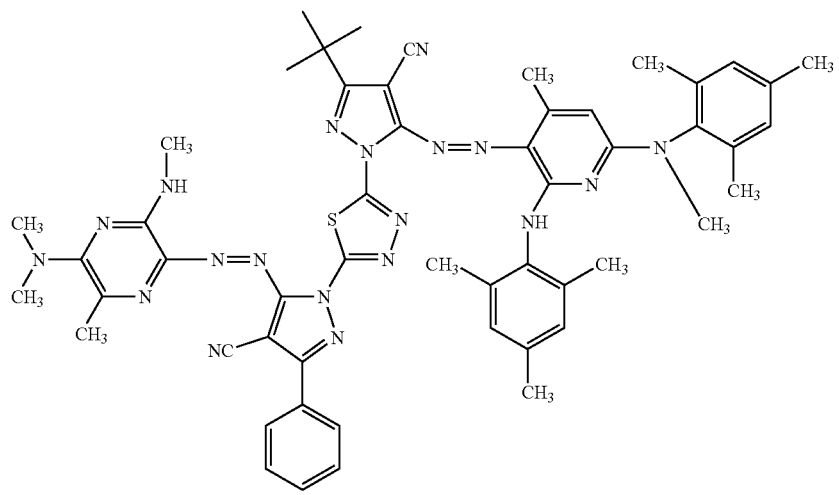
IV-21
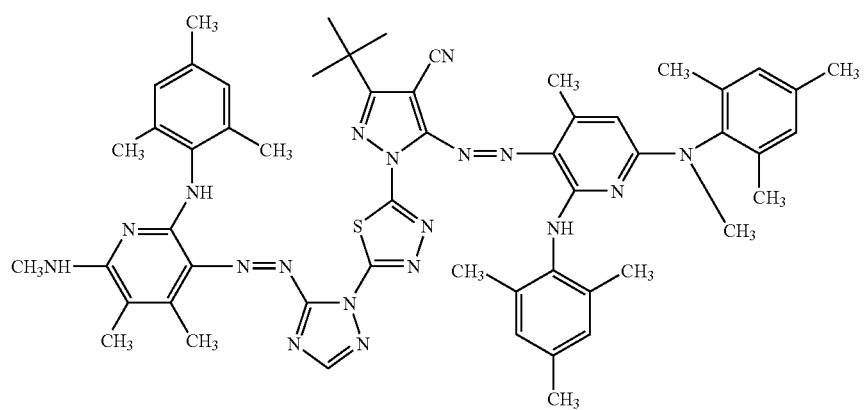

IV-22
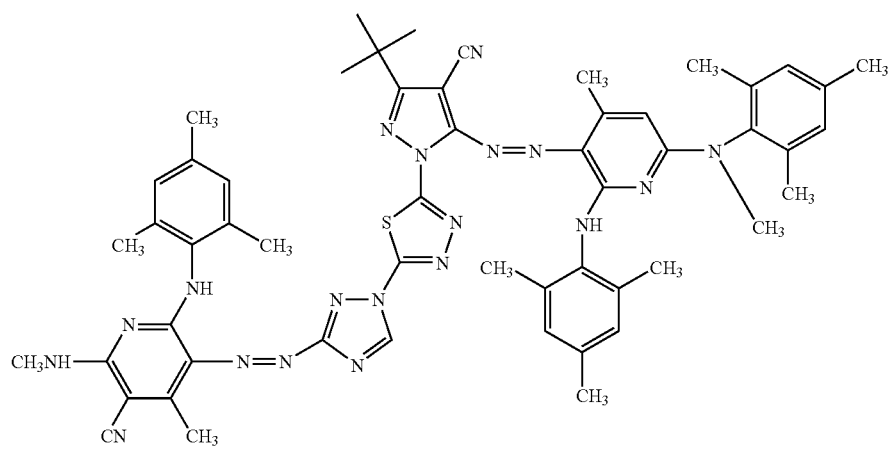
IV-23
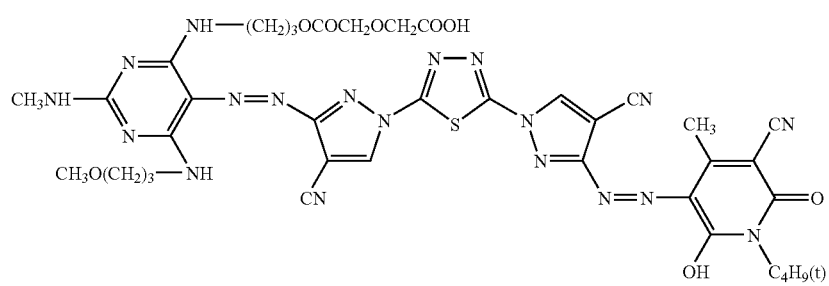
IV-24
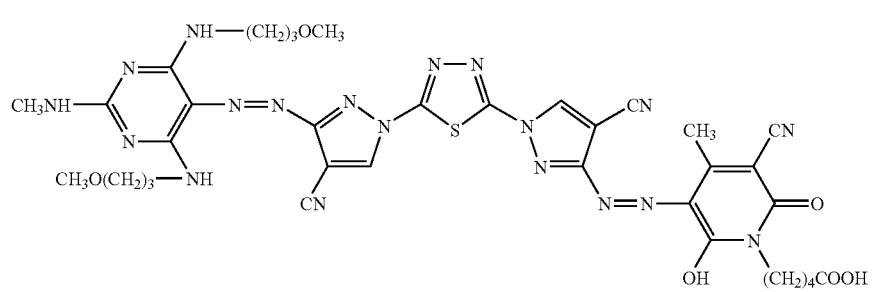
IV-25
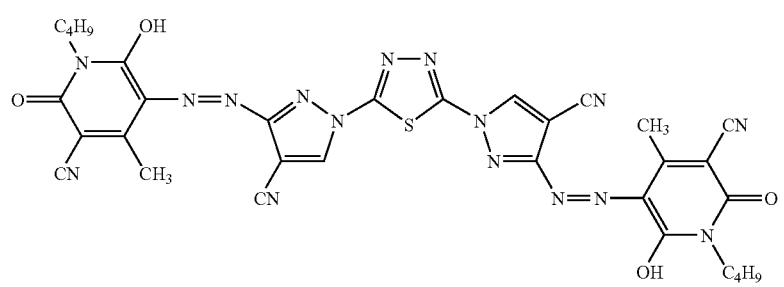

IV-26
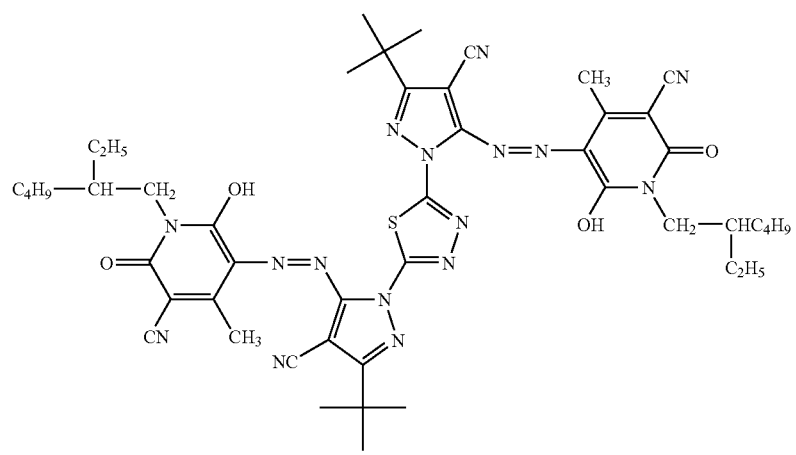
IV-27
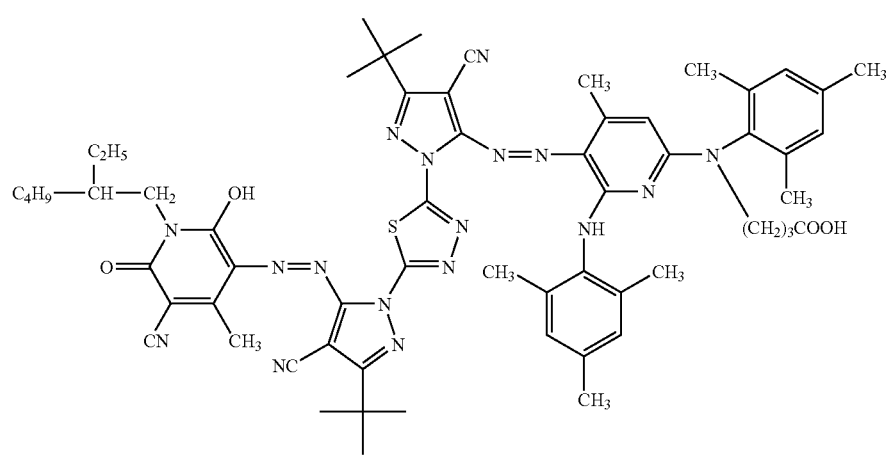
IV-28
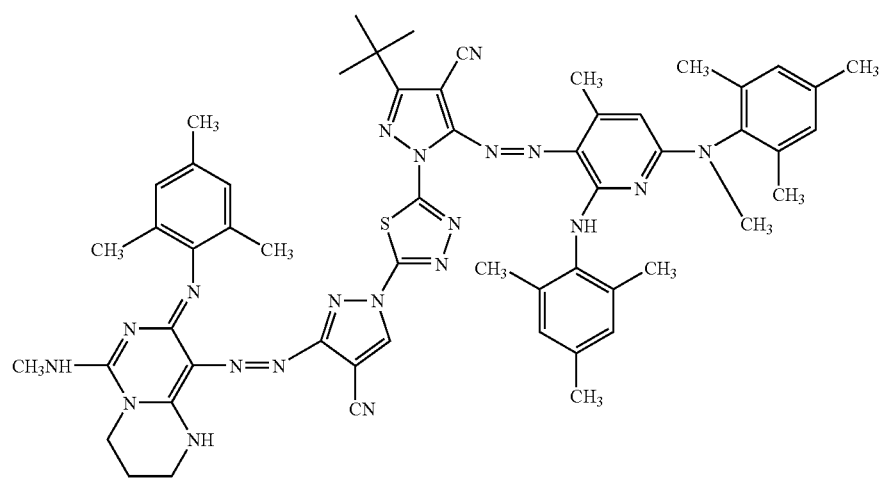

-continued

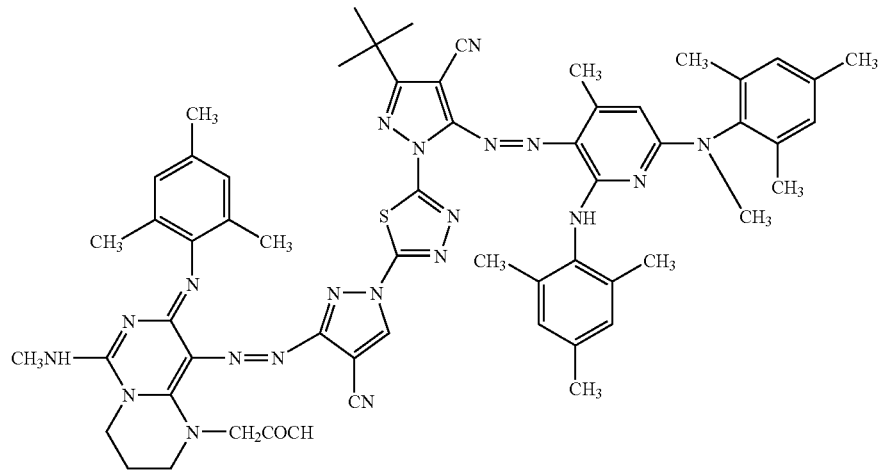

IV-29

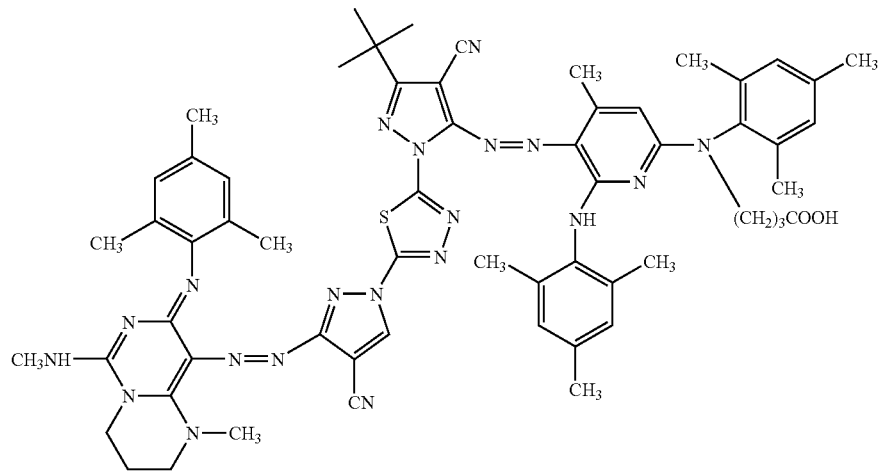

IV-30

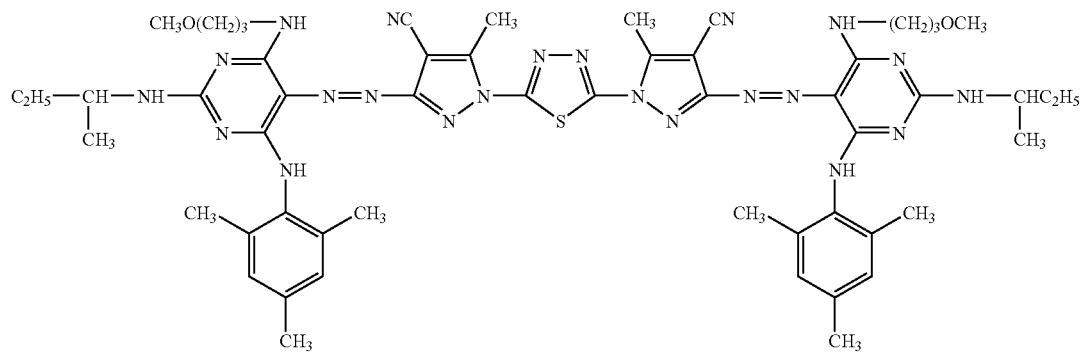

IV-31

<<Curable Composition>>

A curable composition of the present invention contains, as a colorant (dye), at least one azo compound represented by Formula (I), Formula (II), or Formula (III) shown above, and preferably further contains a polymerizable monomer and a radiation-sensitive compound. In general, the curable composition of the invention further contains a solvent. As required, the curable composition may further contain one or more other components, such as a binder and a cross linking agent.

Since the curable composition of the present invention contains an azo compound represented by Formula (I), Formula (II), or Formula (III), the curable composition of the present invention is excellent in fastness, has a development suitability (dissolution resistance), and enables reduction in the thickness of a color filter. Furthermore, the curable composition can also achieve high sensitivity, high resolution, and high transmittance.

The content of the azo compound represented by Formula (I), Formula (II), or Formula (III) in the curable composition of the present invention varies according to the molar extinction coefficient of the azo compound, desired spectral properties, and the film thickness, for example. The content thereof is preferably 1 mass % to 80 mass %, and more preferably 10 mass % to 70 mass %, based on the total solid content of the curable composition of the present invention.

The curable composition of the invention may include only one compound of the present invention, or, alternatively, may include a combination of two or more compounds of the present invention.

In the curable composition and a color filter using the curable composition of the present invention, one or more other dyes having λmax (maximum absorption wavelength) in a wavelength range of 400 nm to 600 nm may be used in addition to the azo compound of the present invention insofar as the effects of the present invention are not adversely affected. Examples of such other dyes which can be used additionally include known azo dyes, methine dyes, azomethine dyes, quinophthalone dyes, xanthene dyes, and dioxazine dyes.

<Binder>

The curable composition of the present invention may contain at least one binder. The binder used in the invention is not particularly limited insofar as it is alkali-soluble. The binder is preferably selected from the viewpoints of, for example, heat resistance, development properties, and availability.

As the alkali-soluble binder, linear organic high molecular weight polymers which are soluble in organic solvents and can be developed with a weakly alkaline aqueous solution are preferable. Examples of such linear organic high molecular weight polymers include polymers having a carboxylic acid at a side chain, for example, methacrylic acid copolymers, acrylic acid copolymers, itaconic acid copolymers, crotonic acid copolymers, maleic acid copolymers, and partially esterified maleic acid copolymers, such as those described in JP-A No. 59-44615, JP-B No. 54-34327, JP-B No. 58-12577, JP-B No. 54-25957, JP-A No. 59-53836, and JP-A No.59-71048. In particular, acidic cellulose derivatives having a carboxylic acid at a side chain are useful. Other than the above, polymers obtained by addition of acid anhydrides to hydroxyl group-containing polymers, polyhydroxystyrene resins, polysiloxane resins, poly(2-hydroxyethyl(meth)acrylate), polyvinylpyrrolidone, polyethylene oxide, and polyvinyl alcohol are also useful.

Also, a monomer having a hydrophilic group may be copolymerized. Examples thereof include an alkoxyalkyl(meth)acrylates, hydroxyalkyl(meth)acrylates, glycerol (meth)acrylate, (meth)acrylamide, N-methylolacrylamide, secondary or tertiary alkylacrylamides, dialkylaminoalkyl (meth)acrylates, morpholine (meth)acrylate, N-vinylpyrrolidone, N-vinylcaprolactam, vinylimidazole, vinyltriazole, methyl(meth)acrylate, ethyl(meth)acrylate, branched or straight-chain propyl(meth)acrylate, branched or straight-chain butyl(meth)acrylate, and phenoxyhydroxypropyl (meth)acrylate.

As other monomers having hydrophilic groups, monomers containing one or more selected from a tetrahydrofurfuryl group, a phosphoric acid moiety, a phosphoric ester moiety, a quaternary ammonium salt moiety, an ethyleneoxy chain, a propyleneoxy chain, a sulfonic acid moiety, a sulfonic acid salt moiety, a morpholinoethyl group, and the like are also useful.

Moreover, in order to improve crosslinking efficiency, the binder polymer may have a polymerizable group at a side chain, and polymers containing an allyl group, a (meth)acryl group, an allyloxyalkyl group, or the like at a side chain are also useful.

Examples of the polymers having a polymerizable group include KS RESIST 106 (manufactured by Osaka Organic Chemical Industry Ltd.), CYCLOMER P series (manufactured by Daicel Chemical Industries, Ltd.), etc.

From the viewpoint of improving the strength of a cured film, an alcohol-soluble nylon and a polyether of 2,2-bis(4-hydroxyphenyl)-propane and epichlorohydrin are also useful.

Among the above--mentioned various binders, polyhydroxystyrene resins, polysiloxane resins, acryl resins, acrylamide resins, and acryl/acrylamide copolymer resin are preferable as the binder used in the invention from the viewpoint of heat resistance. Also, acryl resins, acrylamide resins, and acryl/acrylamide copolymer resins are preferable from the viewpoint of controlling development properties. Preferable examples of acryl resins include a copolymer composed of monomers selected from benzyl(meth)acrylate, (meth)acryl, hydroxyethyl(meth)acrylate, (meth)acrylamide, and the like; KS RESIST 106 (manufactured by Osaka Organic Chemical Industry Ltd.); and CYCLOMER P series.

As the binder used in the invention, an alkali-soluble phenol resin may be used. The alkali-soluble phenol resin may be preferably used when the composition of the invention is used as a positive composition. Examples of the alkali-soluble phenol resin include novolac resins and vinyl polymers. Examples of the novolac resins include a product obtained by condensation of a phenol and an aldehyde in the presence of an acid catalyst. Examples of the phenol include phenol, cresol, ethylphenol, butylphenol, xylenol, phenylphenol, catechol, resorcinol, pyrogallol, naphthol, and bisphenol A.

Examples of the aldehyde include formaldehyde, paraformaldehyde, acetaldehyde, propionaldehyde, and benzaldehyde.

As the phenol, only one phenol compound, or alternatively a combination of two or more phenol compounds, may be used. As the aldehyde, only one aldehyde compound may be used, or alternatively a combination of two or more aldehyde compounds may be used.

Specific examples of the novolac resin include metacresol, paracresol, and condensation products of a mixture thereof with formalin.

The distribution of the molecular weight of the novolac resin may be adjusted by means of fractionation or the like. Also, a low molecular weight component having a phenolic hydroxyl group such as bisphenol C or bisphenol A may be mixed in the above novolac resin.

The above binder may be a polymer having a weight average molecular weight (polystyrene-equivalent value measured by a GPC method) of, preferably from 1,000 to $2 \times 10^5$, more preferably from 2,000 to $1 \times 10^5$, and particularly preferably from 5,000 to $5 \times 10^4$.

The content of the binder in the curable composition of the invention is preferably from 10 to 90 mass %, more preferably from 20 to 80 mass % and particularly preferably from 30 to 70 mass % based on the total solid of the curable composition of the invention.

(Crosslinking Agent)

The curable composition of the invention has a high extinction coefficient, allows reduction in the thickness, and has excellent fastness as compared with conventional curable compositions. It is possible to additionally use a crosslinking agent so as to obtain a film which has been cured to a higher degree.

Any crosslinking agent may be used without particular limitation insofar as it can cure a film through a crosslinking reaction. Examples of the crosslinking agent include (a) an epoxy resin, (b) a melamine compound, guanamine compound, glycoluril compound, or urea compound substituted by at least one substituent selected from a methylol group, an alkoxymethyl group, and an acyloxymethyl group, and (c) a phenol compound, naphthol compound, or hydroxyanthracene compound substituted by at least one substituent selected from a methylol group, an alkoxymethyl group, and an acyloxymethyl group. Among the above, polyfunctional epoxy resins are particularly preferable.

Any compounds may be used as the epoxy resin (a) without particular limitation insofar as it has an epoxy group and crosslinking properties. Examples thereof include divalent glycidyl group-containing low molecular weight compounds, such as bisphenol-A-diglycidyl ether, ethylene glycol diglycidyl ether, butane diol diglycidyl ether, hexane diol diglycidyl ether, dihydroxybiphenyl diglycidyl ether, diglycidyl phthalate, and N,N-diglycidylaniline; trivalent glycidyl group-containing low molecular weight compounds such as trimethylolpropane triglycidyl ether, trimethylolphenol triglycidyl ether, and Tris P-PA triglycidyl ether; tetravalent glycidyl group-containing low molecular weight compounds such as pentaerythritol tetraglycidyl ether and tetramethylol bisphenol-A-tetraglycidyl ether; polyvalent glycidyl group-containing low molecular weight compounds, such as dipentaerythritol pentaglycidyl ether and dipentaerythritol hexaglycidyl ether; and glycidyl group-containing high molecular weight compounds such as polyglycidyl(meth)acrylate and a 1,2-epoxy-4-(2-oxyranyl)cyclohexane adduct of 2,2-bis(hydroxymethyl)-1-butanol.

The total number of methylol groups, alkoxymethyl groups, and acyloxymethyl groups as substituents contained in the crosslinking agent (b), may be from 2 to 6 in the case of a melamine compound and may be from 2 to 4 in the case of a glycoluril compound, guanamine compound, or urea compound, and is preferably from 5 to 6 in the case of a melamine compound and is preferably from 3 to 4 in the case of a glycoluril compound, guanamine compound, or urea compound.

Hereinafter, the compounds described in the aforementioned item (b), such as melamine compounds, guanamine compounds, glycoluril compounds, and urea compounds, are sometimes collectively referred to as compounds according to item (b) (methylol-group containing compounds, alkoxymethyl-group containing compounds, or acyloxymethyl-group containing compounds).

The alkoxymethyl group-containing compounds according to item (b) can be obtained by heating a methylol group-containing compounds according to item (b) in an alcohol in the presence of an acid catalyst, such as hydrochloric acid, sulfuric acid, nitric acid, or methanesulfonic acid. The acyloxymethyl-group containing compounds according to item (b) can be obtained by mixing, by stirring, a methylol group-containing compound according to item (b) with an acyl chloride in the presence of a basic catalyst.

Specific examples of the compounds according to item (b) having the above-mentioned substituent(s) will be described.

Examples of the melamine compounds include hexamethylolmelamine, hexamethoxymethylmelamine, compounds obtained by methoxymethylating 1 to 5 methylol groups of hexamethylolmelamine or mixtures thereof, hexamethoxyethylmelamine, hexaacyloxymethylmelamine, and compounds obtained by acyloxymethylating 1 to 5 methylol groups of hexamethylolmelamine or mixtures thereof.

Examples of the above guanamine compounds include tetramethylolguanamine, tetramethoxymethylguanamine, compounds obtained by methoxymethylating 1 to 3 methylol groups of tetramethylolguanamine or mixtures thereof, tetramethoxyethylguanamine, tetraacyloxymethylguanamine, and compounds obtained by acyloxymethylating 1 to 3 methylol groups of tetramethylolguanamine or mixtures thereof.

Examples of the glycoluril compounds include tetramethylolglycoluril, tetramethoxymethylglycoluril, compounds obtained by methoxymethylating 1 to 3 methylol groups of tetramethylolglycoluril or mixtures thereof, and compounds obtained by acyloxymethylating 1 to 3 methylol groups of tetramethylolglycoluril or mixtures thereof.

Examples of the urea compounds include tetramethylolurea, tetramethoxymethylurea, compounds obtained by methoxymethylating 1 to 3 methylol groups of tetramethylolurea or mixtures thereof, and tetramethoxyethylurea.

Only a single compound according to item (b) may be used, or, alternatively, two or more compounds according to item (b) may be used in combination.

The above-mentioned crosslinking agent (c), such as a phenol compound, naphthol compound, or hydroxyanthracene compound substituted by at least one group selected from a methylol group, an alkoxymethyl group, and an acyloxymethyl group, suppresses intermixing with an overcoat photoresist through thermal crosslinking and further improves the film strength, similarly to the case of the crosslinking agent (b).

Hereinafter, these compounds may be sometimes collectively referred to as compounds according to item (c) (a methylol group-containing compound, an alkoxy methyl group-containing compound, or an acyloxy methyl group-containing compound).

The total number of methylol groups, acyloxymethyl groups, or alkoxymethyl groups contained in the crosslinking agent (c) has to be at least 2 per molecule. For example, a compound in which a phenol compound, serving as a skeleton, is substituted at all of 2-positions and 4-positions is preferable from the viewpoint of thermal crosslinking properties and storage stability. When the skeleton is a naphthol compound or a hydroxyanthracene compound, all of ortho- and para-positions relative to the OH group in the compound is preferably substituted. The 3- or 5-position of the phenol compound as the skeleton may be unsubstituted or may have a substituent. Also in the naphthol compound as the skeleton, positions other than the ortho-position relative to the OH group may be unsubstituted or may have a substituent.

The methylol group-containing compounds according to item (c) each can be obtained by using, as starting material, a compound in which the ortho- or para-position (2- or 4-position) relative to the phenolic OH group is a hydrogen atom and by reacting the compound with formalin in the presence of a basic catalyst such as sodium hydroxide, potassium hydroxide, ammonia, or tetraalkylammonium hydroxide.

The alkoxymethyl group-containing compounds according to item (c) each can be obtained by heating a methylol group-containing compound according to item (c) in an alcohol in the presence of an acid catalyst such as hydrochloric acid, sulfuric acid, nitric acid, or methanesulfonic acid.

The acyloxymethyl group-containing compounds according to item (c) each can be obtained by reacting a methylol group-containing compound according to item (c) with acyl chloride in the presence of a basic catalyst.

Examples of the skeleton compound in the crosslinking agent (c) include phenol compounds, naphthol compounds and hydroxyanthracene compounds in which the ortho- or para-positions relative to the phenolic OH group are unsubstituted. Examples of usable compounds include phenol, each isomer of cresol, 2,3-xylenol, 2,5-xylenol, 3,4-xylenol, 3,5-xylenol, bisphenols such as bisphenol-A, 4,4'-bishydroxybiphenyl, Tris P-PA (manufactured by Honshu Chemical Industry Co., Ltd.), naphthol, dihydroxynaphthalene, and 2,7-dihydroxyanthracene.

Specific examples of the crosslinking agent (c) include trimethylol phenol, tri(methoxymethyl)phenol, compounds obtained by methoxymethylating 1 to 2 methylol groups of trimethylol phenol, trimethylol-3-cresol, tris(methoxymethyl)-3-cresol, compounds obtained by methoxymethylating 1 to 2 methylol groups of trimethylol-3-cresol, dimethylol cresol such as 2,6-dimethylol-4-cresol, tetramethylol bisphenol-A, tetrakis(methoxymethyl)bisphenol A, compounds obtained by methoxymethylating 1 to 3 methylol groups of tetramethylol bisphenol-A, tetramethylol-4,4'-bishydroxybiphenyl, tetrakis(methoxymethyl)-4,4'-bishydroxybiphenyl, hexamethylol form of Tris P-PA, hexamethoxymethyl form of Tris-PA, compounds obtained by methoxymethylating 1 to 5 methylol groups of a hexamethylol form of Tris P-PA, and bis(hydroxymethyl)naphthalenediol.

Examples of the hydroxyanthracene compound include 1,6-bis(hydroxymethyl)-2,7-dihydroxyanthracene.

Examples of the acyloxymethyl group-containing compound include a compound obtained by acyloxymethylating some or all of the methylol groups of a methylol group-containing compound selected from those described above.

Preferable compounds among the above-mentioned compounds include trimethylol phenol, bis(hydroxymethyl)-p-cresol, tetramethylolbisphenol A, hexamethylol form of tris P-PA (manufactured by Honshu Chemical Industry Co., Ltd.), and phenol compounds obtained by substituting the methylol groups of any of the above compounds with alkoxymethyl groups or with both of a methylol group and an alkoxymethyl group.

Only one compound according to item (c) may be used, or two or more compounds according to item (c) may be used in combination.

When the crosslinking agent is contained, the total content of the crosslinking agents (a) to (c) in the curable composition is preferably 1 to 70 mass %, more preferably 5 to 50 mass %, and particularly preferably 7 to 30 mass % based on the total solid content (mass) of the composition though it differs depending on the type of the material. When the content thereof is within the above-mentioned range, a sufficient curing degree and sufficient dissolution properties of an unexposed portion can be ensured without insufficiency in the curing degree of an exposed portion or significant decrease in the dissolution properties of an unexposed portion.

(Polymerizable Monomer)

The curable composition of the present invention preferably contains at least one polymerizable monomer. The polymerizable monomer is contained mainly when a negative curable composition is produced.

The polymerizable monomer may be contained with the after-mentioned photoinitiator in a positive curable composition containing a naphthoquinonediazide compound mentioned later; in such a case, the curing degree of the pattern to be formed can be further enhanced. Hereinafter, the polymerizable monomer will be described.

The polymerizable monomer is preferably a compound having a boiling point of 100° C. or more under normal pressure and having at least one addition-polymerizable ethylenic unsaturated group. Examples thereof include monofunctional acrylates and monofunctional methacrylates such as polyethylene glycol mono(meth)acrylate, polypropylene glycol mono(meth)acrylate, and phenoxyethyl(meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tris(acryloyloxypropyl)ether, tris(acryloyloxyethyl)isocyanurate, compounds obtained by adding ethylene oxide or propylene oxide to polyfunctional alcohols such as glycerin and trimethylolethane and (meth)acrylating the adduct, urethaneacrylates such as those described in JP-B No.48-41708, JP-B No. 50-6034, and JP-A No. 51-37193, polyester acrylates such as those described in JP-A No. 48-64183, JP-B No. 49-43191, and JP-B No. 52-30490, and polyfunctional acrylates and polyfunctional methacrylates such as epoxy(meth)acrylates, which are reaction products of epoxy resins and (meth)acrylates, and mixtures of two or more of these compounds.

Further examples include those introduced as photocurable monomers and oligomers in *Nihon Secchaku Kyoukai-shi* (Japan Adhesive Association), Vol. 20, No. 7, page 300 to page 308.

The content of the polymerizable monomer in the curable composition is preferably from 0.1 to 90 mass %, more preferably from 1.0 to 80 mass %, and particularly preferably from 2.0 to 70 mass %, based on the solid content of the curable composition.

<Radiation-sensitive Compound>

The curable composition of the present invention preferably contains at least one radiation-sensitive compound. The radiation-sensitive compound of the present invention is a compound which can cause a chemical reaction, such as radical generation, acid generation, or base generation. The radiation-sensitive compound is used in order to insolubilize the binder through a reaction such as crosslinking, polymerization, or decomposition of an acidic group and/or in order to make the coating film insoluble to an alkaline developer by, for example, causing polymerization of the polymerizable monomer or oligomer contained in the coating film or crosslinking with a cross linking agent.

When the curable composition is in the form of a negative type in particular, the curable composition preferably contains a photoinitiator. When the curable composition is in the form of a positive type, the curable composition preferably contains a naphthoquinonediazide compound.

<Photoinitiator>

Next, the photoinitiator contained in the curable composition of the invention when the curable composition is a negative composition will be described.

Any photoinitiator may be used without particular limitation insofar as it can cause polymerization of the polymerizable monomer. The photoinitiator is preferably selected from the viewpoints of, for example, properties, initiating efficiency, absorbing wavelength, availability, and cost.

The photoinitiator may be further contained in the positive curable composition containing a naphthoquinonediazide compound. In such a case, the curing degree of the pattern to be formed can be further enhanced.

Examples of the photoinitiator include at least one active halogen compound selected from a halomethyloxadiazole compound and a halomethyl-s-triazine compound, 3-aryl-substituted cumarin compound, lophine dimer, a benzophenone compound, an acetophenone compound and its derivatives, a cyclopentadiene-benzene-iron complex and its salts, and an oxime compound.

Examples of the active halogen compound, such as halomethyloxadiazoles, include 2-halomethyl-5-vinyl-1,3,4-oxadiazole compounds described in JP-B No. 57-6096, 2-trichloromethyl-5-styryl-1,3,4-oxadiazole, 2trichloromethyl-5-(p-cyanostyryl)-1,3,4-oxadiazole, and 2-trichloromethyl-5-(p-methoxystyryl)-1,3,4--oxadiazole.

Examples of the halomethyl-s-triazine compound include vinyl-halomethyl-s-triazine compounds described in JP-B No. 59-1281, 2-(naphtho-1-yl)-4,6-bis-halomethyl-s-triazine compounds and 4-(p-aminophenyl)-2,6-di-halomethyl--s-triazine compounds described in JP-A No. 53-133428.

Other examples of the photoinitiator include 2,4-bis(trichloromethyl)-6-p-methoxystyryl-s-triazine, 2,6-bis(trichloromethyl)-4-(3,4-methylenedioxyphenyl)-1,3,5-triazine, 2,6--bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-(4-butoxy-naphtho-1-yl)-4,6-bis(trichloromethyl)-s-triazine, 2-[4-(2-methoxyethyl)-naphtho-1-yl]-4,6-bis(trichloromethyl)-s-triazine, 2-[4-(2-ethoxyethyl)-naphtho-1-yl]-4,6-bis(trichloromethyl)-s-triazine, 2-[4-(2-butoxyethyl)-naphtho-1-yl]-4,6-bis(trichloromethyl)-s-triazine, 2-(2-methoxy-naphtho-1-yl)-4,6-bis(trichloromethyl)-s-triazine, 2-(6-methoxy-5-methyl-naphtho-2-yl)-4,6-bis(trichloromethyl)-s-triazine, 2-(6-methoxy-naphtho-2-yl)-4,6-)is(trichloromethyl)-s-triazine, 2-(5-methoxy-naphtho-1-yl)-4,6-bis(trichloromethyl)-s-triazine, 2-(4,7-dimethoxy-naphtho-1-yl)-4,6-bis(trichloromethyl)-s-triazine, 2-(6-ethoxy-naphtho-2-yl)-4,6-bis(trichloromethyl)-s-triazine, 2-(4,5-dimethoxy-naphtho-1-yl)-4,6-bis(trichloromethyl)-s-triazine, 4-[p-N,N-bis(ethoxycarbonylmethyl)aminophenyl]-2,6-bis(trichloromethyl)-s-triazine, 4-[o-methyl-p-N,N-bis(ethoxycarbonylmethyl)aminophenyl]-2,6-bis(trichloromethyl)-s-triazine, 4-[p-N,N-bis(chloroethyl)aminophenyl]-2,6-bis(trichloromethyl)-s-triazine, 4-[o-methyl-p-N,N-bis(chloroethyl)aminophenyl]-2,6-bis(trichloromethyl)-s-triazine, 4-(p-N-chloroethylaminophenyl)-2,6-bis(trichloromethyl)-s-triazine, 4-(p-N-ethoxycarbonylmethylaminophenyl)-2,6-bis(trichloromethyl)-s-triazine, 4-[p-N,N-di(phenyl)aminophenyl]-2,6-bis(trichloromethyl)-s-triazine, 4-(p-N-chloroethylcarbonylaminophenyl)-2,6-bis(trichloromethyl)-s-triazine, and 4-[p-N-(p-metoxyphenyl)carbonylaminophenyl]2,6-bis(trichloromethyl)-s-triazine.

Further examples of the photoinitiator include 4-[m-N,N-bis(ethoxycarbonylmethyl)aminophenyl]-2,6-bis(trichloromethyl)-s-triazine, 4-[m-bromo-p-N,N-bis(ethoxycarbonylmethyl)aminophenyl]-2,6-bis(trichloromethyl)-s-triazine, 4-[m-chloro-p-N,N-bis(ethoxycarbonylmethyl)aminophenyl]-2,6-bis(trichloromethyl)-s-triazine, 4-[m-fluoro-p-N,N-bis(ethoxycarbonylmethyl)aminophenyl]-2,6-bis(trichloromethyl)-s-triazine, 4-[o-bromo-p-N,N-bis(ethoxycarbonylmethyl)aminophenyl]-2,6-bis(trichloromethyl)-s-triazine, 4-[o-chloro-p-N,N-bis(ethoxycarbonylmethyl)aminophenyl]-2,6-bis(trichloromethyl)-s-triazine, 4-[o-fluoro-p-N,N-bis(ethoxycarbonylmethyl)aminophenyl]-2,6-bis(trichloromethyl)-s-triazine, 4-[o-bromo-p-N,N-bis(chloroethyl)aminophenyl]-2,6-bis(trichloromethyl)-s-triazine, 4-[o-chloro-p-N,N-bis(chloroethyl)aminophenyl]-2,6-bis(trichloromethyl)-s-triazine, 4-[o-fluoro-p-N,N-bis(chloroethyl)aminophenyl]-2,6-bis(trichloromethyl)-s-triazine, 4-[m-bromo-p-N,N-bis(chloroethyl)aminophenyl]-2,6-bis(trichloromethyl)-s-triazine, 4-[m-chloro-p-N,N-bis(chloroethyl)aminophenyl]-2,6-bis(trichloromethyl)-s-triazine, 4-[m-fluoro-p-N,N-bis(chloroethyl)aminophenyl]-2,6-bis(trichloromethyl)-s-triazine, 4-(m-bromo-p-N-ethoxycarbonylmethylaminophenyl)-2,6-bis(trichloromethyl)-s-triazine, 4-(m-chloro-p-N-ethoxycarbonylmethylaminophenyl)-2,6-bis(trichloromethyl)-s-triazine, 4-(m-fluoro-p-N-ethoxycarbonylmethylaminophenyl)-2,6-bis(trichloromethyl)-s-triazine, 4-(o-bromo-p-N-ethoxycarbonylmethylaminophenyl)-2,6-bis(trichloromethyl)-s-triazine, 4-(o-chloro-p-N-ethoxycarbonylmethylaminophenyl)-2,6-bis(trichloromethyl)-s-triazine, 4-(o-fluoro-p-N-ethoxycarbonylmethylaminophenyl)-2,6-bis(trichloromethyl)-s-triazine, 4-(m-bromo-p-N-chloroethylaminophenyl)-2,6-bis(trichloromethyl)-s-triazine, 4-(m-chloro-)-N-chloroethylaminophenyl)-2,6-bis(trichloromethyl)-s-triazine, 4-(m-fluoro-p-N-chloroethylaminophenyl)-2,6-bis(trichloromethyl)-s-triazine, 4-(o-bromo-p-N-chloroethylaminophenyl)-2,6-bis(trichloromethyl)-s-triazine, 4-(o-chloro-p-N-chloroethylaminophenyl)-2,6-bis(trichloromethyl)-s-triazine and 4-(o-fluoro-p-N-chloroethylaminophenyl)-2,6-bis(trichloromethyl)-s-triazine.

Examples of usable photoinitiators other than the above include TAZ series manufactured by Midori Kagaku Co., Ltd. (TAZ-107, TAZ-110, TAZ-104, TAZ-109, TAZ-140, TAZ-204, TAZ-113, and TAZ-123), T series manufactured by PANCHIM (T-OMS, T-BMP, T-R, and T-B), IRGACURE series manufactured by Ciba Specialty Chemicals Corp. (IRGACURE 369, IRGACURE 784, IRGACURE 651, IRGACURE 184, IRGACURE 500, IRGACURE 1000, IRGACURE 149, IRGACURE 819, and IRGACURE 261), DAROCURE series manufactured by Ciba Specialty Chemicals Corp. (DAROCURE 11734), 4'-bis(diethylamino)-benzophenone, 2-(O-benzoyloxime)-1-[4-(phenylthio)phenyl]-1,2-octanedione, 1-(O-acetyloxime)-1-[9-ethyl-6-(2-methylbenzoyl)-9H-carbazole-3-yl]ethanone, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, and benzoin isopropyl ether.

Particularly preferable examples include oxime O-acyl compounds such as 2-(O-benzoyloxime)-1-[4-(phenylthio)phenyl]-1,2-octanedione and 1-(O-acetyloxime)-1-[9-ethyl-6-(2-methylbenzoyl)-9H-carbazole-3-yl]ethanone.

For the curable composition of the invention, one or more known photoinitiators other than the above-mentioned photoinitiators can be used in combination.

Specific examples of the known photoinitiators include vicinal polyketolaldonyl compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, aromatic acyloin compounds substituted by an α-hydrocarbon disclosed in U.S. Pat. No. 2,722,512, polynuclear quinone compounds disclosed in U.S. Pat. Nos. 3,046,127 and 2,951,758, a combination of a triallylimidazole dimer/p-aminophenyl ketone disclosed in U.S. Pat. No. 3,549,367, and benzothiazole compound/trihalomethyl-s-triazine compound disclosed in JP-B No. 51-48516.

The content of the photoinitiator in the curable composition is preferably from 0.01 mass % to 50 mass %, more preferably from 1 mass % to 30 mass %, and particularly preferably from 1 mass % to 20 mass %, based on the solid content of the polymerizable monomer. When the content of the photoinitiator is in the above-mentioned range, polymerization proceeds satisfactorily, thus achieving a favorable film strength.

The photoinitiator may be used in combination with a sensitizer and/or a photo-stabilizer.

Specific examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzalacetone, p-(dimethylamino)phenylstyryl ketone, p-(dimethylamino)phenyl-p-methylstyryl ketone, benzophenone, p-(dimethylamino)benzophenone (or Michler's ketone), p-(diethylamino)benzophenone, and benzoanthrone; benzothiazole compounds described in JP-B No. 5148516; and TINUBIN 1130 and 400.

It is preferable for the curable composition of the invention to further contain a thermal polymerization preventing agent besides the above ingredients. Examples of useful thermal polymerization preventing agents include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-mercaptobenzoimidazole.

-Naphthoquinonediazide Compound-

Next, a naphthoquinonediazide compound contained when the curable composition of the present invention is of a positive type will be described.

The naphthoquinonediazide compound refers to a compound containing at least one o-quinonediazide group. Mentioned are, for example, o-naphthoquinonediazide-5-sulfonic ester, o-naphthoquinonediazide-5-sulfonic acid amide, o-naphthoquinonediazide-4-sulfonic ester, and o-naphthoquinonediazide-4-sulfonic acid amide. These esters and amide compounds may be produced by known methods using, for example, a phenol compound represented by Formula (I) described in JP-A Nos. 2-84650 and 3-49437.

When the curable composition of the invention is in the form of a positive composition, the amounts of the alkali-soluble phenol resin and the crosslinking agent to be dissolved in an organic solvent is preferably approximately from 2 to 50 mass % and approximately from 2 to 30 mass %, respectively, in the organic solvent in usual cases. Usually, the amounts of the naphthoquinonediazide compound and the dye to be added are preferably approximately from 2 to 30 mass % and approximately from 2 to 50 mass %, respectively, based on the solution containing the binder and crosslinking agent dissolved therein.

<Solvent>

In general, the curable composition of the present invention may contain a solvent when prepared. Any solvent may be used in the invention without particular limitation basically, insofar as the solubility of each ingredient of the composition and coatability of the curable composition are satisfactory. It is preferable to select the solvent in consideration of the solubility, coatability, and safety of the binder.

Specific examples of the solvent include esters, such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl ethoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate;

ethers such as diethylene glycol dimethyl ether, tetrahydrofuran, ethylene glycol monomethyl ether, ethylene glycol monoethyl ether, ethylene glycol monomethyl ether acetate (methyl cellosolve acetate), ethylene glycol monoethyl ether acetate (ethyl cellosolve acetate), diethylene glycol monomethyl ether, diethylene glycol monoethyl ether, diethylene glycol monobutyl ether, diethylene glycol monomethyl ether acetate (methylcarbitol acetate), diethylene glycol monoethyl ether acetate (ethylcarbitol acetate), diethylene glycol monobutyl ether acetate (butyl carbitol acetate), propylene glycol methyl ether, propylene glycol methyl ether acetate, propylene glycol ethyl ether acetate, and propylene glycol propyl ether acetate;

ketones such as methyl ethyl ketone, cyclohexanone, 2-heptanone, and 3-heptanone; and aromatic hydrocarbons such as toluene and xylene.

Among the above-mentioned solvents, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate are more preferable.

<Various Additives>

The curable composition of the invention may contain, as required, one or more selected from various additives, such as fillers, high molecular weight compounds other than those mentioned above, surfactants, adhesion promoters, antioxidants, ultraviolet absorbers, and coagulation preventing agents.

Specific examples of the additives include fillers such as glass and alumina; high molecular weight compounds other than the binder resin, which may be selected from polyvinyl alcohol, polyacrylic acid, polyethylene glycol monoalkyl ether, and polyfluoroalkyl acrylate; nonionic, cationic, or anionic surfactants; adhesion promoters, such as vinyltrimethoxysilane, vinyltriethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants, such as 2,2-thiobis(4-methyl-6-t-butylphenol) and 2,6-di-t-butylphenol; ultraviolet absorbers, such as 2-(3-t-butyl-5-methyl-2-hydroxyphenyl)-5-chlorobenzotriazole and alkoxybenzophenone; and coagulation preventing agents such as sodium polyacrylate.

In order to enhance the alkali-solubility of a portion to be removed by development (e.g., uncured portion in the case of a negative type) and further improve the development properties of the curable composition of the invention, an organic carboxylic acid, preferably a low-molecular-weight organic carboxylic acid having a molecular weight of 1000 or lower, can be added to the composition of the invention. Specific examples of such an organic carboxylic acid include aliphatic monocarboxylic acids, such as formic acid, acetic acid, propionic acid, butyric acid, valeric acid, pivalic acid, caproic acid, diethylacetic acid, enanthic acid, and caprylic acid; aliphatic dicarboxylic acids, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acids, such as tricarballylic acid, aconitic acid, and camphoronic acid; aromatic monocarboxylic acids, such as benzoic acid, toluic acid, cuminic acid, hemellitic acid, and mesitylenic acid; aromatic polycarboxylic acids, such as phthalic acid, isophthalic acid, terephthalic acid, trimellitic acid, trimesic acid, mellophanic acid, and pyromellitic acid; and other carboxylic acids, such as phenylacetic acid, hydratropic acid, hydrocinnamic acid, mandelic acid, phenylsuccinic acid, atropic acid, cinnamic acid, cinnamylidene acetic acid, coumaric acid, and umbellic acid.

The curable composition of the present invention can be preferably used for forming color pixels of, for example, a color filter for use in a liquid crystal display element (LCD) or a solid state imaging device (e.g., CCD, CMOS, etc.), or for producing printing ink, ink jet ink, paint, or the like. In particular, the curable composition of the present invention can be preferably used for forming color pixels for solid state imaging devices, such as CCD and CMOS.

<<Color Filter and Method of Producing the Same>>

A color filter of the present invention will be described in detail with reference to a method of producing the same.

In a method of producing a color filter of the present invention, the curable composition of the present invention as stated above is used. A method of producing a color filter of the present invention includes: a step of applying the curable composition of the invention to a support by a coating method such as rotary coating, cast coating, or roll coating to form a curable composition layer, and an image formation step of exposing the formed curable composition layer to light through a specific mask pattern and then developing the composition layer by a developer to form a negative or positive colored pattern (resist pattern).

The exposure light source which can be applied to the curable composition of the present invention is a light source having a wavelength of 400 nm or less and is not particularly limited. Examples of usable light sources include lamp light sources such as a xenon lamp, a halogen lamp, a tungsten lamp, a high pressure mercury lamp, an ultrahigh pressure mercury lamp, a metal halide lamp, a moderate pressure mercury lamp, a low pressure mercury lamp, a carbon arc, and a fluorescent lamp, an Ar ion laser (364 nm, 351 nm, 10 mW to 1W), a Kr ion laser (356 nm, 351 nm, 10 mW to 1W); a solid state laser, such as a combination of Nd:YAG ($YVO_4$) and SHG crystal×2 (355 nm, 5 mW to 1W), a combination of a waveguide type wavelength changing element and AlGaAs, and a combination of a waveguide type wavelength changing element, AlGaInP, and an AlGaAs semiconductor (300 nm 350 nm, 5 mW to 100 mW); a pulse laser, such as a $N_2$ laser (337 nm, pulse 0.1 to 10 mJ), and XeF (351 nm, pulse 10 to 250 mJ). In the case of using only a specific wavelength, it is possible to use an optical filter.

Furthermore, ultraviolet rays, such as an ArF excimer laser (wavelength of 193 nm), a KrF excimer laser (wavelength of 248 nm), and i rays (wavelength of 365 nm), may be used. Ultraviolet rays are particularly preferable exposure light source from the viewpoint of cost and exposure energy, and the ultraviolet rays may be i rays, for example.

Furthermore, a curing process of further curing the formed pattern, as required, by heating and/or exposure to light may be conducted. As light or radiation used for the process, it is particularly preferable to use radiations, such as i rays.

In the method of producing a color filter of the present invention, a color filter having a desired number of hues can be formed by repeating the above-described image formation step (and optionally the curing step) in accordance with the desired number of hues in the case of a negative type and can be formed by repeating the image formation step and the curing step in accordance with the desired number of colors in the case of a positive type.

Examples of the support include supports containing soda glass, borosilicate glass, or quartz glass used for liquid crystal display elements and the like, those obtained by attaching a transparent conductive film to any of these supports, photoelectric conversion element substrates used for imaging devices and the like, such as a silicon substrate and a complementary metal oxide semiconductor (CMOS). These supports may have a black stripe formed thereon that isolates the respective pixels.

An undercoat layer may be provided on the support as required for the purpose of improving adhesion to an upper layer, preventing the diffusion of materials, and flattening the surface of the support.

Any developer may be used as the developer used in the method of producing a color filter of the invention insofar as it has a composition which dissolves portions (uncured portions in the case of a negative type) to be removed by development of the curable composition of the invention but does not dissolve the other portions (cured portions in the case of a negative type) than the portions to be removed by development. Specifically, the developer may be a combination of various organic solvents or an aqueous alkaline solution. Examples of the organic solvent include the above-mentioned solvents usable for preparing the composition of the invention.

The aqueous alkaline solution may be an aqueous alkaline solution in which an alkaline compound, such as sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, or 1,8-diazabicyclo-[5.4.0]-7-undecene is dissolved at a concentration of 0.001 mass % to 10 mass %, preferably 0.01 mass % to 1 mass %. When a developer containing such an aqueous alkaline solution is used, washing with water is generally conducted after the development.

The color filter of the invention can be used for liquid crystal elements and solid imaging elements, such as CCDs, and, for example, can be used as a color filter disposed between a light-receptor section of each constituent pixel of a CCD and a microlens for converging light. In particular, the color filter of the invention can be more preferably used for high-resolution CCD elements and CMOS elements having over 1,000,000 pixels because the use of the azo compound of the invention enables further reduction of the thickness of the color filter.

EXAMPLES

Hereinafter, the present invention will be specifically described with reference to Examples. However, the Examples should not be construed as limiting the invention. Unless otherwise specified, "part" and "%" are based on mass.

Example 1

Synthesis Examples of compounds represented by Formula (I), (II), or (III) will be described below.

Synthesis Example 1

-Synthesis of Exemplary Compounds I-1, I-2, and I-3-

Exemplary Compounds I-1, I-2, and I-3 were synthesized according to the following reaction scheme A.

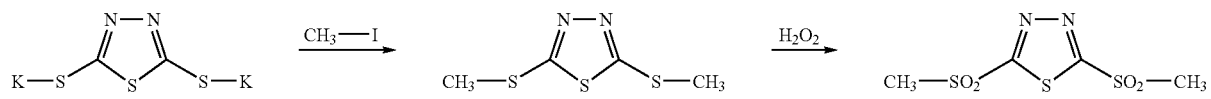
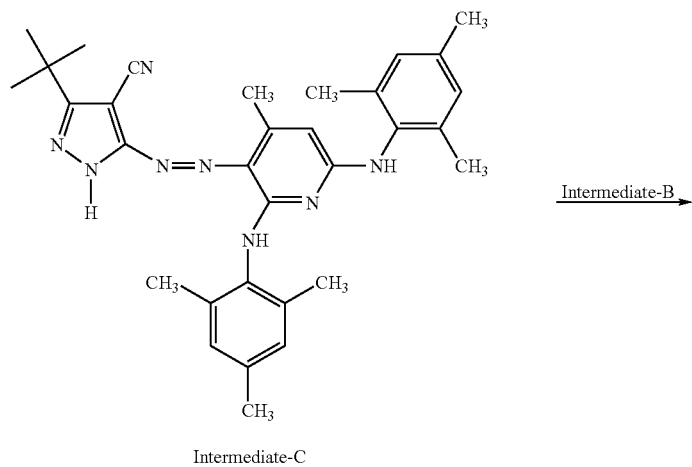
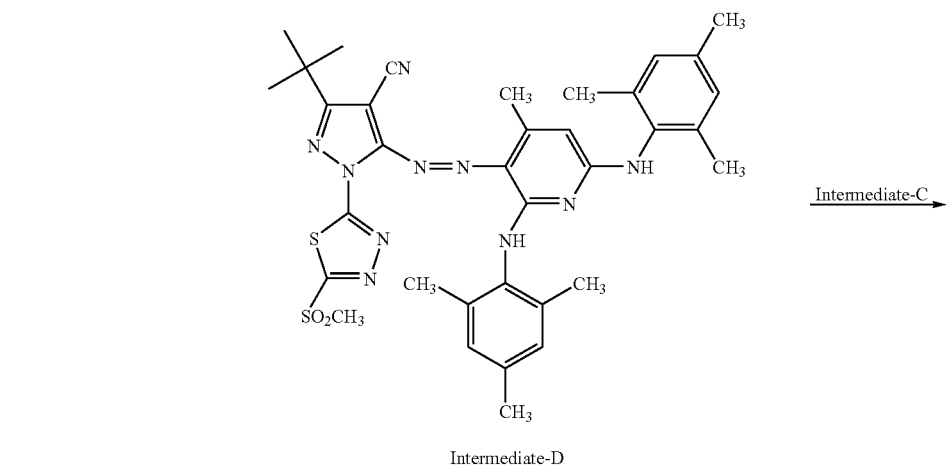
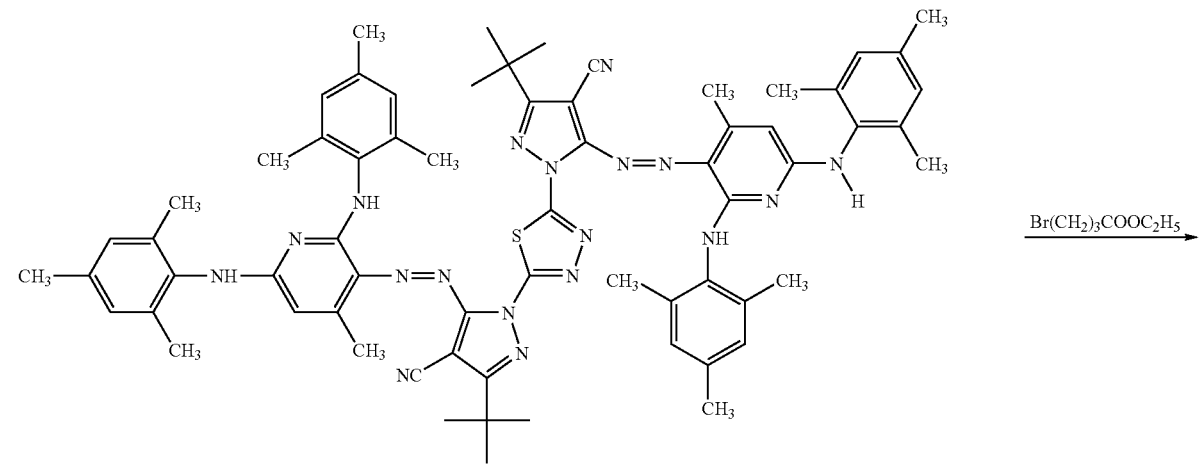

-continued

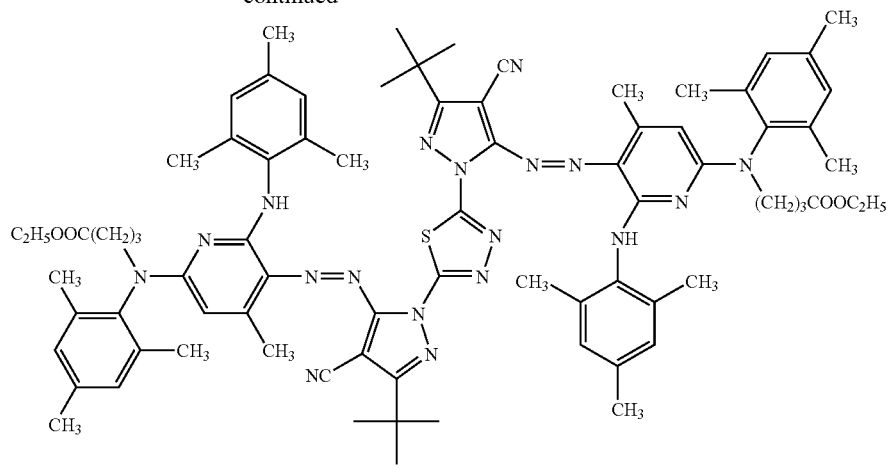

Exemplary Compound I-2

(Synthesis of Intermediate-A)

400 ml of N-methylpyrrolidine was added to 100 g (0.442 mol) of 2,5-dimercapto-1,3,4-thiadiazole-dipotassium salt. The mixture was cooled to 10° C. under a nitrogen stream, and stirred. 150.5 g (1.06 mol) of methyl iodide was added dropwise to the solution. The temperature was maintained at 10° C. to 15° C. After the completion of dropwise addition, the mixture was stirred at room temperature for 2 hours to complete the reaction 1000 ml of water and 600 ml of ethyl acetate were added to this reaction solution, followed by extraction. The ethyl acetate solution was washed with a saturated sodium chloride solution, and then dried over anhydrous magnesium sulfate. The ethyl acetate solution was condensed under reduced pressure, thereby providing 72.0 g (yield: 91.5%) of intermediate-A in the form of liquid.

(Synthesis of Intermediate-B)

1 ml of acetic acid, 2 g of sodium tungstate dihydrate, and 350 ml of ethanol were added to 68.2 g (0.383 mol) of the intermediate-A obtained by the above-described method, and the mixture was stirred and refluxed under heating. 175 g of an aqueous hydrogen peroxide solution (30%) was added dropwise to the solution. After the completion of dropwise addition, the mixture solution was refluxed and stirred under heating to complete the reaction. After the completion of the reaction, the solution was cooled to room temperature, and then 350 ml of water was added to precipitate a crystal. The crystal was separated by filtration, washed with water, and then dried, thereby providing 72.0 g (yield: 77.6%) of intermediate-B.

(Synthesis of Intermediate-D)

250 ml of sulfolane was added to 80.2 g (0.15 mol) of intermediate-C synthesized in accordance with the method described in JP-A No. 2002-371079, 45.4 g (0.188 mol) of Intermediate-B obtained by the above-described method, 41.4 g of potassium carbonate, and 26.1 g of manganese dioxide. The obtained mixture was heated to a temperature of from 40° C. to 50° C., and stirred. The stirring under heating was performed for 12 hours to complete the reaction. 250 ml of acetonitrile was added to the reaction solution. Then, the mixture solution was stirred at room temperature, and filtered to separate insoluble matter. The filtrate was poured, with stirring, into an aqueous solution in which a 35% hydrochloric acid aqueous solution was diluted with 3000 ml of water, so as to precipitate a crystal. The crystal was separated by filtration, washed with water, and then dried. 800 ml of ethyl acetate was added to the crystal, and then stirred, so as to disperse and wash the crystal. The crystal was separated by filtration, and then dried. 84.0 g (yield: 80.4%) of Intermediate-D was obtained.

(Synthesis of Exemplary Compound I-1)

100 ml of N-methylpyrrolidone was added to 20.9 g (0.03 mol) of Intermediate-D obtained by the above-described method, 16.0 g (0.03 mol) of Intermediate-C obtained by the above-described method, and 8.28 g (0.06 mol) of potassium carbonate. The obtained mixture was heated to a temperature of from 95° C. to 98° C., and then stirred for 8 hours. After the completion of the reaction, the reaction solution was poured, with stirring, into 1500 ml of water. Subsequently,35% hydrochloric acid aqueous solution was added to adjust the pH to 3, so as to precipitate a crystal. The crystal was separated by filtration, washed with water, and then dried. The crystal was purified by silica gel column chromatography (eluent: n-hexane/ethyl acetate=4/1). The eluate was condensed and dried under reduced pressure, thereby providing 31.0 g (yield: 89.9%) of Exemplary Compound I-1.

The maximum absorption wavelength ($\lambda$max) in an ethyl acetate solution was 516.3 nm, and the molar extinction coefficient ($\epsilon$) at the maximum absorption wavelength was 54200.

(Synthesis of Exemplary Compound I-2)

120 ml of N-methylpyrrolidone was added to 26.0 g (0.0226 mol) of Exemplary Compound I-1 obtained by the above-described method, 13.2 g (0.0678 mol) of 4-bromobutanoic acid ethyl ester, and 15.6 g (0.113 mol) of potassium carbonate. The obtained mixture was heated to a temperature of from 80° C. to 85° C., and stirred for 5 hours. After the completion of the reaction, the reaction solution was poured, with stirring, into 2000 ml of water, so as to precipitate a crystal. The crystal was separated by filtration, washed with water, and then dried. The crystal was purified by being recrystallized from 750 ml of methanol. 27.9 g (yield: 75.2%) of Exemplary Compound I-2 was obtained.

The melting point was within a range of from 200° C. to 203° C. In an ethyl acetate solution, the $\lambda$max was 520.3 nm and $\epsilon$ was 85400.

$^1$H-NMR(CDCl$_3$)$\delta$6.94(s,4H), 6.79(s,4H), 5.52(s,2H), 4.05(q,4H), 3.39-3.25(br,4H), 2.41(s,6H), 2.32(s,6H), 2.07 (s,22H), 1.67(s,9H), 1.58(s,3H), 1.47(s,18H), 1.22(t,6H).

(Synthesis of Exemplary Compound I-3)

80 ml of tetrahydrofuran and 80 ml of 2-propanol were added to 26.5 g (0.0192 mol) of Exemplary Compound I-2 obtained by the above-described method. The mixture was stirred at room temperature. An aqueous solution in which 6.45 g (0.154 mol) of lithium hydroxide monohydrate was dissolved in 70 ml of water was added thereto. The mixture was stirred at room temperature for 10 hours, so as to perform hydrolysis After the completion of the reaction, the reaction solution was poured, with stirring, into an aqueous dilute hydrochloric acid aqueous solution obtained by adding 20 ml of 35% hydrochloric acid aqueous solution to 2000 ml of water, so as to precipitate a crystal. The crystal was separated by filtration, washed with water, and then dried. The crystal was purified by being recrystallized from 150 ml of ethyl acetate, thereby providing 17.1 g (yield: 67.3%) of Exemplary Compound I-3.

The melting point was within a range of from 246° C. to 248° C. In an ethyl acetate solution, the λmax was 520.1 nm and ε was 84000.

$^1$H-NMR(CDCl$_3$)δ6.95(s,4H), 6.78(s,6H), 5.50(s,2H), 3.40-3.25(br,4H), 2.39(s,6H), 2.31(s,6H), 2.20(s,4H), 2.05(s, 25H), 1.78-1.58(br,9H), 1.57(s,18H).

Example 2to Synthesis Example 4

Following procedures similar to the above-described Synthesis Example 1, Exemplary Compounds I-4, I-5, and I-6 were respectively synthesized. The λmax and ε in an ethyl acetate solution are shown below.

| (Exemplary Compound I-4) | λmax = 517.1 nm | ε = 81000 |
| (Exemplary Compound I-5) | λmax = 520.3 nm | ε = 82500 |
| (Exemplary Compound I-6) | λmax = 520.3 nm | ε = 82500 |

Synthesis Example 5

-Synthesis of Exemplary Compound IIb-1-

Exemplary Compound IIb-1 was synthesized according to the following reaction scheme B.

Reaction Scheme B

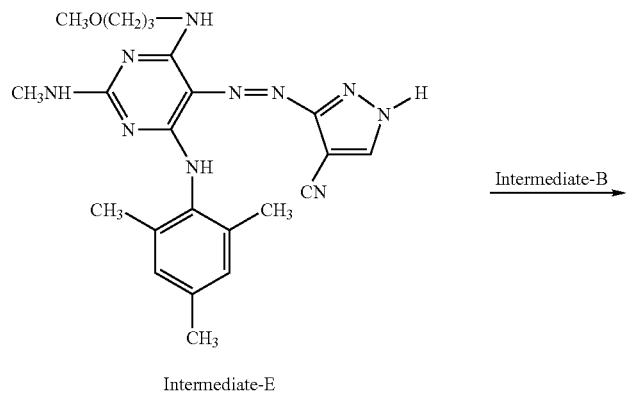

Intermediate-E

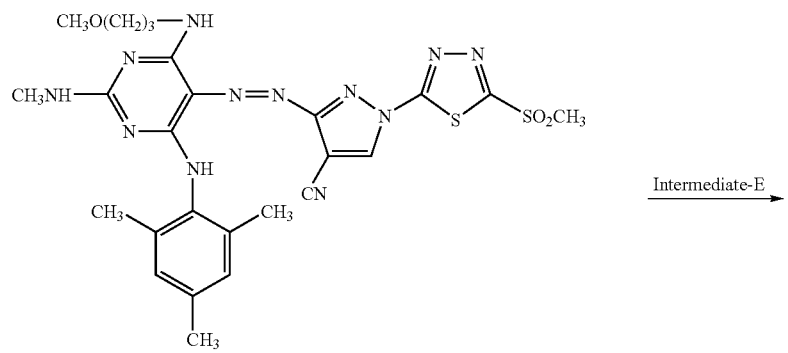

Intermediate-F

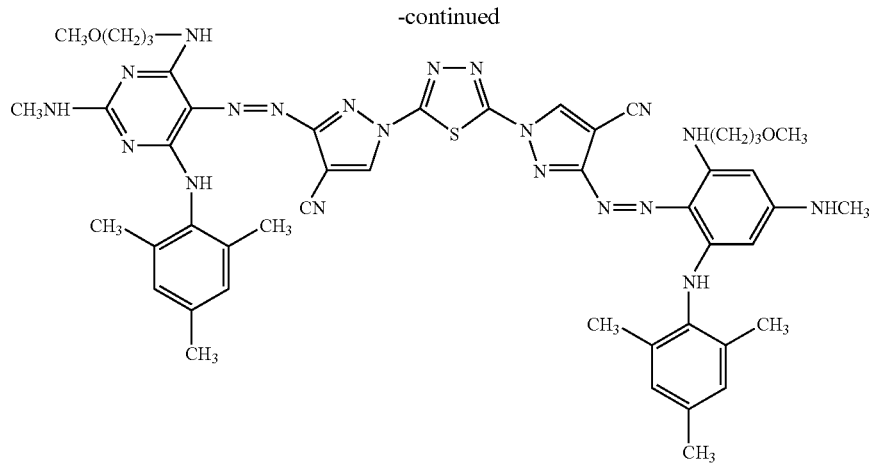

Intermediate-IIb-1

50 ml of N-methylpyrrolidone was added to 8.72 g (0.036 mol) of Intermediate-B synthesized according to the above-described method of Synthesis Example 1, 13.5 g (0.03 mol) of Intermediate-E synthesized according to the method disclosed in JP-A No. 2007-39478, 5.0 ml of triethylamine, and 4.0 g of manganese dioxide. The obtained mixture was stirred at room temperature for 7 hours. After the completion of the reaction, the reaction solution was filtered to remove insoluble matter. The filtrate was poured, with stirring, into an aqueous dilute hydrochloric acid aqueous solution obtained by diluting 35% hydrochloric acid aqueous solution with 500 ml of water, so as to precipitate a crystal. The crystal was separated by filtration, washed with water, and then dried. The crystal was purified by being recrystallized from 450 ml of acetonitrile, thereby providing 16.0 g (yield: 87.4%) of Intermediate-F.

(Synthesis of Exemplary Compound IIb-1)

5 g of sodium hydrogen carbonate and 50 ml of N-methylpyrrolidone were added to 9.2 g (0.015 mol) of Intermediate-F obtained by the above-described method and 6.73 g (0.015 mol) of Intermediate-E obtained by the above-described method. The obtained mixture was heated to a temperature of from 40° C. to 50° C., and stirred for 8 hours. After the completion of the reaction, the reaction solution was poured, with stirring, into 500 ml of water, so as to precipitate a crystal. The crystal was filtered, washed with water, and then dried. The crystal was purified by being recrystallized from 200 ml of acetone, thereby providing 10.8 g (yield: 73.5%) of Exemplary Compound IIb-1.

The melting point was within a range of from 276° C. to 280° C. In an ethyl acetate solution, the λmax was 462.7 nm and ε was 83300.

Synthesis Examples 6 to 8

-Synthesis of Exemplary Compounds IIIa-1, IIIa-2, and IIIa-3-

Exemplary Compounds IIIa-1, IIIa-2, and IIIa-3 were synthesized according to the following reaction scheme C.

Reaction Scheme C

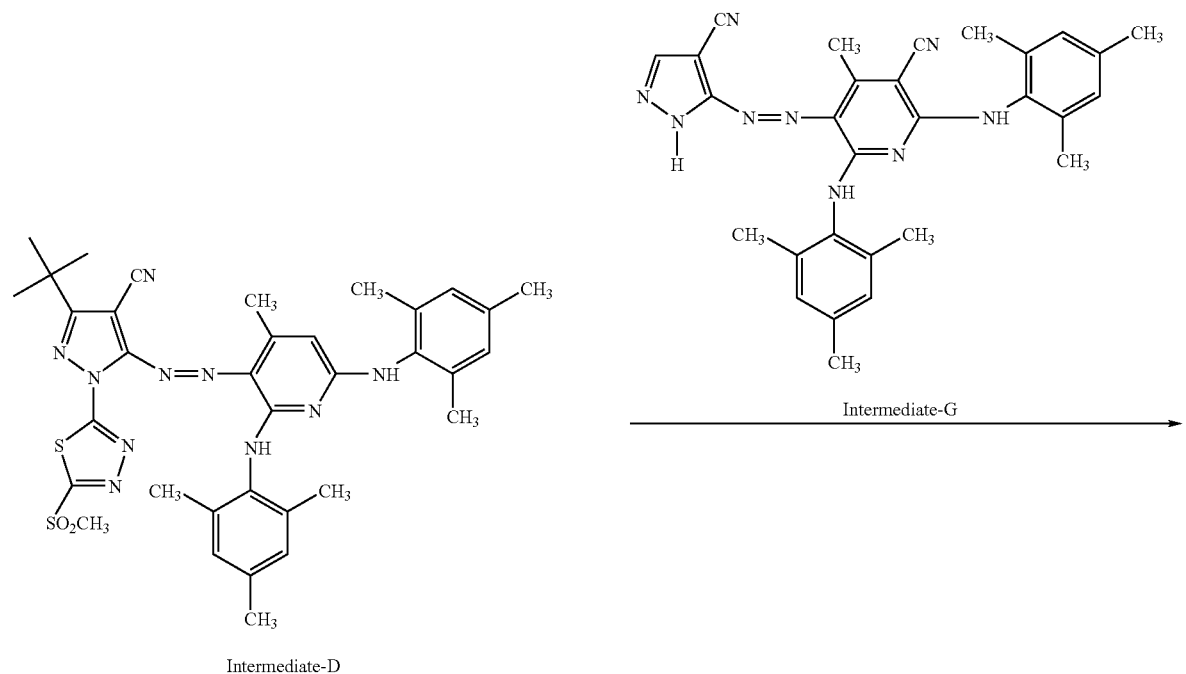

Intermediate-D

Intermediate-G

-continued
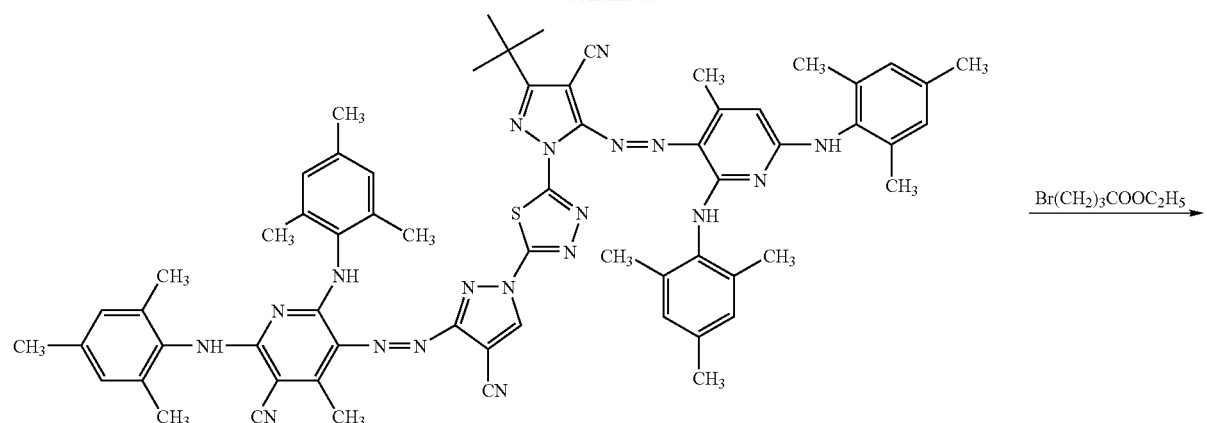
Exemplary Compound IIIa-1
Br(CH₂)₃COOC₂H₅ →
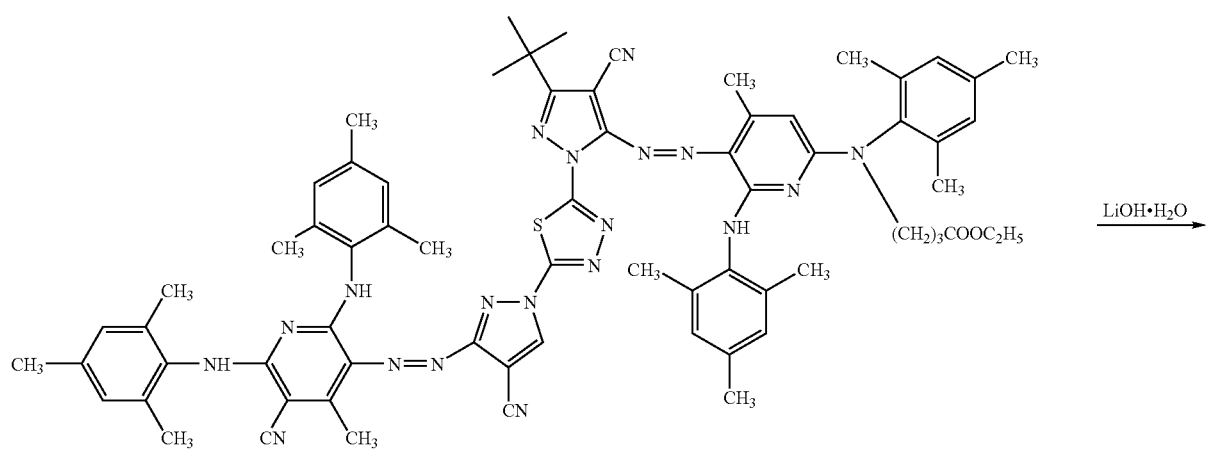
Exemplary Compound IIIa-2
LiOH·H₂O →
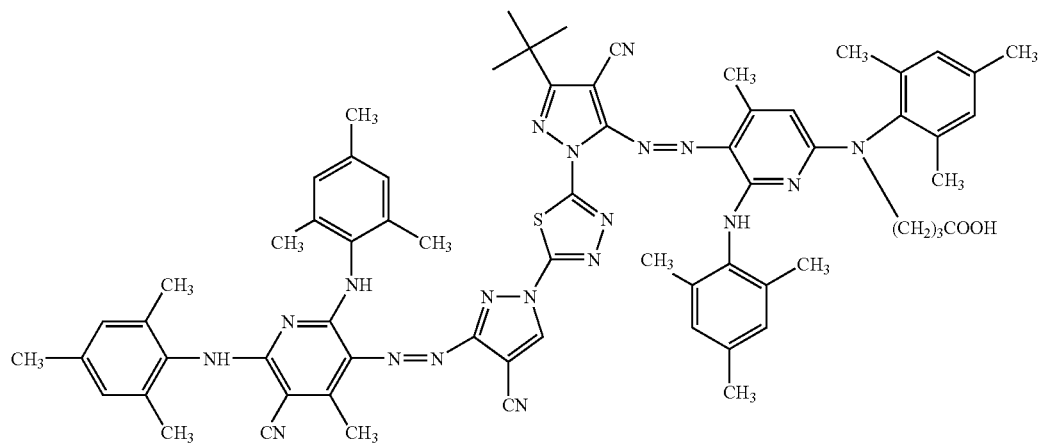
Exemplary Compound IIIa-3

(Synthesis of Exemplary Compound IIIa-1)

50 ml of dimethylacetamide was added to 5.04 g (0.01 mol) of Intermediate-G synthesized according to the method disclosed in JP-A No. 2007-31616, 6.97 g (0.01 mol) of Intermediate-D obtained by the above-described method of Synthesis Example 1, and 2.52 g of sodium hydrogen carbonate. The obtained mixture was heated to a temperature of from 75° C. to 80° C., and stirred for 5 hours. After the completion of the reaction, the reaction solution was poured, with stirring, into an aqueous dilute hydrochloric acid aqueous solution obtained by diluting 5.0 ml of 35% hydrochloric acid aqueous solution with 500 ml of water, and then 200 ml of ethyl acetate was added, followed by extraction. The ethyl acetate solution was washed with a saturated sodium chloride solution, and then dried over anhydrous magnesium sulfate. The ethyl acetate solution was condensed under reduced pressure, and the residue was purified by silica gel column chromatography (eluent: n-hexane/ethyl acetate=4/1). The eluate was condensed, and 200 ml of acetonitrile was added to the residue, so as to precipitate a crystal. The crystal was separated by filtration, and then dried, thereby providing 7.7 g (yield: 68.8%) of Exemplary Compound IIIa-1.

The melting point was within a range of from 268° C. to 270° C. In an ethyl acetate solution, the λmax was 537.5 nm and ε was 61100.

(Synthesis of Exemplary Compound IIIa-2)

150 ml of N-methylpyrrolidone was added to 11.2 g (0.01 mol) of Exemplary Compound IIIa-1 obtained by the above-described method, 2.34 g (0.012 mol) of 4-bromobutanoic acid ethyl ester, 4.15 g of potassium carbonate, and 2 g of tetrabutyl ammonium bromide. The obtained mixture was heated to a temperature of from 75° C. to 85° C., and stirred for 5 hours. After the completion of the reaction, the reaction solution was poured, with stirring, into 1000 ml of water, so as to precipitate a crystal. The crystal was separated by filtration, washed with water, and then dried. The crystal was purified by being recrystallized from 300 ml of acetonitrile, thereby providing 9.1 g (yield: 73.7%) of Exemplary Compound IIIa-2.

The melting point was within a range of from 216° C. to 218° C. In an ethyl acetate solution, the λmax was 542.4 nm and ε was 68500.

(Synthesis of Exemplary Compound IIIa-3)

55 ml of 2-propanol and 25 ml of tetrahydrofuran were added to 5.5 g of (0.0045 mol) of Exemplary Compound IIIa-2 obtained by the above-described method. The mixture was stirred at room temperature. To this dispersion liquid, an aqueous solution in which 0.93 g of lithium hydroxide monohydrate was dissolved in 10 ml of water was added. The obtained liquid was stirred at room temperature for 8 hours to hydrolyze ester groups. The reaction solution was poured, with stirring, into an aqueous solution in which 5 ml of 35% hydrochloric acid was diluted with 700 ml of water, so as to precipitate a crystal. The crystal was separated by filtration, washed with water, and then dried. The crystal was purified by being recrystallized from a mixed solvent of 200 ml of acetonitrile and 50 ml of ethyl acetate, thereby providing 4.1 g (yield: 76.4%) of Exemplary Compound IIIa-3.

The melting point was within a range of from 277° C. to 278° C. In an ethyl acetate solution, the λmax was 542.6 nm and ε was 68700.

$^1$H-NMR(CDCl$_3$)δ11.5(br,1h), 8.62(s,1H), 7.02-6.94(br, 4H), 6.78(s, 1H), 6.63(s,4H), 5.54(s,1H), 3.45-3.30(br,2H), 2.90(s,3H), 2,42(s,3H), 2.38(s,3H), 2.33(s,3H), 2.26(s,6H), 2.20(s,6H), 2.09(s,6H), 1.92(s,6H), 1.84(s,6H), 1.75(br,4H), 1.45(s,9H).

Synthesis Examples 9 to 10

-Synthesis of Exemplary Compounds IIIb-3 and IIIb-8-

Exemplary Compounds IIIb-3 and IIIb-8 were synthesized according to the following reaction scheme D.

Reaction Scheme D

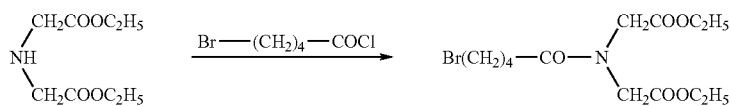

Intermediate-H

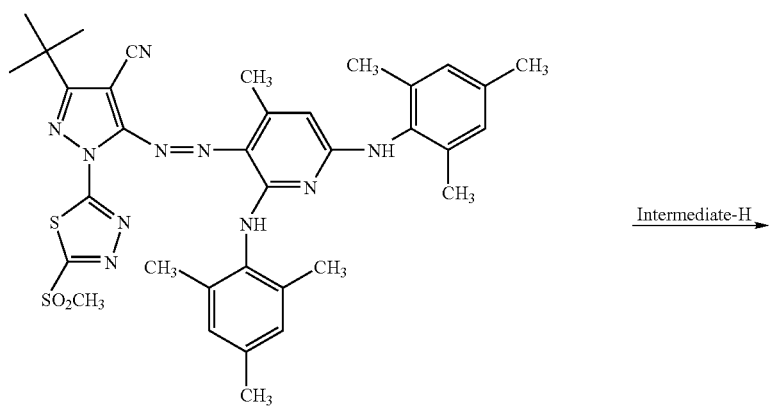

Intermediate-D

Intermediate-H

-continued
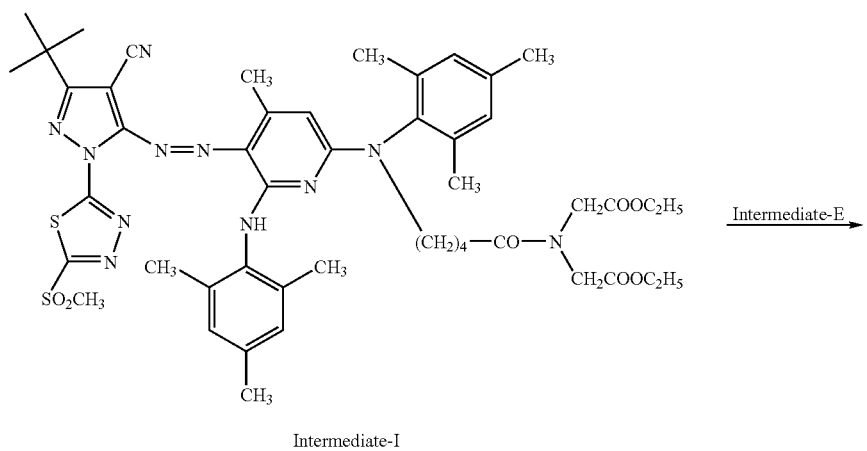
Intermediate-I → Intermediate-E
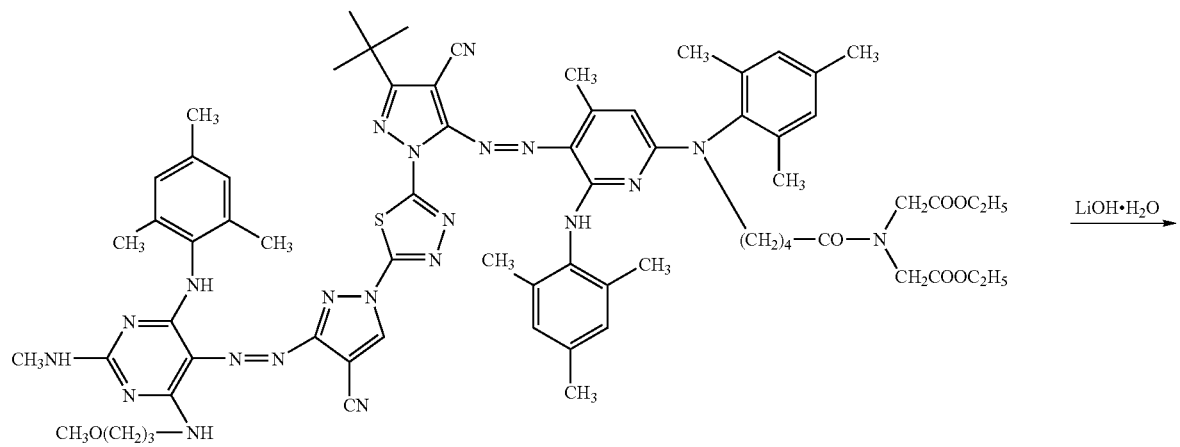
Exemplary Compound IIIb-3 → LiOH·H₂O
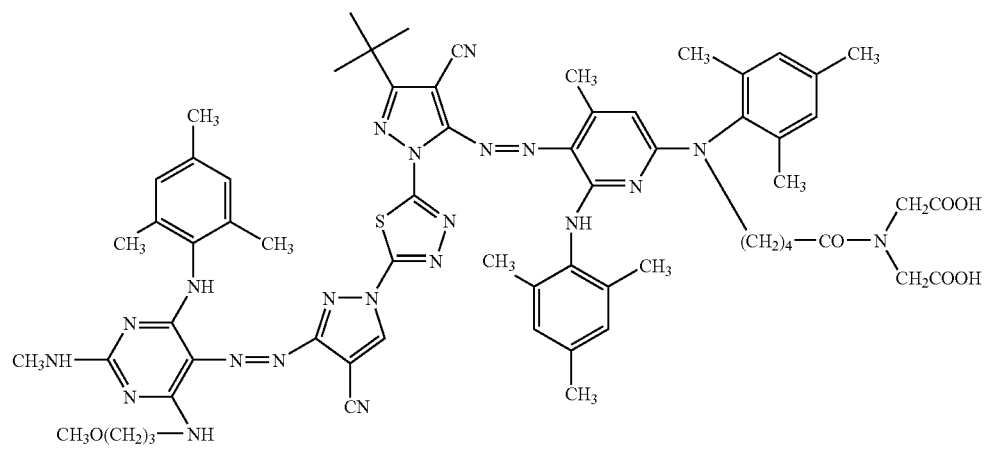
Exemplary Compound IIIb-8

(Synthesis of Exemplary Compound IIIb-3)
(Synthesis of Intermediate-H)

150 ml of acetonitrile was added to 28.5 g (0.15 mol) of iminodiacetic acid diethyl ester. The mixture was cooled to 0° C. to 5° C., and stirred. To the solution, 25.0 g (0.125 mol) of 5-bromo pentanoic acid chloride was added dropwise. The reaction temperature was maintained at 5° C. or lower. After the completion of dropwise addition, 17.5 ml of triethylamine was then added dropwise. The reaction temperature was maintained at 5° C. or lower. After the completion of dropwise addition, the mixture was stirred at room temperature for 2 hours to complete the reaction. The reaction solution was poured, with stirring, into 500 ml of water, and, subsequently the pH was adjusted to 3 to 5 with 35% hydrochloric acid aqueous solution. Subsequently, 300 ml of ethyl acetate was added, followed by extraction. The ethyl acetate solution was washed with saturated sodium chloride solution, and then dried over anhydrous magnesium sulfate. The ethyl acetate solution was condensed under reduced pressure, thereby providing 43.0 g (yield; 97.7%) of Intermediate-H in the form of oil.

(Synthesis of Intermediate-I)

70 ml of dimethyl sulfoxide was added to 13.9 g of (0.02 mol) of Intermediate-D, 5,52 g of potassium carbonate, 3,27 g of tetrabutyl ammonium bromide, and 6.91 g (0.026 mol) of Intermediate-H obtained by the above-described method. The obtained mixture was heated to a temperature of from 45° C. to 50° C., and stirred for 6 hours. After the completion of the reaction, the reaction solution was poured, with stirring, into 800 ml of water, so as to precipitate a crystal. Subsequently, 35% hydrochloric acid aqueous solution was added to adjust the pH to 2 to 4. The precipitated crystal was filtered, washed with water, and then dried. The crystal was purified by being recrystallized from 300 ml of acetonitrile, thereby providing 10.5 g (yield: 56.8%) of Intermediate-I.

(Synthesis of Exemplary Compound IIIb-3)

75 ml of N-methylpyrrolidone was added to 15.0 g (0.0155 mol) of Intermediate-I obtained by the above-described method, 6.95 g (0.0155 mol) of Intermediate-E obtained by the above-described method, and 3.91 g of sodium hydrogen carbonate. The obtained mixture was heated to a temperature of from 70° C. to 80° C., and then stirred for 5 hours. After the completion of the reaction, the reaction solution was poured, with stirring, into 1500 ml of water, so as to precipitate a crystal. The crystal was separated by filtration, washed with water, and then dried. The crystal was purified by silica gel column chromatography (eluent: n-hexane/ethyl acetate=2/1). The eluate was condensed, and 200 ml of acetonitrile was added to the residue, so as to precipitate a crystal. The crystal was separated by filtration, and then dried to obtain 10.2 g (yield: 49.3%) of Exemplary Compound IIIb-3.

The melting point was within a range of from 173° C. to 175° C. In an ethyl acetate solution, the λmax was 542.8 nm and ε was 65700.

$^1$H-NMR(CDCl$_3$)δ8.55(d,1H), 7.03-6.85(m,7H), 5.55(s,1H), 5.49-5.20(br,1H), 4.30-4.04(m,8H), 3.85-3.65(m,2H), 3.60-3.48(m,2H), 3.46(s,1H), 3.40-3.25(m,2H), 2.98(t,2H) 2.83(br,1H), 2.41 (s,3H), 2.38-2.27(m,9H), 2.25-2.13 (m,12H), 2.12-1.94(m,9H), 1.65(s,4H)1.50(s,3H), 1.45(s,6H), 1.38-1.18(m,6H), 1.15-1.00(br,3H).

(Synthesis of Exemplary Compound IIIb-8)

130 ml of 2-propanol was added to 9.0 g (0.00673 mol) of Exemplary Compound IIIb-3 obtained by the above-described method. The mixture was stirred at room temperature. To the dispersion liquid, an aqueous solution in which 1.68 g of lithium hydroxide monohydrate was dissolved in 20 ml of water was added. After the completion of addition, the mixture was stirred at room temperature for 1.5 hours to complete the hydrolysis of ester groups. The reaction solution was poured, with stirring, into an aqueous solution obtained by diluting 35% hydrochloric acid aqueous solution with 700 ml of water, so as to precipitate a crystal. To the dispersion liquid, 300 ml of ethyl acetate was added, followed by extraction.

The ethyl acetate solution was washed with a saturated sodium chloride solution, and dried over anhydrous sodium sulfate. Subsequently, the ethyl acetate solution was condensed under reduced pressure, so as to precipitate a crystal. The precipitated crystal was separated by filtration, and dried, thereby providing 7.6 g (yield: 88.2%) of Exemplary Compound IIIb-8.

The melting point was within a range of from 223° C. to 229° C. In an ethyl acetate solution, the λmax was 542.9 nm and ε was 63500.

$^1$H-NMR(CDCl$_3$)δ8.65(m,1H), 7.05-6.80(m,6H), 5.53 (s, 1H), 4.00-3.85(br,4H), 3.85-3.40(m,7H), 3.30(br,4H), 3.00-2.88(m,2H), 2.80-2.60(m,2H)2.45-1.84(m,35H), 1.52-1.30 (m, 11H), 1.05(br, 3H).

Synthesis Examples 11 to 19

The following Exemplary Compounds were respectively synthesized following procedures similar to that employed in Synthesis Example 9. The λmax and ε in an ethyl acetate solution are shown below.

| | | |
|---|---|---|
| (Exemplary Compound IIIb-4) | λmax = 542.8 nm | ε = 65200 |
| (Exemplary Compound IIIb-5) | λmax = 542.9 nm | ε = 65300 |
| (Exemplary Compound IIIb-7) | λmax = 543.0 nm | ε = 59000 |
| (Exemplary Compound IIIb-9) | λmax = 542.8 nm | ε = 64000 |
| (Exemplary Compound IIIb-10) | λmax = 542.9 nm | ε = 64200 |
| (Exemplary Compound IIIb-11) | λmax = 543.1 nm | ε = 60100 |
| (Exemplary Compound IIIb-12) | λmax = 542.4 nm | ε = 59300 |
| (Exemplary Compound IIIb-13) | λmax = 542.4 nm | ε = 61600 |
| (Exemplary Compound IIIb-14) | λmax = 542.9 nm | ε = 64200 |
| (Exemplary Compound IIIb-15) | λmax = 541.9 nm | ε = 58700 |

Synthesis Examples 20 to 23

-Synthesis of Exemplary Compounds IIIb-16, IIIb-17, IIIb-25, and IV-28-

Exemplary Compounds IIIb-16, IIIb-17, IIIb-25, and IV-28 were synthesized according to the following reaction scheme E.

Reaction Scheme E
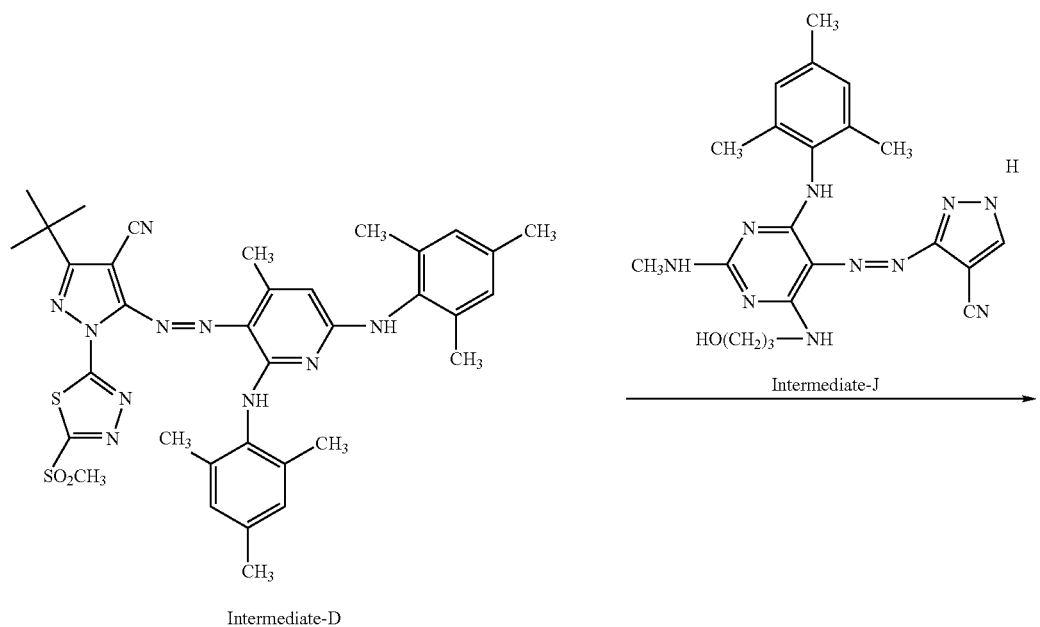
Intermediate-D
Intermediate-J
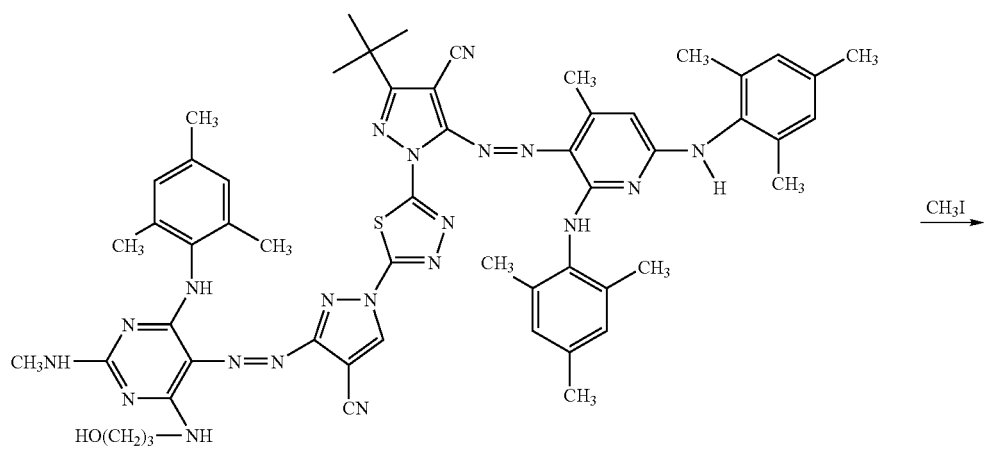
Exemplary Compound IIIb-16
CH₃I
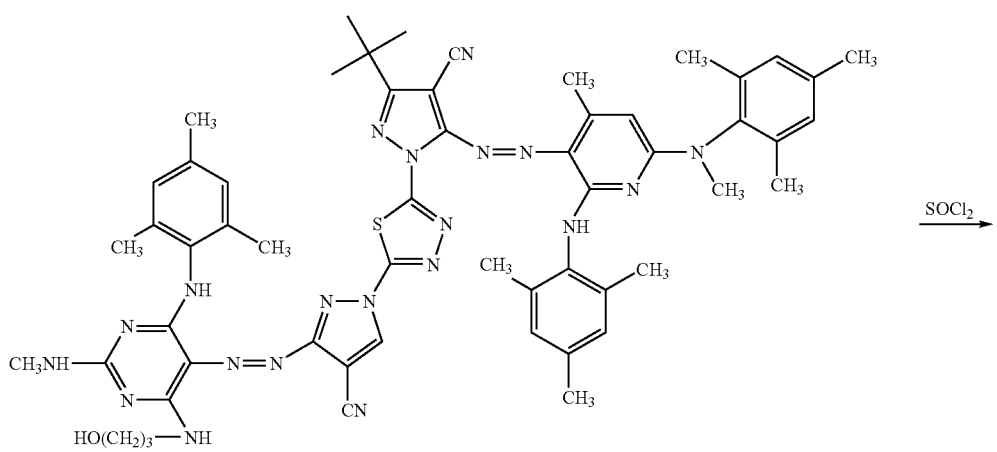
Exemplary Compound IIIb-17
SOCl₂

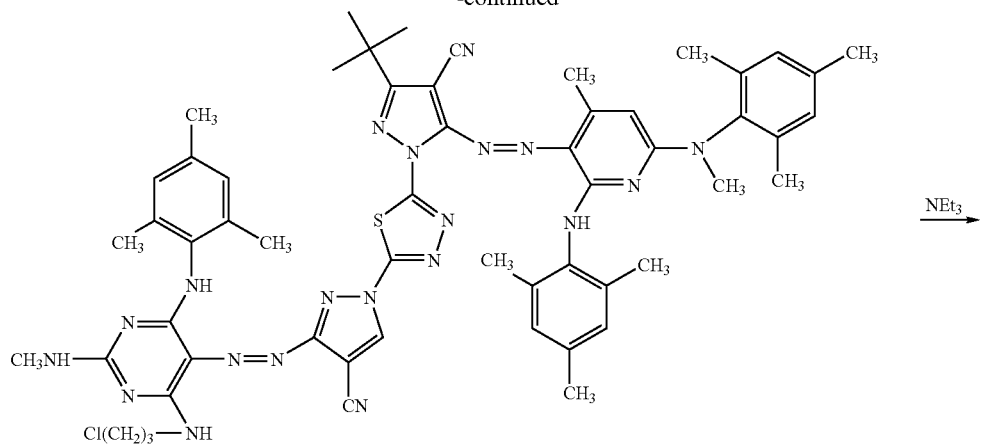

Exemplary Compound IIIb-25

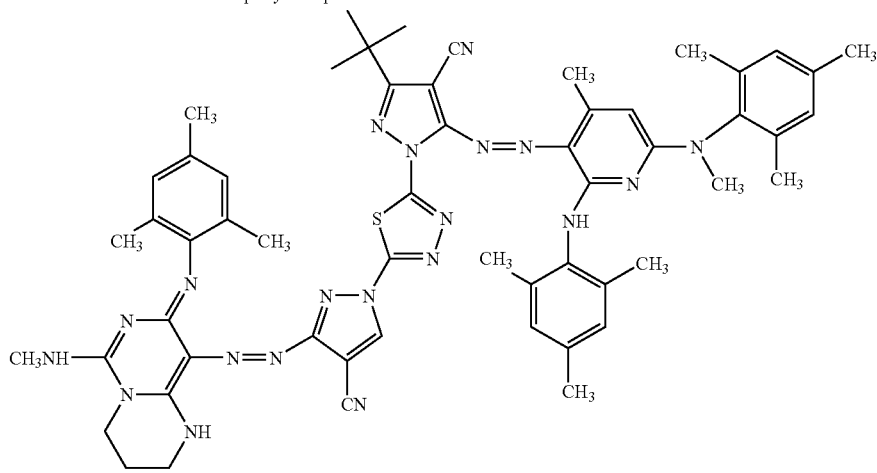

Exemplary Compound IIIb-28

(Synthesis of Exemplary Compound IIIb-16)

35 ml of N-methylpyrrolidone was added to 6.97 g (0.01 mol) of Intermediate-D, 4.5 g (0.01 mol) of Intermediate-J synthesized according to the method described in JP-A No. 2007-39478, and 2.52 g of sodium hydrogen carbonate. The obtained mixture was heated to a temperature of from 80° C. to 85° C., and stirred for 6 hours. After the completion of the reaction, the reaction solution was poured, with stirring, into 1000 ml of water, so as to precipitate a crystal. The crystal was separated by filtration, washed with water, and dried. The crystal was purified by silica gel column chromatography (eluent: n-hexane/ethyl acetate=1/1). The eluate was condensed, and 10 ml of ethyl acetate and 100 ml of acetonitrile were added to the residue, so as to precipitate a crystal. The crystal was separated by filtration, and dried, thereby providing 6.0 g (yield: 57.1%) of Exemplary Compound IIIb-16. The melting point was within a range of from 238° C. to 242° C.

In an ethyl acetate solution, the λmax was 537.5 nm and ε was 56800.

(Synthesis of Exemplary Compound IIIb-17)

50 ml of dimethyl sulfoxide was added to 6.0 g (0.00571 mol) of Exemplary Compound IIIb-16 obtained by the above-described method and 2.4 g of potassium carbonate. The obtained mixture was heated to a temperature of from 45° C. to 50° C., and stirred. 1.62 g (0.0114 mol) of methyl iodide was added dropwise to the solution. After the completion of dropwise addition, the mixture was heated to a temperature of from 35° C. to 40° C., and then stirred for 7 hours to complete the reaction. After the completion of the reaction, the reaction solution was poured, with stirring, into 600 ml of water, so as to precipitate a crystal. The crystal was separated by filtration, washed with water, and dried. The crystal was purified by being recrystallized from a mixed solvent of ethyl acetate and acetonitrile (mixing ratio: ethyl acetate/acetonitrile=1/4), thereby providing 5.3 g (yield: 87.2%) of Exemplary Compound IIIb-17.

In an ethyl acetate solution, the λmax was 540.9 nm and ε was 59200.

(Synthesis of Exemplary Compound IIIb-25)

60 ml of acetonitrile was added to 6.0 g (0.00563 mol) of Exemplary Compound IIIb-17 obtained by the above-described method, and stirred at room temperature. 5.0 ml of thionyl chloride was added dropwise to the dispersion liquid. After the completion of dropwise addition, the mixture was stirred at room temperature for 5 hours to complete the reaction. The reaction solution was poured, with stirring, into 700 ml of water, and subsequently, sodium hydrogen carbonate was added to neutralize the solution, so as to precipitate a crystal. The crystal was separated by filtration, washed with water, and dried. The crystal was purified by being recrystallized from a mixed solvent of n-hexane and ethyl acetate (mixing ratio: n-hexane/ethyl acetate=4/1), thereby providing 4.1 g (yield: 67.2%) of Exemplary Compound IIIb-25. The melting point was within a range of from 259° C. to 265° C.

In an ethyl acetate solution, the λmax was 541.5 nm and ε was 58700.

(Synthesis of Exemplary Compound IV-28)

15 ml of dimethylacetamide was added to 3.4 g (0.00314 mol) of Exemplary Compound IIIb-25 obtained by the above-described method. The mixture was heated to a temperature of from 80° C. to 100° C. Subsequently, 1.0 ml of triethylamine was added dropwise. The mixture was further heated to a temperature of from 85° C. to 100° C., and stirred for 5 hours. After the completion of the reaction, the reaction solution was poured, with stirring, into 500 ml of water, so as to precipitate a crystal. This crystal was filtered washed with water, and then dried. The crystal was purified by being recrystallized from 100 ml of acetonitrile, thereby providing 2.9 g (yield: 88.1%) of Exemplary Compound IV-28.

The melting point was within a range of from 270° C. to 273° C. In an ethyl acetate solution, the λmax was 542.1 nm and ε was 53700.

$^1$H-NMR(CDCl$_3$)δ11.40(s,1H), 10.40(br,1H), 8.66(s,1H), 7.00-6.90(m,7H), 5.60(s,1H), 4.54(br,2H), 3.65(br,2H), 3.20-2.95(m,13H), 2.88(br,3H), 2.48-2.27(m,13H), 2.26-2.07(m,9H), 1.45(s,9H).

According to the reaction scheme mentioned above, the following Exemplary Compounds were respectively synthesized. Then, the molar extinction coefficient of each compound in an ethyl acetate solution was measured (spectrophotometer UV-2400PC (manufactured by Shimadzu Corporation)). The maximum absorption wavelength (λmax) and the molar extinction coefficient (ε) at the maximum absorption wavelength are shown in Table 1.

TABLE 1

| Exemplary Compound | Maximum absorption wavelength (λmax) (nm) | Molar extinction coefficient (ε) |
|---|---|---|
| I-1 | 516.3 | 54200 |
| I-2 | 520.3 | 85400 |
| I-3 | 520.1 | 84000 |
| I-4 | 517.1 | 81000 |
| I-5 | 52.0 | 82500 |
| I-6 | 520.3 | 82500 |
| IIb-1 | 452.7 | 83300 |
| IIIa-1 | 537.5 | 61100 |
| IIIa-2 | 542.4 | 68500 |
| IIIa-3 | 542.6 | 68700 |
| IIIa-17 | 542.8 | 66700 |
| IIIb-2 | 542.6 | 64900 |
| IIIb-3 | 542.8 | 65700 |
| IIIb-4 | 542.8 | 65200 |
| IIIb-5 | 542.9 | 65300 |
| IIIb-7 | 543.0 | 59000 |
| IIIb-8 | 542.9 | 63500 |
| IIIb-9 | 542.8 | 64000 |
| IIIb-10 | 542.9 | 64200 |
| IIIb-11 | 543.1 | 60100 |
| IIIb-12 | 542.2 | 59300 |
| IIIb-13 | 542.4 | 61600 |
| IIIb-14 | 541.9 | 58600 |
| IIIb-15 | 541.9 | 58700 |
| IIIb-16 | 537.5 | 56800 |
| IIIb-17 | 540.9 | 59200 |
| IIIb-18 | 542.4 | 63500 |
| IIIb-20 | 542.2 | 63700 |
| IIIb-23 | 542.8 | 62800 |
| IIIb-25 | 541.5 | 58700 |
| IV-28 | 542.1 | 58700 |

Next, a curable composition using the compound of the present invention, a color filter using the composition, and a method of producing the same will be described.

Example 2

1) Preparation of Resist Solution.

The composition shown below was mixed and dissolved to prepare a resist solution.

| | |
|---|---|
| Propylene glycol monomethyl ether acetate (PGMEA) | 5.20 parts |
| Cyclohexanone | 52.6 parts |
| Binder: (Benzyl methacrylate/methacrylic acid/methacrylic acid-2-hydroxyethyl) copolymer (41% of EL solution, molar ratio = 60:20:20) | 30.5 parts |
| Dipentaerythritol hexaacrylate | 10.2 parts |
| Polymerization inhibitor (p-methoxyphenol) | 0.006 part, |
| Fluorochemical surfactant (F475, manufactured by DIC Corporation) | 0.80 part, |
| Photoinitiator TAZ-107 (Manufactured by Midori Kagaku Co., Ltd.) | 0.58 part |

It should be noted that EL represents an ethyl lactate.

Preparation of a Glass Substrate Having an Undercoat Layer

A glass substrate (Corning 1737) was subjected to ultrasonic cleaning with an aqueous 0.5% NaOH solution, washed, and dehydration baked (200° C./20 minutes).

Subsequently, the resist solution obtained in 1) above was applied to the cleaned glass substrate using a spin coater such that the film thickness became 0.6 µm. The film was dried by heating at 220° C. for 1 hour to obtain a cured film (an undercoat layer).

(3) Preparation of a Color Resist Solution (a Curable Composition A-1 [Negative Type])

The resist solution (9.4 g) obtained in 1) above and 1.0 g of the previously-mentioned Exemplary compound I-1, which is an azo compound of the present invention, were mixed and dissolved to obtain a color resist solution (a solution of a curable composition A-1 [negative type]).

4) Formation of a Resist Layer

The color resist solution obtained in 3) above was applied, using a spin coater, to the undercoat layer of the glass substrate having the undercoat layer obtained in 2) above such that the film thickness became 1.0 µm. The film was prebaked at 100° C. for 120 seconds to obtain a color filter.

C) Evaluation

The storage stability of the curable composition A-1 prepared above and the heat resistance and light fastness of the coating film applied to the glass substrate were evaluated as follows. The results are shown in Table 2.

<Storage Stability>

The curable composition A-I was stored at room temperature for 1 month. Then, the degree of precipitation was visually observed, and evaluated in accordance with the following criteria.

-Criteria-

A: No precipitation was observed.
B: Precipitation was slightly observed.
C: Precipitation was observed.

<Heat Resistance>

The glass substrate to which the curable composition A-1 was applied was heated on a hot plate at 200° C. for 1 hour. Then, the ΔEab value of the color difference between before and after the heat resistance test was measured with a chromoscope MCPD-1000 (manufactured by Otsuka Electronics Co., Ltd.), and evaluated in accordance with the following criteria. A smaller ΔEab value indicates a higher heat resistance.

-Criteria-
A: ΔEab value <5
B: 5≦ΔEab value ≦10
C: 10≦ΔEab value

<Light Fastness>

The glass substrate to which the curable composition A-1 was applied was irradiated with a xenon lamp at 50,000 lux for 20 hours (equivalent to 1 million lux-h). Then, the ΔEab value of the color difference between before and after the light fastness test was measured. A smaller ΔEab value indicates a higher light fastness.
A: ΔEab value<3
B: 3≦ΔEab value≦10
C: 10<ΔEab value Examples 3 to 16

Curable compositions were each produced in the same manner as in Example 2, except that Exemplary Compound I-1 used in Example 2 was replaced by an equimolar amount of the compound shown in Table 2 (Exemplary Compound of the azo compound of the present invention). Each of the produced curable compositions was applied to the glass substrate having an undercoat layer to obtain a color filter. The obtained curable compositions and color filters were evaluated in the same manner as in Example 2. The results are shown in Table 2.

Examples 17 to 39

Curable compositions were each produced in the same manner as in Example 2, except that Exemplary Compound I-1 used in Example 2 was replaced by the compound shown in Table 2 (Exemplary Compound of the azo compound of the present invention) whose mole number is twice the mole number of Exemplary Compound I-1 used in Example 2. Each of the produced curable compositions was applied to the glass substrate having an undercoat layer to obtain a color filter. The obtained curable compositions and color filters were evaluated in the same manner as in Example 2. The results are shown in Table 2.

Comparative Examples 1 to 4

Curable compositions were each produced in the same manner as in Example 2, except that Exemplary Compound I-1 used in Example 2 was replaced by the compound shown in Table 2 (dye) whose mole number is twice the mole number of Exemplary Compound I-1 used in Example 3. Each of the produced curable compositions was applied to the glass substrate having an undercoat layer to obtain a color filter. The obtained curable compositions and color filters were evaluated in the same manner as in Example 2. The results are shown in Table 2.

TABLE 2

| | Compound No. | Storage stability | Heat resistance | Light fastness | Remarks |
|---|---|---|---|---|---|
| Ex. 2 | I-1 | A | A | B | Invention |
| Ex. 3 | I-2 | A | A | A | Invention |
| Ex. 4 | I-3 | A | A | A | Invention |
| Ex. 5 | I-4 | A | A | A | Invention |
| Ex. 6 | I-5 | A | A | A | Invention |

TABLE 2-continued

| | Compound No. | Storage stability | Heat resistance | Light fastness | Remarks |
|---|---|---|---|---|---|
| Ex. 7 | I-6 | A | A | A | Invention |
| Ex. 8 | I-7 | A | A | A | Invention |
| Ex. 9 | I-8 | A | A | A | Invention |
| Ex. 10 | I-15 | A | A | A | Invention |
| Ex. 11 | IIa-1 | A | B | A | Invention |
| Ex. 12 | IIa-2 | A | A | A | Invention |
| Ex. 13 | IIa-5 | A | A | A | Invention |
| Ex. 14 | IIa-6 | A | A | A | Invention |
| Ex. 15 | IIa-9 | A | A | A | Invention |
| Ex. 16 | IIb-1 | B | A | A | Invention |
| Ex. 17 | IIIa-1 | A | A | B | Invention |
| Ex. 18 | IIIa-2 | A | A | A | Invention |
| Ex. 19 | IIIa-3 | A | A | A | Invention |
| Ex. 20 | IIIa-7 | A | A | A | Invention |
| Ex. 21 | IIIa-8 | A | A | A | Invention |
| Ex. 22 | IIIa-17 | A | A | A | Invention |
| Ex. 23 | IIIb-1 | A | B | B | Invention |
| Ex. 24 | IIIb-2 | A | A | A | Invention |
| Ex. 25 | IIIb-3 | A | A | A | Invention |
| Ex. 26 | IIIb-4 | A | A | A | Invention |
| Ex. 27 | IIIb-5 | A | A | A | Invention |
| Ex. 28 | IIIb-8 | A | A | A | Invention |
| Ex. 29 | IIIb-9 | A | A | A | Invention |
| Ex. 30 | IIIb-10 | A | A | A | Invention |
| Ex. 31 | IIIb-11 | A | A | A | Invention |
| Ex. 32 | IIIb-12 | A | A | A | Invention |
| Ex. 33 | IIIb-13 | A | A | A | Invention |
| Ex. 34 | IIIb-14 | A | A | B | Invention |
| Ex. 35 | IIIb-15 | A | A | B | Invention |
| Ex. 36 | IIIb-18 | A | A | B | Invention |
| Ex. 37 | IIIb-22 | A | A | A | Invention |
| Ex. 38 | IIIb-23 | A | B | B | Invention |
| Ex. 39 | IV-28 | A | A | B | Invention |
| Comp. Ex. 1 | C.I. Solvent yellow 162 | C | C | C | Comp. Ex. |
| Comp. Ex. 2 | C.I. Solvent yellow 82 | C | C | C | Comp. Ex. |
| Comp. Ex. 3 | Comparative dye Y-1 | A | A | A | Comp. Ex. |
| Comp. Ex. 4 | Comparative dye Y-2 | A | A | A | Comp. Ex. |

Comparative dye Y-1
Dye described in JP-A No. 2007-41076

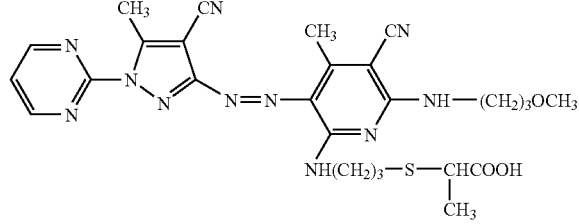

Comparative dye Y-2
Dye described in JP-A No. 2007-41050

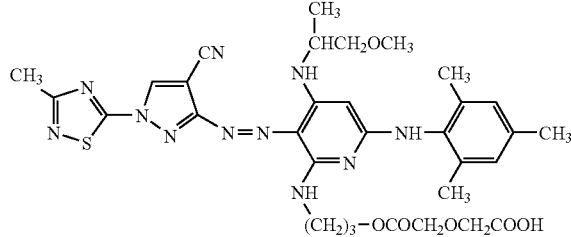

Example 40

-Exposure-development (Image Formation Step)-
The color filter produced in Example 3 (the glass substrate on which the resist coating film was formed) was processed as follows. The coating film was irradiated with light having a wavelength of 365 nm through a mask having a line width of 20 μm at an exposure of 500 mJ/cm² by using an exposure apparatus. After the exposure, development was performed under the conditions of a temperature of 25° C. and a period of 60 seconds using a developer (tradename: CD-2000, manufactured by FUJIFILM Electronics Materials Co., Ltd.). Thereafter, the resultant was rinsed with running water for 20 seconds, spray-dried, so that a color pattern was formed on the glass substrate.

-Evaluation-
(Pattern Forming Property)

The color remaining ratio of the exposed portion was measured with a chromoscope (tradename: MCPD-1000, manufactured by Otsuka Electronics Co., Ltd.). The color remaining ratio used herein refers to a ratio of change in the absorbance of the exposed portion (color pattern) between before and after the development.

-Criteria-
A: 95% <color remaining ratio
B: 90% ≦color remaining ratio ≦95%
C: color remaining ratio <90%

Examples 41 to 55

A color pattern was formed on the glass substrate and the color remaining ratio of the exposed portion was measured in the same manner as in Example 40, except that the color filters produced in Examples 6, 8, 9, 12, 14, 18, 20, 27, 28, 29, 30, 33, 34, 35, and 36 were respectively used in place of the color filter produced in Example 3.

Comparative Examples 5 to 8

A color pattern was formed on the glass substrate and the color remaining ratio of the exposed portion was measured in the same manner as in Example 40, except that the color filters produced in Comparative Examples 1 to 4 were respectively used in place of the color filter produced in Example 3.

In each of Examples 40 to 55 of the present invention, the color remaining ratio of the pattern portion after development was 98% or more. In contrast, in Comparative Examples 5 to 8, the color remaining ratio after development was 90% or lower.

The above results clarify that the curable composition containing the azo compound of the present invention is excellent in storage stability and that the color filter produced using the curable composition is excellent in heat resistance and light fastness and shows less change in the concentration of the color pattern portion when the concentrations before and after the development are compared.

Examples 56 to 71

1) Production of a Silicon Wafer Substrate Having an Undercoat Layer

A 6-inch silicon wafer was heated in an oven at 200° C. for 30 minutes. Subsequently, the resist solution used for the undercoat layer of the glass substrate in Example 2 above was applied to the silicon wafer such that the dry film thickness would be 1 μm. Then, the coating film was dried by heating in a 220° C. oven for 1 hour to form an undercoat layer, whereby a silicon wafer substrate having an undercoat layer was obtained.

-Formation of a Color Filter-

To the undercoat layer of the silicon wafer substrate having the undercoat layer obtained in 1) above, the curable composition used in each of Examples 3, 6, 8, 9, 12, 14, 18, 20, 27, 28, 29, 30, 33, 34, 35, and 36 was applied such that the dry film thickness of the coating film would be 0.6 μm, thereby forming a coating film of the curable composition. Then, the coating film was heated (prebaked) on a 100° C. hot plate for 120 seconds. Subsequently, the coating film was irradiated with light having a wavelength of 365 nm through a mask having a 1.2 μm square island pattern using an i-ray stepper exposure device FPA-3000i5+ (manufactured by Canon) while changing the exposure amount by 100 mJ/cm² each time within the range of 100 to 2500 mJ/cm². Thereafter, the silicon wafer substrate on which the irradiated coating film was formed was placed on a horizontal rotation table of a spin shower developing machine (model DW-30; manufactured by Chemitronics Co., Ltd.). Then, paddle development was performed at 23° C. for 60 seconds using an aqueous 50% CD-2000 solution (manufactured by FUJIFILM Electronics Materials Co., Ltd.) to form a color pattern on the silicon wafer substrate.

The silicon wafer substrate on which the color pattern was formed was fixed to the horizontal rotation table by a vacuum chuck method. Then, the silicon wafer substrate was rinsed by supplying a shower of pure water from a jet nozzle from above the rotation center while rotating the silicon wafer substrate at a number of rotations of 50 rpm with a rotating device. Thereafter, spray-drying was conducted to produce a color filter.

The yellow color pattern images thus formed (Examples 60 and 61) or red color pattern images (Examples 56 to 59 and Examples 62 to 71) each had an excellent profile suitable for imaging devices wherein, in the profile, the pixels were square-shaped and had a rectangular cross-section.

Example 72

1) Preparation of a Curable Composition [Positive Type]

| | |
|---|---|
| Ethyl lactate (EL) | 30 parts |
| Resin P-1 | 3.0 parts |
| Naphthoquinonediazide compound N-1 | 1.8 parts |
| Cross linking agent: hexamethoxymethylolated melamine | 0.6 part |
| Photoacid generator: TAZ-107 (manufactured by Midori Kagaku Co., Ltd.) | 1.2 parts |
| Fluorochemical surfactant (F-475, manufactured by DIC Corporation) | 0.0005 part |
| Exemplary Compound IIIb-15 | 0.4 part |

The composition having the above-mentioned formulation was mixed and dissolved to obtain a curable composition [positive type].

The above-mentioned resin P-1 and naphthoquinonediazide compound (N-1) were synthesized as follows.

2) Synthesis of resin P-1

70.0 g of benzyl methacrylate, 13.0 g of methacrylic acid, 17.0 g of 2-hydroxyethyl methacrylate, and 600 g of 2-methoxypropanol were placed in a three necked flask, and a stirrer, reflux condenser tube, and thermometer were attached. Then, a catalytic amount of a polymerization initiator V-65 (manufactured by Wako Pure Chemical Ind. Ltd.) was added at 65° C. under a nitrogen stream. The mixture was stirred for 10 hours. The obtained resin solution was added dropwise, with vigorous stirring, to 20 L of ion exchange water, so as to obtain white powder. The white powder was vacuum-dried at 40° C. for 24 hours to obtain 145 g of resin P-1. The molecular weight was measured with GPC, which showed that the weight average molecular weight Mw was 28,000 and the number average molecular weight Mn was 11,000.

3) Synthesis of Naphthoquinonediazide Compound N-1

42.45 g of Trisp-PA(manufactured by Honshu Chemical Industry Co., Ltd.), 61.80 g of o-naphthoquinonediazide 5-sulfonyl chloride, and 300 ml of acetone were placed in a three necked flask, and 24.44 g of triethylamine was added dropwise at a room temperature over 1 hour. After the completion of dropwise addition, the mixture solution was further stirred for 2 hours. Then, the reaction solution was poured, with stirring, into a large amount of water. The precipitated naphthoquinonediazide sulfonate was collected by suction filtration, and vacuum-dried at 40° C. for 24 hours to obtain a naphthoquinonediazide compound N-1.

4) Application, Exposure, and Development (Image Formation Step) of Curable Composition Similarly to Example 40, the curable composition prepared as described above was applied to a glass substrate having an undercoat layer, prebaked, irradiated, developed, rinsed, and then dried to obtain an image pattern. Thereafter, the pattern image was heated at 180° C. (postbaked) for 5 minutes to obtain a color filter. The cross section of the formed red pattern image showed an excellent rectangular profile.

The storage stability of the curable composition [positive type] using the azo compound of the present invention and the heat resistance and light fastness of the color filter were evaluated in the same manner as in Example 40, which showed that the storage stability was excellent and the heat resistance and light fastness were satisfactory.

All publications, patent applications, and technical standards mentioned in this specification are herein incorporated by reference to the same extent as if each individual publication, patent application, or technical standard was specifically and individually indicated to be incorporated by reference.

What is claimed is:

1. An azo compound represented by the following Formula (I), Formula (II), or Formula (III):

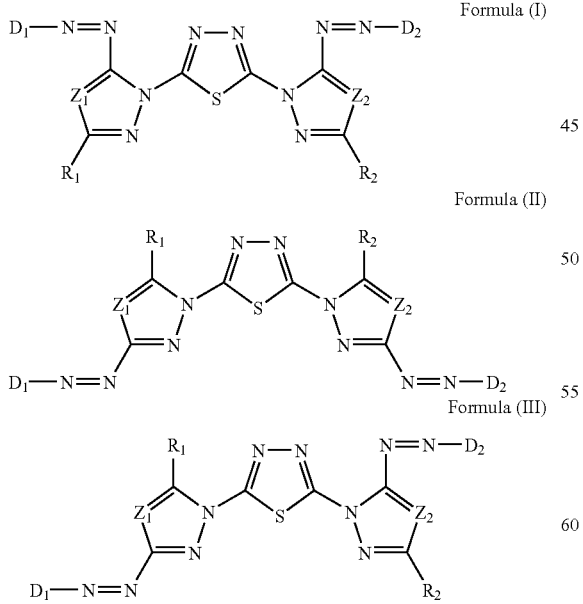

wherein, in Formulas (I) to (III), $R_1$ and $R_2$ each independently represent a hydrogen atom or a substituent; $D_1$ and $D_2$ each independently represent a coupler residue; $Z_1$ and $Z_2$ each independently represent $-C(R_3)=$ or $-N=$; and $R_3$ represents a hydrogen atom or a substituent.

2. The azo compound according to claim 1, wherein, in Formulas (I) to (III), $D_1$ and $D_2$ each independently represent a coupler residue represented by any one of the following Formulae (d-1) to (d-8):

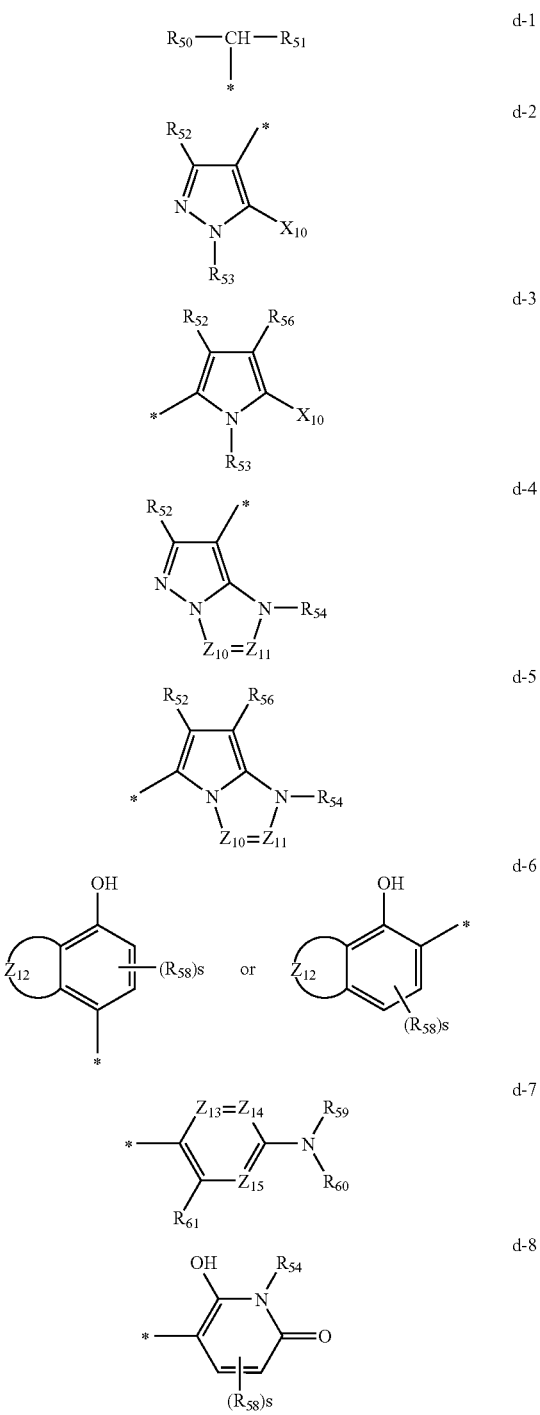

wherein, in Formulae (d-1) to (d-8), $R_{50}$ and $R_{51}$ each independently represent an aryl group, a heterocyclic group, an acyl group, a cyano group, an alkoxycarbonyl group, an aryloxycarbonyl group, a carbamoyl group, an alkylsulfonyl group, or an arylsulfonyl group; $R_{52}$ represents a hydrogen atom or a substituent; $R_{53}$ represents a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $X_{10}$ represents —OH or —N($R_{54}$)($R_{55}$); $R_{54}$ and $R_{55}$ each independently represent a hydrogen atom, an alkyl group, an alkenyl group, an aryl group, a heterocyclic group, an acyl group, an alkoxycarbonyl group, an aryloxycarbonyl group, an alkylsulfonyl group, or an arylsulfonyl; $R_{56}$ represents a hydrogen atom or a substituent; $Z_{10}$ and $Z_{11}$ each independently represent =C($R_{57}$)— or =N—; $R_{57}$ represents a hydrogen atom or a substituent; $R_{58}$ represents a substituent; s represents an integer of 0, 1, or 2; $Z_{12}$ represents an atomic group that is required to form a 5- or 6-membered ring condensed with the adjacent benzene ring and that is formed by atoms selected from carbon atoms, nitrogen atoms, oxygen atoms, and sulfur atoms; $R_{59}$ and $R_{60}$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $R_{61}$ represents a hydrogen atom or a substituent; $Z_{13}$, $Z_{14}$, and $Z_{15}$ each independently represent =C($R_{62}$)— or =N—; $R_{62}$ represents a hydrogen atom or a substituent; and * represents a position of connection to an azo group.

3. The azo compound according to claim 1, wherein $D_1$ and $D_2$ in Formulas (I) to (III) each independently represent a coupler residue represented by the following Formula (A):

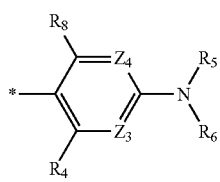

Formula (A)

wherein, in Formula (A), $R_4$ and $R_8$ each independently represent a hydrogen atom or a substituent; $R_5$ and $R_6$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; $Z_3$ and $Z_4$ each independently represent —C($R_7$)= or —N=; $R_7$ represents a hydrogen atom or a substituent; and * represents a position of connection to an azo group.

4. A curable composition comprising at least one azo compound according to claim 1.

5. The curable composition according to claim 4, wherein the maximum absorption wavelength of the azo compound within a visible wavelength region is from 500 nm to 600 nm.

6. The curable composition according to claim 4, wherein the maximum absorption wavelength of the azo compound within a visible wavelength region is from 400 nm to 500 nm.

7. The curable composition according to claim 4, wherein the maximum absorption wavelength of the azo compound within a visible wavelength region is from 500 nm to 600 nm and a second absorption wavelength within the visible wavelength region is from 400 nm to 500 nm.

8. The curable composition according to claim 4, further comprising a polymerizable monomer and a radiation-sensitive compound.

9. The curable composition according to claim 4, further comprising a binder.

10. The curable composition according to claim 4, further comprising an additional colorant having a maximum absorption wavelength of from 400 nm to 600 nm.

11. A color filter prepared by using the curable composition according to claim 4.

12. A method of producing a color filter comprising:
applying the curable composition according to claim 4 to a support to form a curable composition layer; and
exposing the formed curable composition layer to light through a mask and developing the exposed layer to form a pattern.

* * * * *